United States Patent
Fransson et al.

(12)

(10) Patent No.: US 6,172,533 B1
(45) Date of Patent: Jan. 9, 2001

(54) PHASE AND FREQUENCY DETECTOR WITH HIGH RESOLUTION

(75) Inventors: Clarence Jörn Niklas Fransson, Älvsjö; Mats Wilhelmsson, Hägersten, both of (SE)

(73) Assignee: Telefonaktiebolaget LM Ericsson, Stockholm (SE)

( * ) Notice: Under 35 U.S.C. 154(b), the term of this patent shall be extended for 0 days.

(21) Appl. No.: 09/133,151

(22) Filed: Aug. 12, 1998

Related U.S. Application Data

(63) Continuation of application No. PCT/SE97/00215, filed on Feb. 12, 1997.

(30) Foreign Application Priority Data

Feb. 14, 1996 (SE) .................................................... 9600540

(51) Int. Cl.[7] ................................................ H03K 19/195
(52) U.S. Cl. ...................................... 327/7; 327/12; 327/3
(58) Field of Search ................................ 327/2, 3, 7, 12, 327/23, 28, 361

(56) References Cited

U.S. PATENT DOCUMENTS

| | | |
|---|---|---|
| 4,310,795 | 1/1982 | Fremerey . |
| 4,634,967 | 1/1987 | Vireux et al. . |
| 4,912,734 | 3/1990 | Frauenglass . |
| 4,979,177 | 12/1990 | Jackson . |
| 5,097,490 | 3/1992 | Hulsing, II et al. .................... 377/28 |
| 5,128,624 | * 7/1992 | Hoshino et al. ......................... 327/3 |
| 5,128,909 | 7/1992 | Stein . |
| 5,557,335 | * 9/1996 | Oh ....................................... 348/512 |
| 5,578,947 | * 11/1996 | Kojima .................................... 327/7 |

* cited by examiner

Primary Examiner—Terry D. Cunningham
(74) Attorney, Agent, or Firm—Burns, Doane, Swecker & Mathis, L.L.P.

(57) ABSTRACT

A phase detector for measuring phase differences between K input signals is provided. The phase detector includes a counter, K first registers and a first subtractor. Each first register receives the counter signal of the counter and a respective input signal for updating a counter value in response to timing information on the input signal. The first subtractor receives the counter values to generate phase difference representing values. A frequency detector is also provided. The first subtractor is substituted by a second subtractor and K second registers are included. Each second register is connected to a respective first register. Each second register receives the counter value of its first register and the same input signal as that of its first register for backing-up the counter value as a back-up counter value in response to the timing information on the input signal. The second subtractor subtracts, for each second register and its first register, the counter values thereof to generate a frequency representing value.

23 Claims, 31 Drawing Sheets

Fig.25
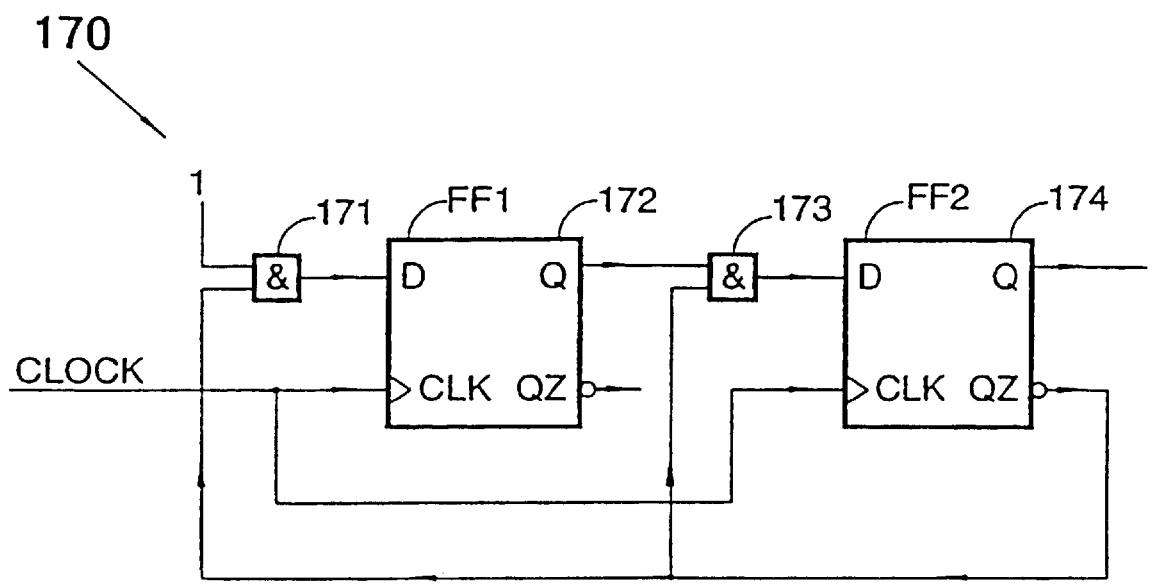
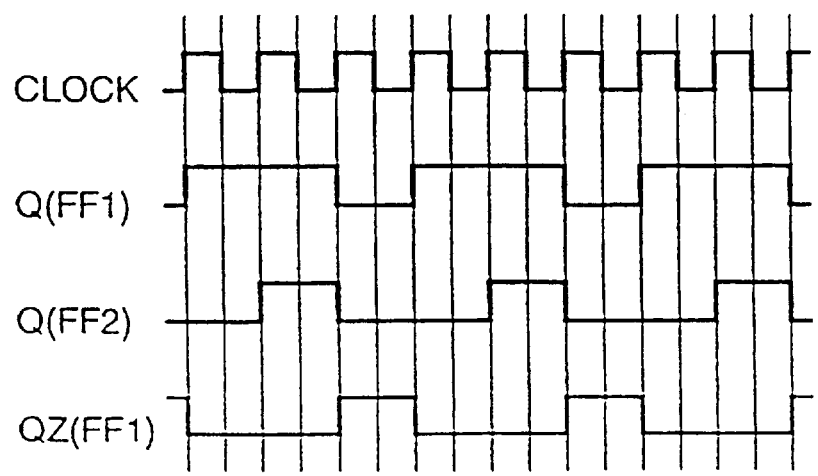

Fig.30

| Fig. 23 | Fig. 28 | Fig. 31 |

PHASE AND FREQUENCY DETECTOR WITH HIGH RESOLUTION

This application is a continuation of International Application No. PCT/SE97/00215 filed on Feb. 12, 1997, which designates the United States, and which is expressly incorporated here by reference.

TECHNICAL FIELD OF THE INVENTION

The present invention generally relates to a phase detector, a method for measuring phase difference, a frequency detector and a method for measuring frequency.

BACKGROUND OF THE INVENTION

Phase detectors and frequency detectors are found in numerous applications of all modern technologies. They are widely used in areas of electronics and in different fields of communication, in particular the field of telecommunication.

Basically, a phase detector is an arrangement for measuring a phase difference between two input signals. It is well known in the art to use a start and stop counter which receives two input signals. One input signal starts the counter and the other input signal stops the counter, the counter value being representative of the phase difference between the two input signals.

In many applications there is a general need for measuring phase differences between several input signals. Should a phase detector having only two inputs be used for this purpose, it has to be duplicated several times in order to simultaneously handle a plurality of input signals.

Existing alternative techniques to measure phase differences between several input signals usually involves complicated and extensive circuitry.

In earlier phase detector arrangements supervision and maintenance are provided as additional overlay functions. The supervision is implemented as specially designed functions in separate units. This conventional solution requires a significant amount of additional circuitry.

RELATED TECHNIQUE

In U.S. Pat. No. 4,634,967 there is described a phase comparator for measuring the phase displacement between several very high stability oscillators. The phase comparator includes pairs of measuring cascades, each pair being connected to an oscillator and providing a first and second signal. Each pair has a first cascade that comprises an A/D-converter followed by a digital divider, and a second cascade that comprises a frequency changer followed by an A/D-converter. It also comprises a multiplexer, a start and stop counter and a computer making it possible to perform the phase displacement measurements.

U.S. Pat. No. 5,128,909 relates to a phase difference measuring arrangement. Phase differences between a plurality of clocks are measured based on mixing of the output signal of each clock with the output signal of a common oscillator, division of the output signal from a first one of the clocks, and detection and counting of zero up-crossings.

In U.S. Pat. No. 4,912,734 there is disclosed a high resolution event occurrence time counter operating in two clock domains, the domain of clock signal A and the domain of clock signal B. The two clock signals are generated from a common clock signal. Clock signal A is provided to a free running counter, preferably including a Johnson counter and a binary counter. The count data of the free running counter is stored in a counter register in response to clock signal B, and is stored in a second register as second time of arrival data upon the generation of a second signal, B SYNC. B SYNC, when generated, will clear a first register. The data of the counter register is stored in the first register as first time of arrival data upon the generation of a first signal, A SYNC. A SYNC, when generated, will clear the second register. The event occurrence time counter also includes a clock edge encoder which is responsive to an input signal and the clock signals A and B for generating the A SYNC and B SYNC signals. If the input signal arrives during the first half cycle of the common clock signal, then A SYNC is generated. If the input signal arrives during the second half cycle of the common clock signal, then B SYNC is generated. In this way the clock edge encoder controls which of first and second time of arrival data is to be provided as the output data of the circuit.

SUMMARY OF THE INVENTION

The present invention overcomes these and other drawbacks of the conventional arrangements.

In many applications there is a general need for measuring phase differences between several input signals.

Furthermore, there is a need for maintenance and supervision of both the phase detector and its input signals. For instance, by supervising the frequency of the input signals a malfunctioning phase detector or an erroneous input signal may be detected- In addition, it is also desirable to detect the presence of signals at the phase detector inputs.

There is a general need for a frequency detector, and, in particular, a frequency detector which uses simple circuitry and which can handle input signals of different frequencies.

In addition, regarding both phase difference measurements and frequency measurements, high resolution accuracy is desirable.

It is a first object of the present invention to provide a phase detector which is able to measure phase differences between two or more input signals by using a minimum of circuitry.

It is another object of the invention to provide a phase detector in which supervision functions are integrated in a simple manner.

Yet another object of the invention is to provide a high resolution phase detector, the resolution of which is equal to the cycle time of the clock signal that is applied to the phase detector, and preferably half the cycle time of the clock signal.

It is also an object of the invention to provide a frequency detector.

Still another object of the invention is to provide a high resolution frequency detector.

Another object of the invention is to provide means for handling measurement effecting wrap situations.

In accordance with a general inventive concept, there is provided a device responsive to a predetermined number of input signals for extracting information from the input signals.

In accordance with a first aspect of the present invention there is provided a phase detector. The phase detector is responsive to a predetermined number, K, of input signals, between which it is desired to measure phase differences.

In accordance with a first embodiment of the invention the phase detector comprises a counter, a predetermined number, K, of first registers and first subtractor means. The counter is responsive to a first clock signal for generating a counter signal. Each one of the K first registers is responsive to the counter signal and a respective one of the K input signals for updating an individual first counter value by storing the current counter value of the counter signal in response to timing information carried by the respective input signal. The first subtractor means is responsive to the first counter values for generating first difference values representing phase differences between respective pairs of the K input signals.

In general, the counter counts over more than one counter sequence, the transition between counter sequences being referred to as a wrap. In some applications of the phase detector according to the present invention, wrap situations that will effect the phase difference measurements may occur. These wrap situations are effectively handled according to a second embodiment of the invention by incorporating a correction means into the inventive phase detector. The correction means corrects for a phase difference value effecting wrap by adding a correction value to the phase difference value so as to generate a corrected phase difference value. In this way, no initialization or reset of the counter is required. The correction value may be positive as well as negative.

In accordance with a third embodiment of the present invention, the phase detector is provided with a second detection means for supervising the presence of input signals at the phase detector inputs. The second detection means detects, for each one of a set of first registers, whether the first counter value currently stored in the first register is equal to a comparison value representative of the preceding first counter value of the first register, which has been previously stored in the second detection means. If an equal to condition is detected, then a no signal indication is generated. A no signal indication generally means that there is no input signal present at the phase detector input that is associated with the particular first register. The comparison value is updated, after the detection, by storing the first counter value of the first register in the second detection means in response to a recurrent load signal.

In accordance with a fourth embodiment of the present invention the phase detector is provided with K second registers. Each one of the K second registers is connected to a respective one, referred to as its associated first register, of the K first registers. Each second register is responsive to the first counter value of its associated first register and to the same input signal as that of its associated first register for backing-up, prior to the updating, the first counter value as a back-up counter value, in response to the timing information carried by the input signal. The first counter values and the back-up counter values are used for providing useful information about the phase detector and its input signals:

an alternative way of handling measurement effecting wrap situations is provided by comparing first counter values with back-up counter values, and, depending on the result of the comparison, possibly executing an addition/subtraction operation; and the frequency of at least one of the input signals is determined, and used for supervising the phase detector itself For the determination of the frequency of at least one of the input signals, the phase detector is provided with second subtractor means. Preferably, the first and second subtractor means are integrated into a main subtractor unit.

The resolution of a phase detector is generally determined by the counter and the frequency of the clock signal applied to the counter. When the unit, referred to as the counter core, in a counting circuit that actually registers the incoming pulses of a clock signal is subjected to certain predetermined quality requirements, and is implemented in a given technology, the frequency of the clock signal, referred to as the first clock signal, that is applied to the counter core may be too high for reliable and optimal operation of the counter core. The problem of utilizing the full frequency potential of a given technology at the same time as complying with certain frequency limiting requirements on the counter core is solved according to yet another embodiment of the invention. The counter or counting circuit of the phase detector includes a generator for generating, in response to the first clock signal of a first frequency, a predetermined number, M, of second clock signals phase shifted with respect to each other and of a second frequency lower than the first frequency. Furthermore, the counter comprises:

M secondary counters, each one responsive to a respective one of the M second clock signals for generating an individual secondary counter signal; and a summing circuit responsive to the secondary counter signals for generating the counter signal of the counter by adding the secondary counter signals such that the counter value of the counter signal has the same number of bits and the same significance as the counter value of the secondary counter signals. The second frequency is adapted to work well in the secondary counters, i.e. the counter core.

The second clock signals are phase shifted with respect to each other such that the resulting counter value is updated with a frequency equal to M multiplied with the second frequency.

Besides, the summing circuit is designed such that no initialization of the secondary counters and the generator of second clock signals is required.

The phase detector according to the invention affords the following advantages:

There is no restriction of the number of input signals that can be connected to the phase detector;

Different groups of input signals can be connected to the same phase detector;

In a preferred embodiment of the invention, no initialization of the hardware is required;

Supervision and maintenance functions are integrated in an elegant and simple manner;

A resolution of the phase detector that is equal to twice the input clock frequency is obtained.

In accordance with a second aspect of the invention, the frequency supervising properties of the inventive phase detector are utilized separately to provide a frequency detector. A frequency detector which measures the frequency of each of a predetermined number of input signals is provided. In this second aspect of the invention, the first subtractor means is omitted and substituted by the second subtractor means such that the inventive frequency detector comprises the counter, the K first registers, the K second registers and the second subtractor means.

In the frequency detector according to the second aspect of the invention, wrap handling and supervision of the presence of input signals are provided. Besides, high resolution measurements are assured.

Furthermore, in accordance with the first aspect of the invention, there is also provided a method for measuring phase differences between two or more input signals.

The method according to the first aspect of the invention further comprises wrap handling, supervision of the input signals, and an elegant way of providing high resolution measurements of the phase differences.

In accordance with the second aspect of the invention, there is provided a method for measuring the frequency of each of a number of input signals.

Furthermore, an alternative approach for realizing a high resolution phase detector and frequency detector is provided.

BRIEF DESCRIPTION OF THE DRAWINGS

The novel features believed characteristic of the invention are set forth in the appended claims. The invention itself, however, as well as other features and advantages thereof will be best understood by reference to the detailed description of the specific embodiments which follows, when read in conjunction with the accompanying drawings, wherein:

FIG. 25 is a schematic block diagram of a generator of second clock signals according to another embodiment of the invention;

FIG. 30 is a schematic diagram illustrating how to arrange FIG. 23, FIG. 28 and FIG. 31, which all together form a schematic block diagram of a high resolution frequency detector according to the invention.

DETAILED DESCRIPTION OF THE INVENTION

Examples of a Phase Detector

Figure 1:
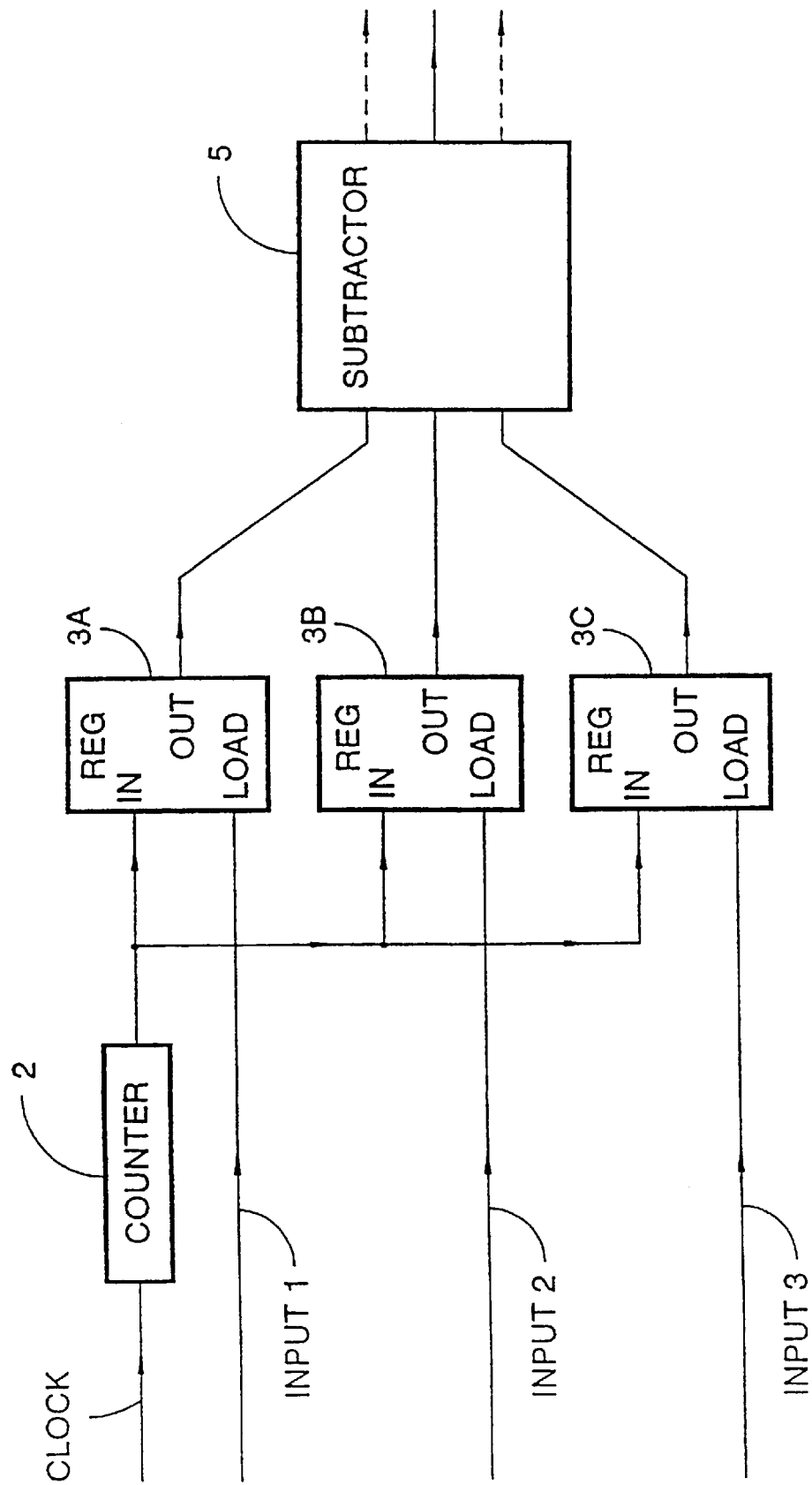
FIG. 1 is a schematic block diagram of a phase detector according to a first embodiment of the invention.

FIG. 1 is a schematic block diagram of a phase detector according to a first embodiment of the present invention. It comprises a counter 2, first registers 3A, 3B, 3C and a first subtractor 5. The phase detector receives three input signals INPUT 1, INPUT 2 and INPUT 3 and a clock signal, referred to as a first clock signal, CLOCK. The counter 2 is responsive to the first clock signal which has a first frequency, for generating a counter signal. The first clock signal is preferably generated by a conventional clock generator. Each one of the first registers 3A, 3B, 3C is responsive to the counter signal from the counter 2 and a respective one of the three input signals for storing a count or count value, hereinafter referred to as a counter value, of the counter signal as an individual first counter value generally in response to timing information carried by the respective input signal. The first subtractor 5 makes readouts from the first registers 3A, 3B, 3C to get the first counter values. If it, by way of example, is desired to measure the phase difference between the input signals INPUT 1 and INPUT 3, then the first counter values associated with these input signals are subtracted from each other. The result of this subtraction, a first difference value, is representative of the phase difference between the input signals. Since there are three input signals in this particular example, it is possible to measure phase differences between INPUT 1 and INPUT 2, between INPUT 1 and INPUT 3, and between INPUT 2 and INPUT 3. In FIG. 1 the first subtractor 5 has three output signals. The output signal marked with a solid line represents a currently calculated phase difference representing value, and the other two output signals with broken lines indicate that it is possible to obtain two more individual phase difference representing values. In a preferred embodiment of the invention, the first subtractor 5 is capable of handling three phase difference representing values virtually at the same time.

Preferably, the counter 2 is a binary counter modulo-$2^n$, which counts from zero to $2^n-1$. In other words, it is a counter of n bits. A counter signal is generally defined as the output data of a counter. The counter 2 is preferably implemented in an ASIC by flip-flops. When the counter 2 has reached its maximum counter value, $2^n-1$, it starts over again from zero.

The first registers 3A, 3B, 3C can store at least n bits each. Preferably, the first registers are realized by edge triggered D-flip-flops. There is one D-flip-flop for each bit. In a preferred embodiment of the invention, the first registers have a load-input.

Of course, any conventional counter that produces a counter sequence, and any conventional n-bits register can be utilized.

Examples of timing information is a synchronization pattern, or simply the positive or negative edge of a square wave signal. The timing information is normally recurrent.

The following example is given:

The counter 2 counts the clock pulses of the first clock signal. The counter 2 increments its counter value every time the first clock signal, CLOCK, goes high. The first registers comprises positive edge triggered D-flip-flops. Consider the first register 3A and the input signal INPUT 1 which is connected thereto. Every time the timing information, the positive edge in this example, carried by INPUT 1 appears at the load-input of the first register 3A, the counter value of the counter 2 will be transferred into the first register 3A.

In general, the first counter values hold by the first registers are continuously updated in response to the recurrent positive edge of the input signals. In this way, the phase difference representing values will also be updated.

Figure 2:
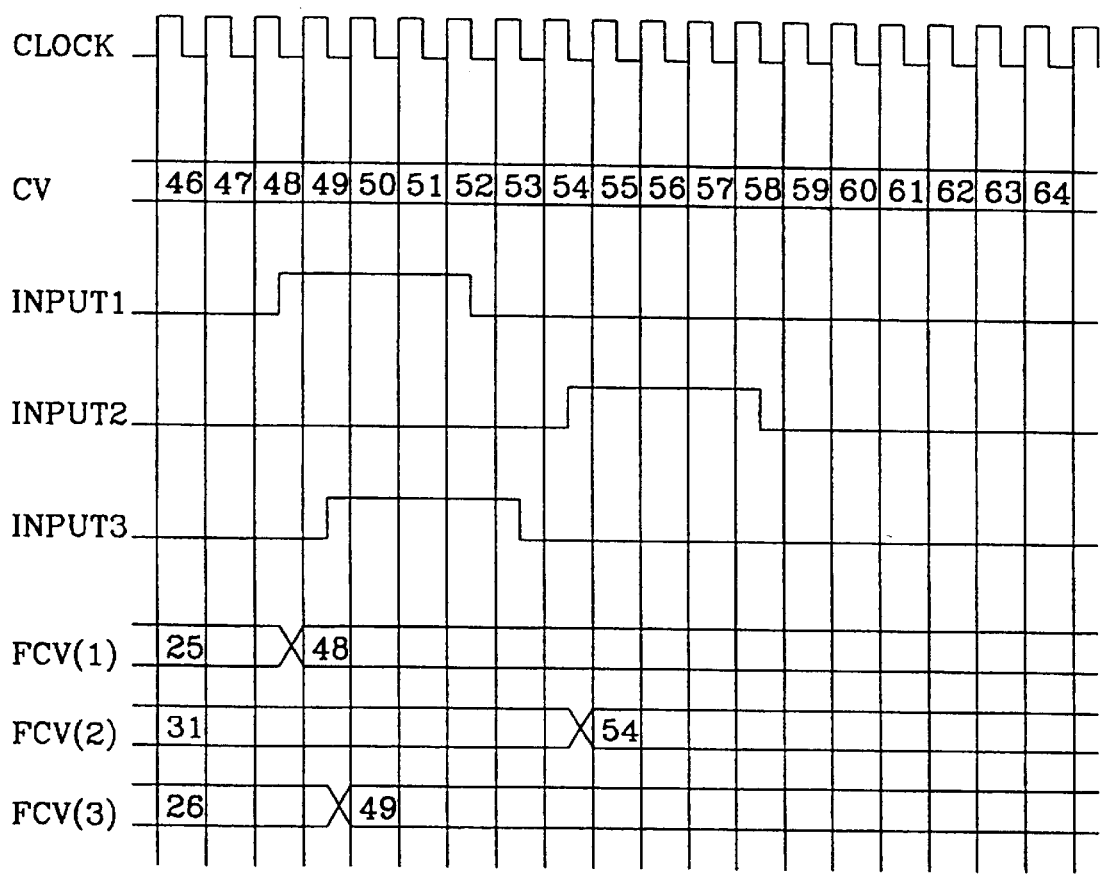
FIG. 2 is a timing diagram illustrating an example of the signals and counter values appearing in the phase detector shown in FIG. 1.

Now with reference to FIG. 2, there is a timing diagram illustrating an example of the signals and counter values appearing in the phase detector shown in FIG. 1. There is a square wave CLOCK signal, referred to as the first clock signal, which is sent into the counter 2. The counter 2 generates a counter signal which has a running counter value, CV, that is stepped up by each cycle of the clock signal. Furthermore, there is shown three input signals INPUT 1, INPUT 2 and INPUT 3, and their corresponding first counter values FCV(1), FCV(2) and FCV(3), respectively The first counter values FCV(1), FCV(2), FCV(3) are stored in the first registers 3A, 3B and 3C, respectively. In operation, when the timing information, in this case the positive edge, on INPUT 1 appears on the load-input of the first register 3A, the first counter value, equal to 25, previously stored in the first register 3A is updated such that the current counter value 48 of the counter signal is stored in the first register 3A. Correspondingly, the first counter values FCV(2) and FCV(3) are also updated in response to the positive edge of INPUT 2 and INPUT 3, respectively.

Phase differences between input signals are obtained by subtracting the corresponding first counter values with each other. For instance, the phase difference between INPUT 1 and INPUT 3, taking the most recently updated first counter values into account, is equal to FCV(3)−FCV(1)=49−48=1 cycle of the first clock signal. It is important to note, that the phase of input signal INPUT 3 lags with respect to INPUT 1, but the counter value associated with INPUT 3 is higher than the counter value associated with INPUT 1. In general, the phase difference representing values are outputted as phase difference representing signals.

Preferably, the subtraction is realized in software executing in a microprocessor or a signal processor.

It is however also possible to implement the subtraction in hardware. By way of example, conventional building blocks such as 74-LS-181, 74-HC-181, or 74-LS-83, 74-HC-83 can be used for realizing a hardware implementation of a subtractor. The building block 74-XX-181, where XX represents, for instance, HC or LS, is an Arithmetic Logic Unit (ALU) which includes a 4-bits subtractor. The building block 74-XX-83, which is a 4-bits adder, can be used for executing additions like A+(−B), which in fact is a subtraction, A−B. In both the case of 74-XX-181 and 74-XX-83, several 4-bits units are connected to each other in a known manner to realize a n-bits subtractor. The above conventional units, 74-XX-181 and 74-XX-83, can also be used for executing additions and subtractions in the different embodiments that follows.

When the timing information is a synchronization pattern, then a digital decoder decodes the synchronization pattern in a known manner, and the decoded signals are sent to the first registers. Consideration must be taken to decoding delays such that the relative timing information between the input signals is maintained after the decoding.

The first counter values of the first registers 3A, 3B and 3C should originate from the same time instance. This can be solved by having a hold function in each one of the first registers. For instance, each first register has an enable pin which is connected to a microprocessor or other reading device. A hold signal is distributed to the first registers from the microprocessor, and the hold signal is released when all the first registers are read. The sample time has to be adjusted so that there is at least one period of the lowest frequency between release and activation of the hold signal. Another solution is to have "shadow" registers with a hold function so that the counter values can be frozen until all registers have been read. The shadow registers are connected to the first registers.

When the first subtractor 5 is realized by software in a microprocessor (not shown), then the read-out of the first counter values by the microprocessor is controllable by a software operator. Both the time intervals between the read-outs and which first registers to read can be controlled by the software. It is important to understand that the first subtractor 5 does not have to read the first counter values of the first registers at regular time intervals, although this is desirable.

When the reading of the first registers is asynchronous to the time instances when the first registers are updated, then it is not known which first register was the last to have its value updated before the reading. This means that the phase differences which result from the subtractions of the first subtractor 5 can lie in the interval $-2\pi$ to $2\pi$. One cycle of an input signal is equal to $2\pi$. Since the counter has $2^n$ different states, $2^n$ multiplied with the cycle time of the first clock signal must be greater than 2 times the cycle time of the input signals. The following example is given:

Input signals of 8 kHz and a clock signal of 368 MHz are considered. According to the above condition:

$$2^n \cdot (1/(368 \cdot 10^6)) > 2 \cdot (1/8000)$$
$$\Leftrightarrow$$
$$2^n > 92160$$
$$\Leftrightarrow$$
$$n > 16.5 \text{ (rounded)}.$$

Thus, the number of bits, n, of the counter 2 has to be greater than or equal to 17. The number of bits of each of the first registers 3A–C also has to be equal to or greater than 17, and therefore there will be at least 17 D-flip-flops in each register. Furthermore, the number of bits of a hardware implementation of the first subtractor 5 has to be equal to or greater than 17.

When the reading of the first registers is synchronous to the updating of the first registers, the phase difference will lie in an interval of length $2\pi$. Thus, the above condition will be altered accordingly.

In the following, it is assumed that the reading of the first registers is asynchronous to the updating of the first registers. This should not be interpreted as a limiting requirement, since it is equally possible to have synchronous reading.

Figure 3:
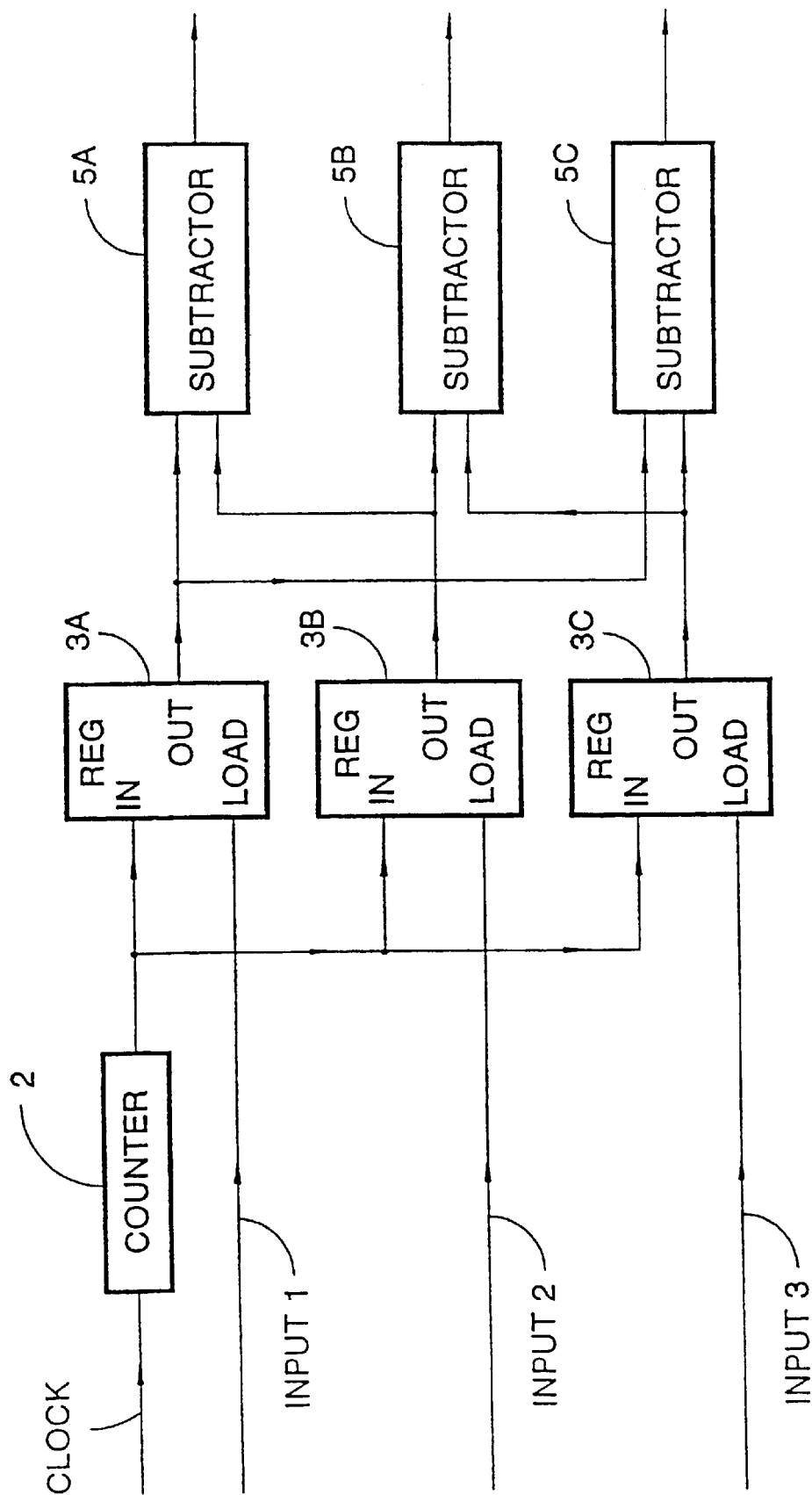
FIG. 3 is a schematic block diagram of a phase detector according to an alternative embodiment of the invention.

FIG. 3 is a schematic block diagram similar to that of FIG. 1, showing a phase detector according to an alternative embodiment of the invention. The block diagram of FIG. 3 is identical to that of FIG. 1 except for the subtractor arrangement. In FIG. 3, the phase detector has three subtractors 5A, 5B, 5C. Each one of the subtractors is responsive to the first counter values of a respective pair of first registers. Subtractors 5A, 5B, 5C are responsive to the first counter values of the first registers 3A and 3B, 3B and 3C, 3A and 3C, respectively. This solution is particularly suitable when the subtractor arrangement is realized in hardware.

In general, the present invention is applicable to a situation in which the inventive phase detector is responsive to a predetermined number, K, of input signals, where K is a positive integer greater than 1. Accordingly, the phase detector comprises K first registers, each one responsive to the counter signal from the counter 2 and a respective one of the K input signals.

Figure 4:
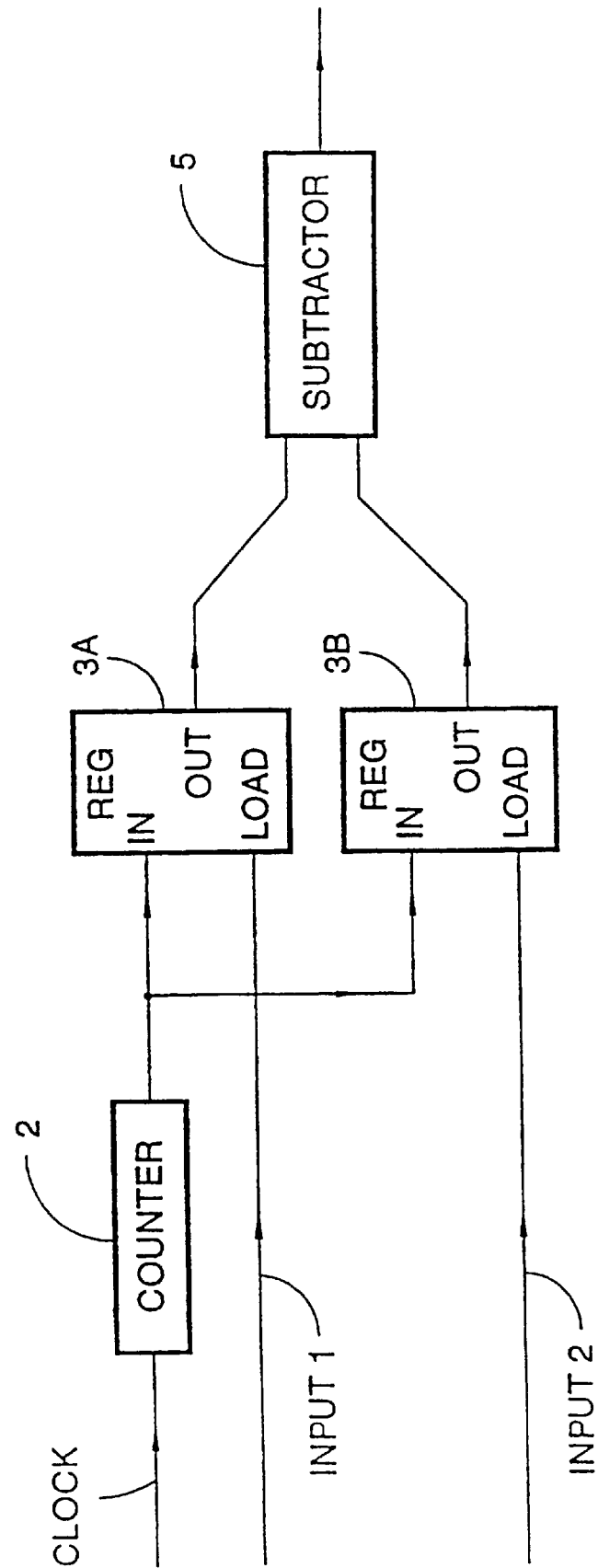
FIG. 4 is a schematic block diagram of a phase detector according to the invention, where K is equal to 2.

In FIG. 4 there is shown a schematic block diagram of a phase detector according to the invention, where K is equal to 2. The phase detector comprises a counter 2, two first registers 3A, 3B, and a first subtractor 5. Furthermore, there are two input signals INPUT 1 and INPUT 2 connected to the load-input of the first registers 3A and 3B, respectively. The first subtractor 5 subtracts the first counter values of the first registers 3A and 3B to generate a first difference value representative of the phase difference between INPUT 1 and INPUT 2.

Figure 5:
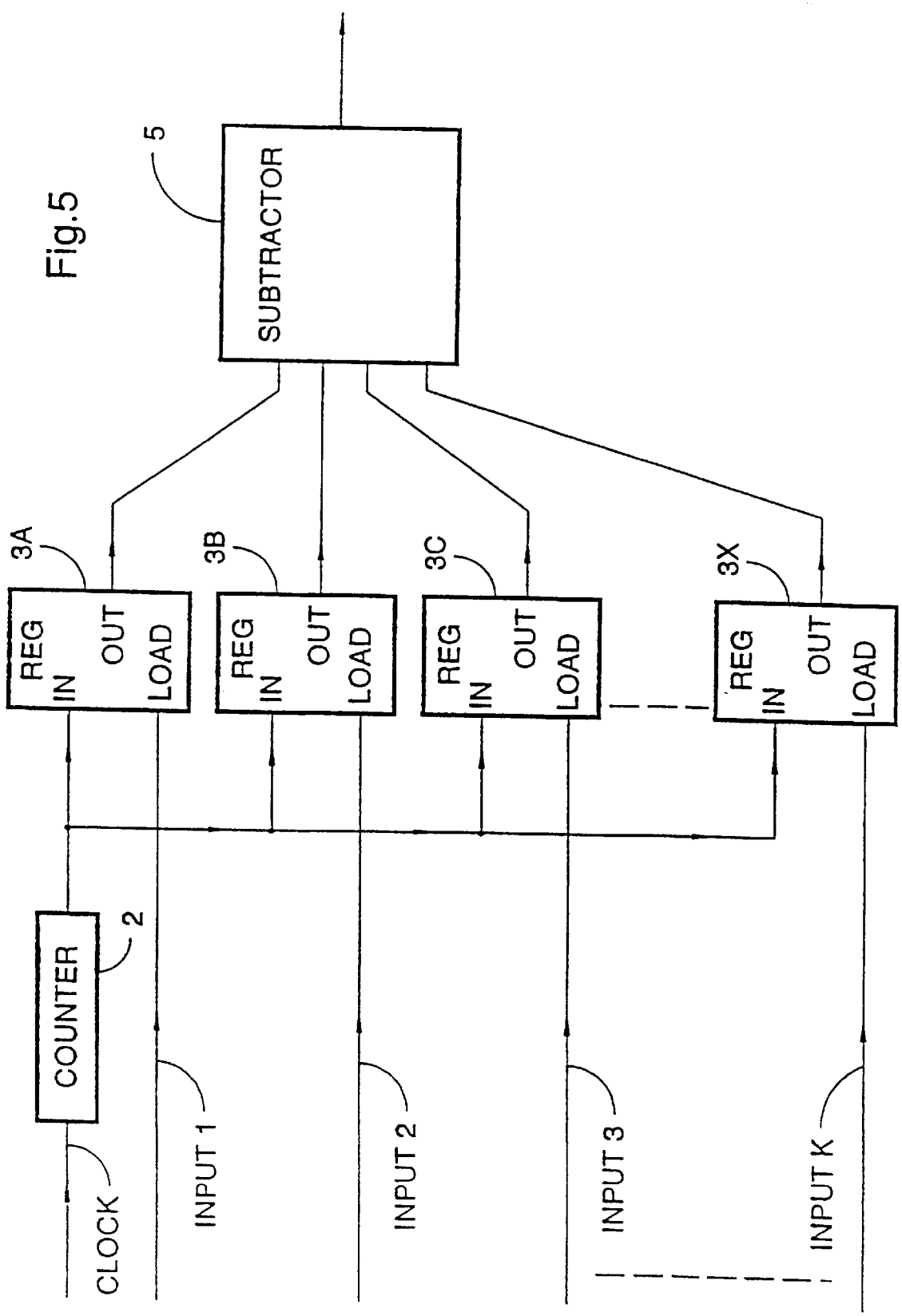
FIG. 5 is a schematic block diagram of the inventive phase detector, where K is greater than 3.

FIG. 5 is a schematic block diagram of the inventive phase detector, where K is greater than 3. The phase detector comprises a counter 2, a plurality of first registers 3A, 3B, 3C, . . . , 3X, and a first subtractor 5. The phase detector, and the first registers in particular, receives a plurality of input signals INPUT 1, INPUT 2, INPUT 3, . . . , INPUT K. The number of input signals is equal to the number of first registers. The phase detector according to this general form of the invention is capable of measuring a phase difference between any combination of two input signals, provided that the two input signals have generally the same frequency. Several phase difference measurements can be executed in parallel. There is no restriction to the number of input signals that can be connected to the phase detector. In addition, there is no requirement that all the input signals shall have the same frequency. Different groups of input signals can be connected to the inventive phase detector. By way of example, three input signals of a frequency equal to 8 kHz, and two input signals of another frequency equal to 64 kHz are connected to the phase detector. The three 8 khz input signals constitute a first group and the two 64 kHz input signals constitute a second group. It is, however, important to understand that the input signals between which it is desired to measure phase differences must have generally the same frequency. Naturally, the number of bits of the counter and the registers has to be adapted to the group of input signals that has the lowest frequency. The lowest frequency will give the highest value of the number of bits, n.

In the phase detector of FIG. 1 there is provided only one first subtractor 5 which is responsive to first counter values associated with three input signals to generate one, two or three phase difference representing output signals, whereas, in the phase detector of FIG. 3, there are three subtractors 5A, 5B, 5C, each of which is associated with two input signals. Of course, a multitude of alternative subtractor arrangements are also possible. A general requirement is that the phase detector should comprise at least one first subtractor, which is responsive to at least two of the first counter values to generate at least one first phase difference representing value.

According to an embodiment of the invention a single first subtractor 5 is provided in the phase detector, although the phase detector receives several input signals. The single first subtractor 5 is responsive to two first counter values at a time to generate a phase difference representing value, and capable of generating a number of phase difference representing values in sequence.

Figure 6:
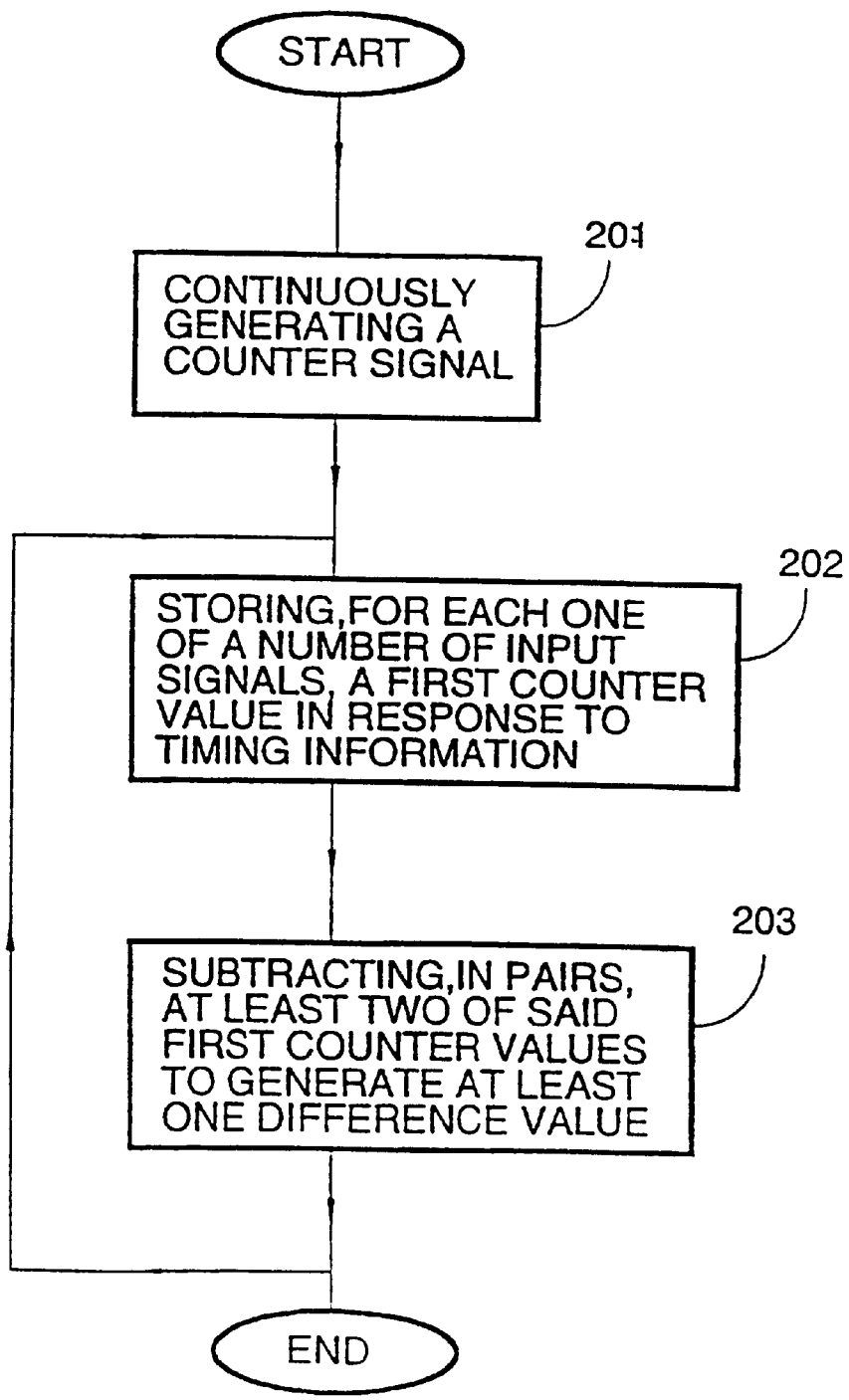
FIG. 6 is a schematic flow diagram illustrating a method for measuring a respective phase difference between at least one pair of a predetermined number, K, of input signals, in accordance with the first aspect of the present invention.

FIG. 6 shows a schematic flow diagram illustrating a method for measuring a respective phase difference between at least one pair of a predetermined number, K, of input signals, in accordance with the first aspect of the present invention. K is a positive integer greater than 1. In step 201 a counter signal is continuously generated in response to a clock signal. In step 202 the current counter value of the continuously generated counter signal is stored as an individual first counter value, for each one of the K input signals, in response to timing information carried by the input signal. In step 203, at least two of the first counter values are subtracted, in pairs, to generate at least one difference value representing a phase difference between a respective pair of the K input signals.

Each individual first counter value is continuously updated in response to the recurrent timing information carried by the corresponding input signal. The subtraction of step 203 is generally repeated at regular intervals, preferably in connection with the updating/storing of the first counter values. To a certain degree, the steps 201–203 can be executed in parallel.

In the following, for reasons of simplicity and clarity, the first aspect of the present invention will be described and explained in the specific context of a phase detector that is responsive to three input signals INPUT 1, INPUT 2 and INPUT 3.

It is obvious that this number of input signals is not intended to limit the scope of the invention.

Examples of a Phase Detector with Wrap Handling

Figure 7:
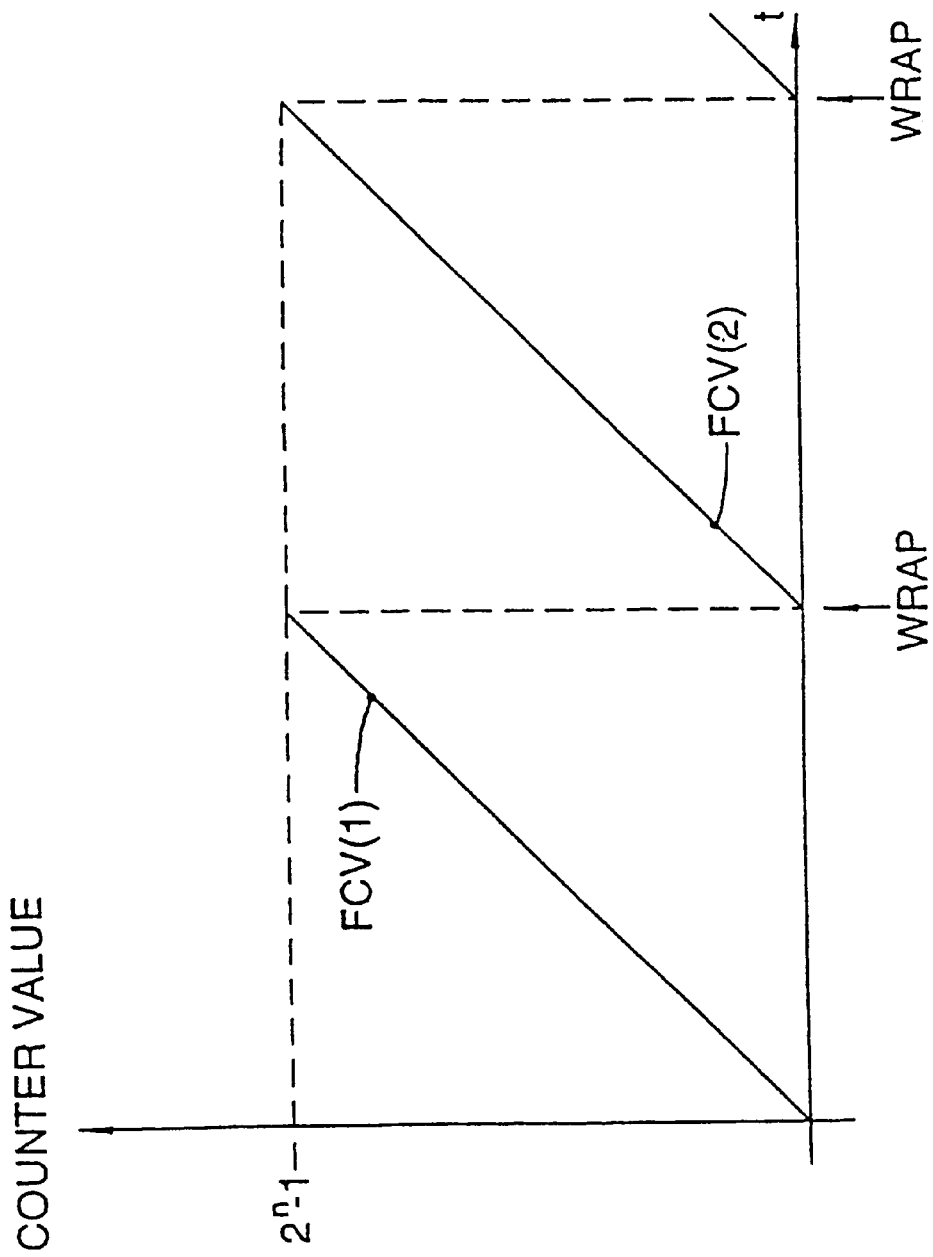
FIG. 7 is a schematic diagram illustrating how the counter of the phase detector increases its counter value with time (t)

FIG. 7 is a schematic diagram illustrating how the counter 2 increases its counter value with time (t). Although the curve of FIG. 7 is illustrated as a continuous curve, it is to be understood that the counter value is incremented by a positive increment for every clock pulse of the clock signal that is applied to the counter. The increment is greater than zero, and generally equal to 1. When the counter 2 has reached its maximum counter value, $2^n-1$, the next counter value will be zero; a wrap. Then, the counter 2 continues to count up to $2^n-1$, and a further wrap takes place, and so on.

The counter 2 of the phase detector according to the first embodiment of the invention has to be reset to zero before starting the phase difference measurements. Correct operation of the phase detector according to the first embodiment is assured during one counter sequence from zero to $2^n-1$. However, if this phase detector is to be used for measuring phase differences continuously, wrap situations will occur.

With reference to FIG. 7, the first counter value FCV(1) associated with input signal INPUT 1 as well as the first counter value FCV(2) associated with input signal INPUT 2 are represented by black dots. It is obvious from FIG. 7 that a wrap has taken place in the period of time between the updating of FCV(1) and FCV(2). This wrap will effect the phase difference measurement between INPUT 1 and INPUT 2 in an undesirable way.

Figure 8:
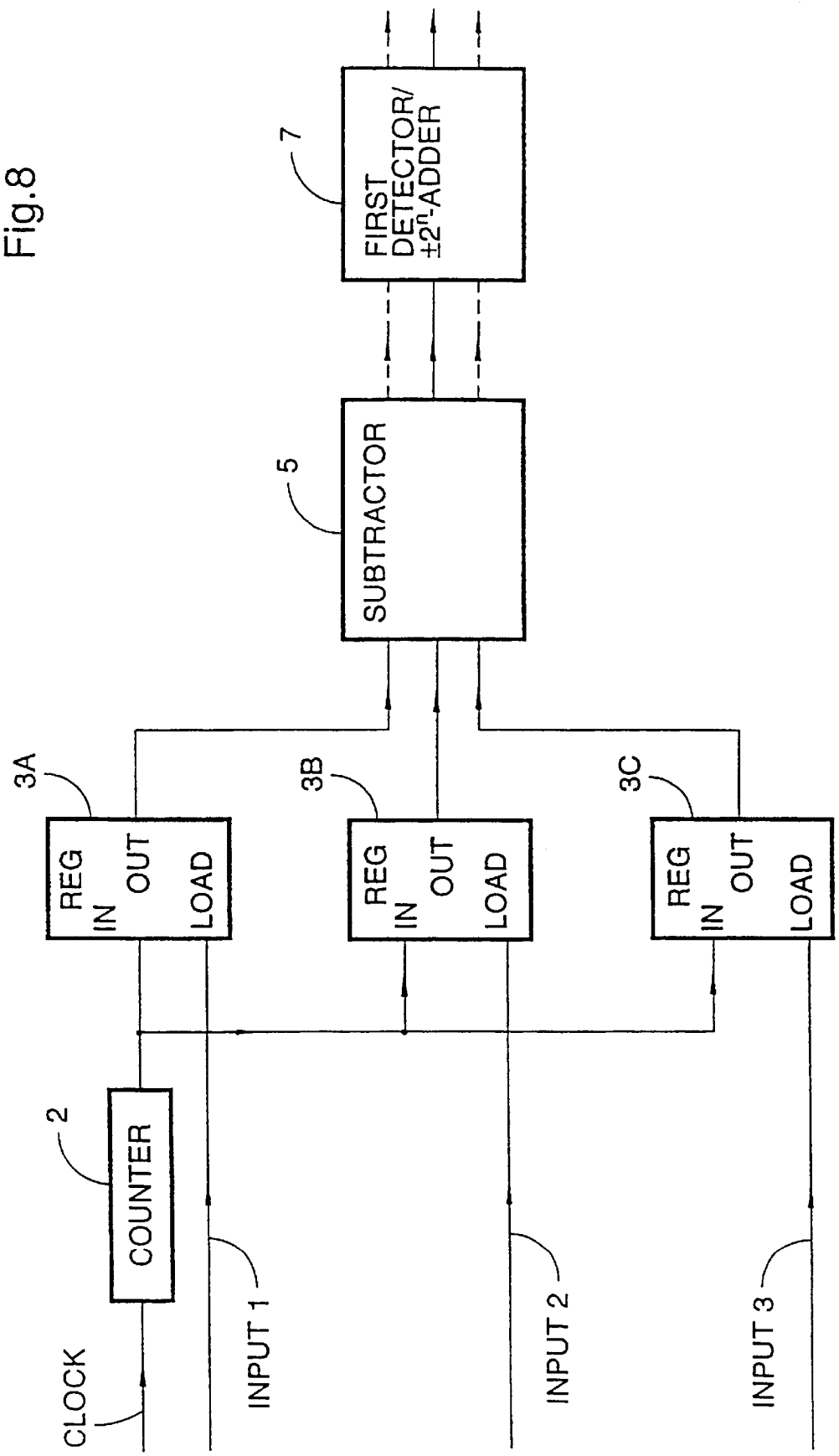
FIG. 8 is a schematic block diagram of a phase detector according to a second embodiment of the invention.

FIG. 8 is a schematic block diagram similar to that of FIG. 1, showing a phase detector according to a second embodiment of the invention. The block diagram of FIG. 8 is identical to that of FIG. 1 except for a first detector/$\pm 2^n$-adder 7 that is included in the phase detector. The first detection/adder means 7 is provided to handle measurement effecting wrap situations. The first detection/adder means 7 is responsive to the phase difference representing first difference values of the first subtractor 5, and detects, for each first difference value, whether the absolute value of the first difference value is greater than the counter interval divided by two, i.e. $2^n/2$. Moreover, the first detector/adder 7 detects whether the first difference value is positive or negative. When a greater than condition is detected and the first difference value is negative, a value, representative of the counter interval or counter range, $2^n$, is added to the first difference value to generate a new corrected first difference value. When a greater than condition and a positive condition are detected, a value, representative of the counter interval or counter range, $2^n$, is subtracted from the first difference value to generate a new corrected first difference value. Note that a subtraction of $2^n$ is equal to an addition of $-2^n$. Hence, the $\pm 2^n$-adder. The first detection/adder means 7 is preferably implemented in software executing in a microprocessor (not shown).

By handling measurement effecting wraps in this way, no initialization or reset of the counter is required.

Consider, by way of example, the first counter values FCV(1) and FCV(2) of FIG. 7. The first difference value FDV is equal to FCV(2)–FCV(1). Assume that the absolute value of the first difference value FDV is greater than $2^n/2$. Thus, this first difference value FDV will incorrectly represent the phase difference between INPUT 1 and INPUT 2. However, by adding, since the first difference value is negative, the counter interval or counter sequence, $2^n$, to the first difference value FDV, an updated corrected first difference value equal to FDV+$2^n$ will be generated. This updated first difference value takes the wrap into account and is representative of a correct phase difference between INPUT 1 and INPUT 2.

Alternatively, the first detection/adder means 7 is implemented in hardware using signal comparators (not shown) and a conventional adder (not shown).

Examples of a Phase Detector with Supervision of the Presence of Input Signals

By using the fact that the counter value in a first register will be different from one timing information to the next, conclusions about the existence of input signals on the inputs of the phase detector can be made. If there is no input signal at a particular phase detector input, the first counter value of the corresponding first register that is associated with this input will be frozen since the load input of the first register does not receive any timing information. In other words, the first counter value will be the same from reading to reading.

Figure 9:
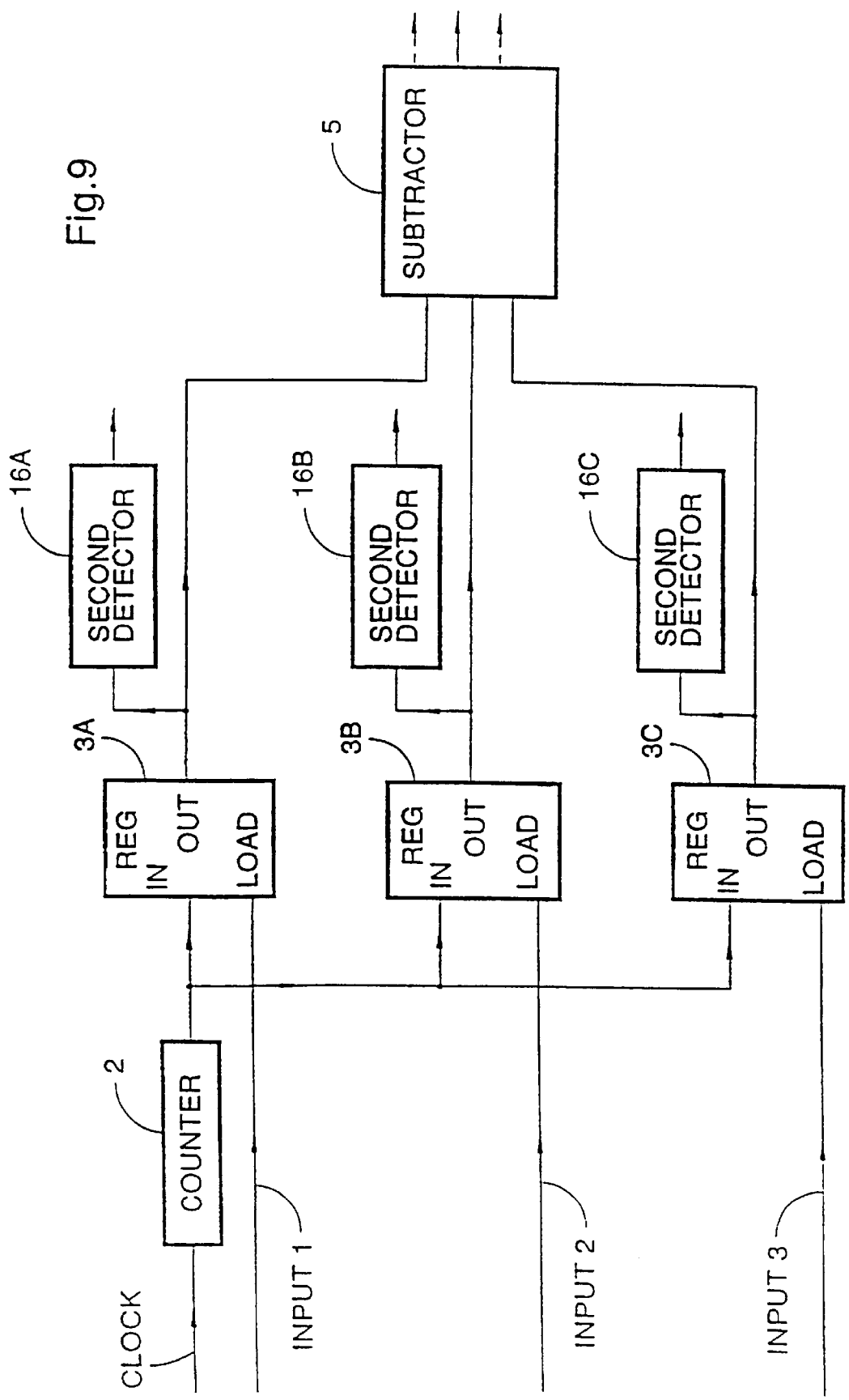
FIG. 9 is a schematic block diagram of a phase detector according to a third embodiment of the invention.

FIG. 9 is a schematic block diagram similar to that of FIG. 1, showing a phase detector according to a third embodiment of the invention. The block diagram of FIG. 9 is identical to that of FIG. 1 except for three second detectors 16A, 16B and 16C. The phase detector according to this third embodiment of the present invention is provided with three second detectors 16A, 16B, 16C, each of which is connected to a respective one of the first registers 3A, 3B and 3C. The second detectors 16A–C are preferably implemented in software executing in the microprocessor (not shown).

For instance, consider the first register 3A which is associated with the possible input signal INPUT 1. The second detector 16A which is connected to the first register 3A stores the first counter value of the first register 3A as a comparison value in response to a recurrent load signal. The load signal is generally sent from the sample clock of the microprocessor (not shown). Of course, the sample time of the microprocessor have to be correctly designed. The sample frequency has to be equal to or less than the lowest frequency of the input signals. A design hint: If the counter sequence, $2^n$, is not an integer multiple (1, 2, 3, . . . ) of the cycle time of the input signal, then the sample time may be increased, which in turn will reduce the load of the microprocessor. The comparison value is updated every time the load signal is received by the second detector 16A, and the load input of the register included in the second detector 16A in particular. However, prior to each updating of the comparison value, the second detector 16A detects whether the first counter value currently stored in the first register 3A is equal to the comparison value which in fact is representative of the preceding first counter value of the first register 3A. If an equal to condition is detected, then a no signal indication is generated. The second detectors 16 B and 16C are connected to the first registers 3B and 3C, respectively. Their operation is identical to that of the second detector 16A.

Alternatively, a single second detector unit (not shown) is used.

In general, there is provided a second detection means which detects, for each one of a set comprising a predetermined number, S, of first registers, whether the first counter value currently stored in the first register is equal to a comparison value, which is representative of the preceding first counter value of the first register and which has been previously stored in the second detection means. If an equal to condition is detected, then a no signal indication is generated. A no signal indication generally means that there is no input signal present at the phase detector input that is associated with the particular first register. The comparison value is updated, after the detection, by storing the first counter value of the first register in the second detection means in response to a recurrent load signal. S is a positive integer that is limited by the number of first registers in the phase detector. It is possible to supervise a single input of the phase detector, S=1, with regard to whether there is an input signal or not.

Alternatively, an external clock generator is provided for generating of a sample frequency that is equal to or lower than the lowest frequency of the input signals, and each one of the second detectors is realized by a conventional signal comparator (not shown) and a memory means (not shown), e.g. a register of the same number of bits as the first registers and equipped with a load input.

In accordance with a preferred embodiment of the invention, the phase detector comprises the first detector/adder 7 shown in FIG. 8, and second detection means.

The second detection means is preferably utilized as a supervising function or device in the phase detector. The absence of one or more of the input signals is easily detected. The information provided by the second detection means is generally used for making probability assessments. By way of example, consider a phase detector which initially receives three input signals. Assume that the input signals do not have the same source, and that all of a sudden, the second detection means 17 generates a no signal indication for each phase detector input. The probability of losing all three input signals is much smaller than the probability that the phase detector itself is malfunctioning. Thus, the probability assessment in this particular case will be that the phase detector is faulty. The malfunction can, for instance, originate from an erroneous clock signal or a faulty counter 2. In a similar way other probability assessments can be made.

Example of a Particular Phase Detector Application

Figure 10:
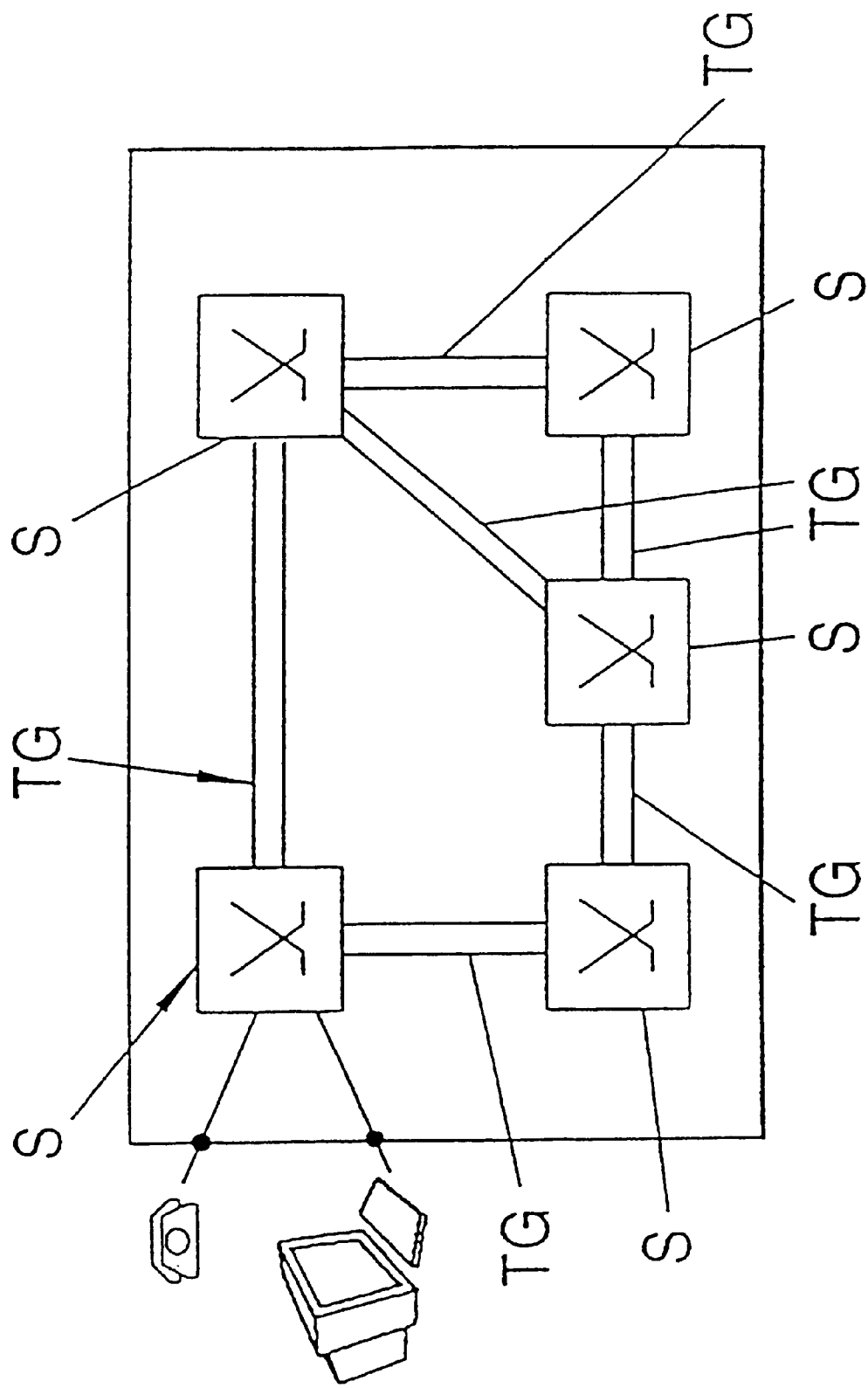
FIG. 10 is a schematic drawing of a telecommunication system.

A particular application of the phase detector according to the invention will be described with reference to FIG. 10. FIG. 10 is a schematic drawing of a telecommunication system. It basically comprises switches S or equivalents, physical links interconnecting the switches, and various auxiliary devices. In general, the physical links are grouped into trunk groups TG which extend between the switches S. Normally a telecommunication system would be implemented with more switches and trunk groups than is illustrated in FIG. 10. However, the simplified representations of FIG. 10 will be used for describing the particular application of the present invention. There are access points to the physical network, to which access points, access units such as telephone sets and computer modems, are connected. A physical link utilizes transmission equipment, such as fiber optic conductors, coaxial cables or radio links. A switch S generally comprises a number of circuits which normally are mounted on circuit boards that are stored in cabinets.

A switch normally includes a clock generating system which provides digital circuits in the switch with clock signals. To meet the requirements on safety and reliability, the clock generating system should be redundant. Redundancy is ensured by using multiple clock signal generating units. In general, a redundant clock system with multiple units requires some type of regulation system. The clock system can be of the type master-slave or a mutually regulating clock system. In either case, the clock signals of different clock generating units have to be synchronized with each other in some way. To this end, phase differences between the clock signals of the different clock signal generating units are measured. This is realized by a phase detector according to the invention. In the currently preferred clock system, the phase detector receives three clock signals and determines three different phase differences between predetermined pairs of the clock signals. More particularly, the phase difference measurements are performed with regard to a synchronization pattern of 8 kHz carried by each clock signal. Digital decoding means is used to decode the synchronization pattern. The phase difference values are then sent to a regulator which calculates control voltages, each of which is sent to a respective one of the clock signal generators in the clock system. Of course, the number of clock signals between which it is desired to measure phase differences depends on the degree of redundancy in the clock system. If, by way of example, four clock generating units are used, then the phase detector will receive four clock signals.

Furthermore, several switches are generally synchronized with each other in a network synchronization. This network synchronization, which can be of different types such as mutual or master-slave synchronization, also requires phase difference measurements. These measurements are realized by the phase detector according to the invention.

The above particular application of the present invention should not be interpreted as limiting. A multitude of other applications exists in the field of telecommunications, but also in other areas of technology.

Figure 11:
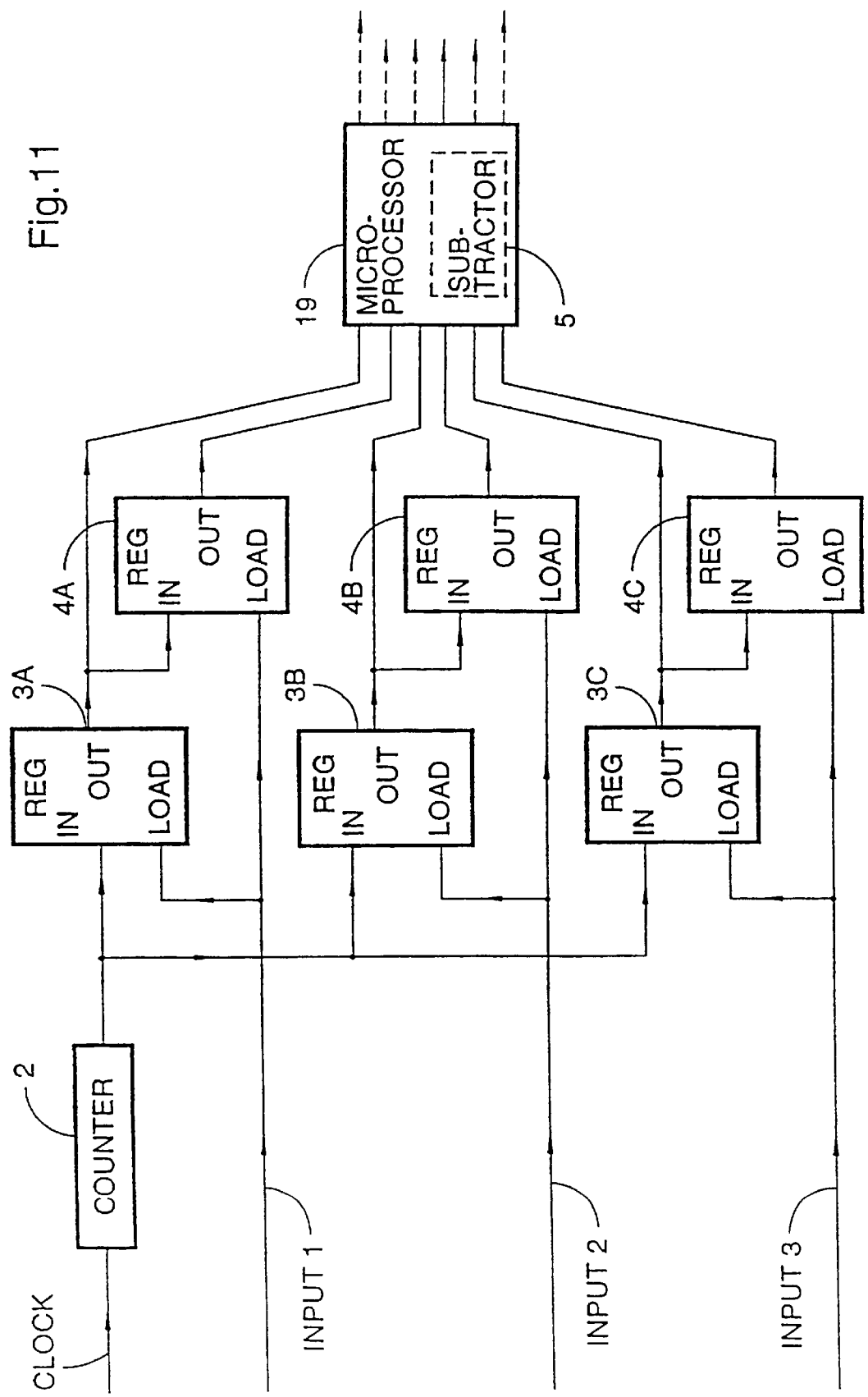
FIG. 11 is a schematic block diagram of a phase detector according to a fourth embodiment of the invention.

Examples of a Phase Detector with Alternative Wrap Handling and/or Frequency Supervision FIG. 11 is a schematic block diagram of a phase detector according to a fourth embodiment of the invention. The block diagram of FIG. 11 is similar to that of FIG. 1 except for a second set of registers that is used for backing-up the first counter values of the first registers. In addition, there is provided a microprocessor 19, in which the first subtractor 5 is implemented. In the phase detector according to the fourth embodiment of the invention, there are provided three second registers 4A, 4B, 4C. The phase detector which receives three input signals INPUT 1, INPUT 2, INPUT 3 comprises a counter 2, first registers 3A, 3B, 3C, second registers 4A, 4B, 4C and the subtractor unit 5 implemented in the microprocessor 19. For each input signal there is a first register and a second register which are connected to each other. Each one of the second registers is connected to a respective one, referred to as its associated first register, of the first registers such that each second register is responsive to the first counter value of its associated first register. In other words, the output of the first registers 3A, 3B, 3C is connected to the in-input of the second registers 4A, 4B and 4C, respectively. Furthermore, each second register is responsive to the same input signal as that of its associated first register. Each input signal is distributed to the load-input of a respective one of the first registers and to the load-input of the corresponding second register.

In the preferred embodiment, the first and second registers are of the same type, preferably implemented by D-flip-flops, and equipped with a load-input. The second registers are capable of storing the same number of bits as the first registers; n bits.

Consider, by way of example, input signal INPUT 1. In operation, when the timing information carried by INPUT 1 appears at the load-input of the corresponding second register 4A the first counter value stored in the associated first register 3A is backed-up, stored, as a back-up counter value via the in-input in the corresponding second register 4A. If the clock signal reaches the first and second registers at the same time, there is provided an internal delay which is implemented in each one of the first registers, and the D-flip-flops thereof in particular, such that the first counter values are backed-up prior to the updating of the first counter values. This internal delay of the first registers is realized such that the accuracy of the measurements is not at all effected or such that the effect is negligible. Immediately after the backing-up of the first counter value of the associated first register 3A as a back-up counter value in the second register 4A, the current counter value of the counter 2 is stored in the associated first register 3A.

In this way, the first counter value in the first register 3A is updated, and, prior to this updating, the first counter value in the first register 3A has been backed-up in the second register 4A. This procedure takes place for all of the first and second registers in response to the timing information carried by the input signals, taking the internal delay of the first registers into account. Of course, in response to the next timing information, the first counter values of the first registers are once again backed-up in the second registers. Thus, each back-up counter value of the second registers is also updated. Furthermore, in the same manner as before, for each register, the first counter value is updated since the current counter value of the counter 2 is stored in the first register as a new updated first counter value. Normally, the counter values in the different registers are continuously backed-up and updated in response to the recurrent timing information.

All the values out from the first and second registers must originate from the same time instance. This is solved by having a hold function in each one of the first and second registers so that the first and back-up counter values can be frozen until all registers have been read. The hold function is for instance realized by providing the registers with an enable pin. Another solution is to have "shadow" registers for the first and second registers, each shadow register having a hold function. Alternatively, if the number of first and second registers are limited, the microprocessor 19 makes a simultaneous read-out of the first counter values from the first registers and the back-up counter values from the second registers, via a data bus (not shown).

Alternatively, the subtractor 5 is implemented in hardware without a microprocessor.

Figure 12:
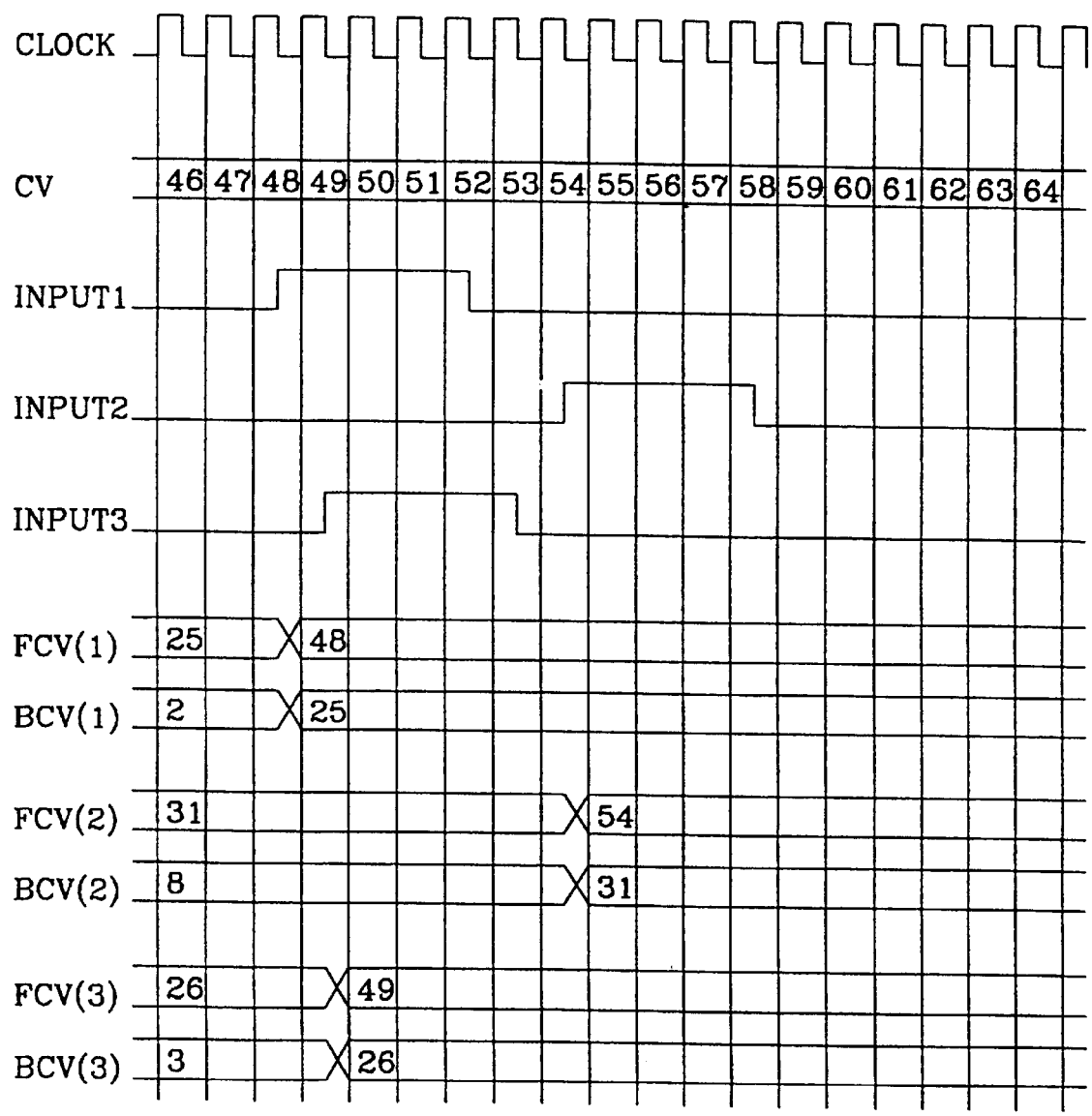
FIG. 12 is a timing diagram illustrating an example of the signals and counter values appearing in the phase detector of FIG. 11.

FIG. 12 is a timing diagram illustrating an example of the signals and counter values appearing in the phase detector of FIG. 11. There is a square wave clock signal, the first clock signal, CLOCK, which is sent into the counter 2. The counter 2 generates a counter signal which has a counter value, CV, that varies in response to the first clock signal. There is shown three input signals INPUT 1, INPUT 2 and INPUT 3. To each input signal there is associated a corresponding first counter value FCV and a corresponding back-up counter value BCV. INPUT 1, INPUT 2 and INPUT 3 are associated with FCV(1) and BCV(1), FCV(2) and BCV(2), FCV(3) and BCV(3), respectively. The first counter values FCV(1), FCV(2), FCV(3) are stored in the first registers 3A, 3B and 3C, respectively. The back-up counter values BCV(1), BCV(2), BCV(3) are stored in the second registers 4A, 4B and 4C, respectively.

In operation, when the timing information, in this case the positive edge, on INPUT 1 appears on the load-input of the first register 3A, with consideration taken to the internal delay of the first register 3A, the first counter value FCV(1) is updated; the current counter value CV of the counter signal is transferred to or stored in the first register 3A. However, immediately prior to this updating of the first register 3A, the first counter value that is stored in the first register 3A is backed-up, stored, in the corresponding second register 4A as a back-up counter value BCV(1). The back-up is executed in response to the timing information carried by the input signal INPUT 1. Correspondingly, the first counter values FCV(2) and FCV(3) are also backed-up and updated in response to the timing information on INPUT 2 and INPUT 3, respectively. The internal delay of the first registers 3B, 3C is taken into account.

Phase differences between input signals are obtained by subtracting first counter values with each other in the subtractor 5 in the same way as described above in connection with FIGS. 1 and 2.

In addition to phase difference measurements, the first counter values are used together with the back-up counter values in several ways, to give the phase detector operator or system manager useful information about the input signals and the phase detector itself.

For instance, it is apparent that the second detection means described above in connection with FIG. 9 can be connected to the second registers instead of the first registers, and used for supervising the presence of input signals on the inputs of the phase detector.

In the following, some more examples will be given: 1) Measurement effecting wrap situations are detected by comparing first counter values with back-up counter values; and 2) The frequency of at least one of the input signals can be calculated and subsequently used for supervising the phase detector itself.

The above examples will be described in more detail below.

1) Examples of Alternative Handling of Measurement Effecting Wraps

An alternative way of detecting measurement effecting wraps, and two alternative ways of handling these wraps will be described below.

Figure 13:
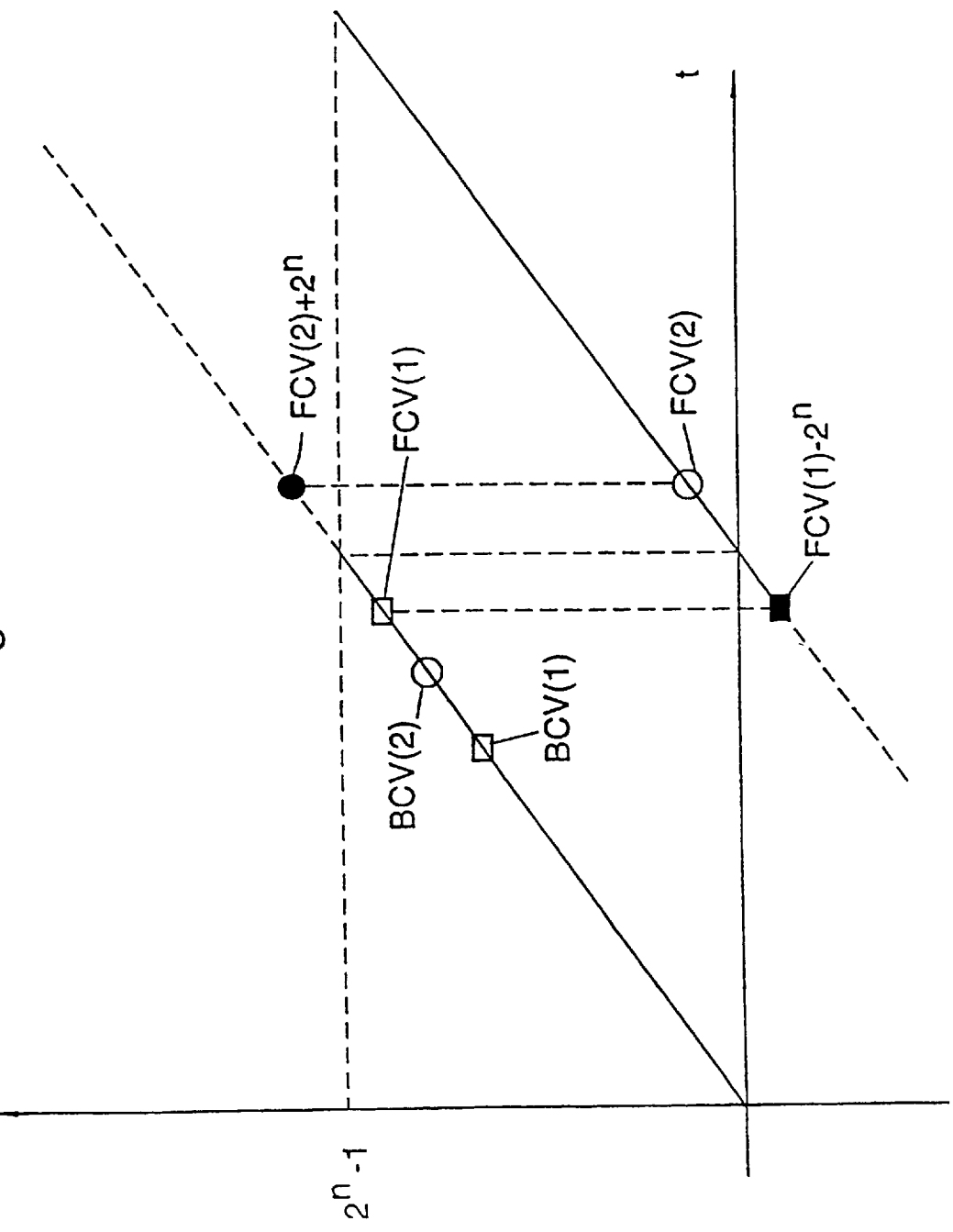
FIG. 13 is a schematic diagram illustrating how the counter value is increased with time (t)

FIG. 13 is a schematic diagram illustrating how the counter 2 increases its counter value with time (t). Although the curve of FIG. 13 is illustrated as a continuous curve, it is to be understood that the counter value is incremented by a positive increment which is greater than zero and generally equal to one. Further, the time axis does not necessarily have to start at zero. The number of different states of the counter 2 is equal to $2^n$. There is indicated two pairs of counter values. Each counter value pair comprises a respective first counter value and a corresponding back-up counter value, and is associated with a respective input signal. The first counter value FCV(1) and the corresponding back-up counter value BCV(1), which both are associated with input signal INPUT 1, are represented by white boxes. The first counter value FCV(2) and the corresponding back-up counter value BCV(2), which both are associated with input signal INPUT 2, are represented by white circles. In this application a wrap has taken place in the period of time between the updating of FCV(1) and FCV(2), as is obvious from the diagram of FIG. 13. A wrap situation that will effect the phase difference measurement is detected by seeing if the back-up counter value is greater than the corresponding first counter value. In FIG. 13, BCV(2) is greater than FCV(2).

Consequently, in an alternative embodiment of the invention, measurement effecting wrap situations are detected by comparing back-up counter values with corresponding first counter values without first having to calculate the first difference values.

Wrap correction before the actual determination of a phase difference representing first difference value can be executed in the following two exemplifying ways:

Consider the simple example of the first counter values FCV(1) and FCV(2) shown in FIG. 13.

1) Add $2^n$ to FCV(2), and subtract FCV(1) from the new value FCV(2)+$2^n$. FCV(2)+$2^n$ is represented by a dark circle in FIG. 13.

$$FCV(2)+2^n-FCV(1)=FCV(2)-FCV(1)+2^n.$$

2) Subtract $2^n$ from FCV(1), and subtract the value FCV(1)−$2^n$ from FCV(2). FCV(1)−$2^n$ is represented by a dark box in FIG. 13.

$$FCV(2)-(FCV(1)-2^n)=FCV(2)-FCV(1)+2^n.$$

It is apparent that in both cases, $2^n$ is added to the value that is equal to FCV(2)−FCV(1).

The method of adding $2^n$ to FCV(2), and subtracting FCV(1) from the result of this addition so as to get a correct phase difference representing value is generalized and implemented in accordance with the invention as described below in connection with FIG. 14.

Figure 14:
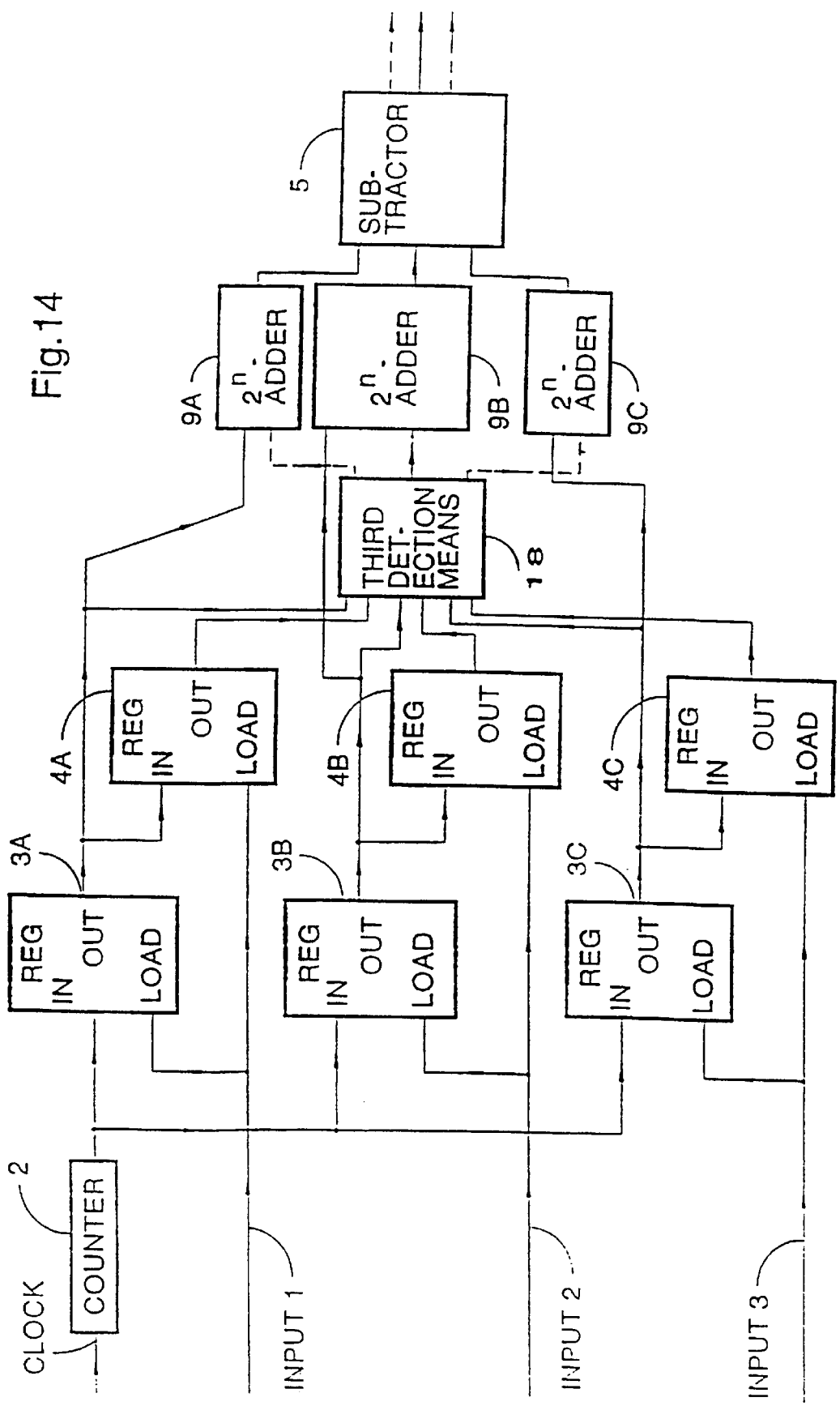
FIG. 14 is a schematic block diagram of a phase detector according to the invention.

FIG. 14 is a schematic block diagram of a phase detector according to the invention. The block diagram of FIG. 14 is similar to that of FIG. 11 except for third detection means 18 and three $2^n$-adders 9A, 9B, 9C. The third detection means 18 is responsive to the first counter values of the first registers 3A, 3B, 3C and the back-up counter values of the second registers 4A, 4B, 4C. The third detection means 18 detects, for each back-up counter value and its corresponding first counter value, whether the back-up counter value is greater than the corresponding first counter value. For each back-up counter value and its corresponding first counter value, a respective enable signal is generated when a greater than-condition is detected. Each one of the $2^n$-adders adds $2^n$ to the corresponding respective one of the first counter values, provided that the corresponding enable signal is received by the $2^n$-adder, so as to generate a respective sum which is representative of a new first counter value. This new first counter value is updated twice. At first by the respective first register in response to the recurrent timing information carried by the respective input signal and the second time by the $2^n$-adder to correct for the phase difference measurement effecting wrap of the counter 2. If, for an individual back-up counter value and the corresponding first counter value, a greater than-condition is not detected, then no enable signal is generated, and consequently no adding-operation is executed. In this case, the corresponding $2^n$-adder is transparent, and the first counter value associated with the $2^n$-adder remains unchanged. The subtractor 5 is responsive to the output of the $2^n$-adders 9A, 9B, 9C. In this way, phase differences are measured between the input signals INPUT 1, INPUT 2, INPUT 3 with consideration taken to wrap situations.

Preferably, the three $2^n$-adders 9A, 9B, 9C are integrated into a single adding unit (not shown) which is responsive to the three input signals and the possible enable signals.

In accordance with an embodiment of the invention, the detection and adding are implemented in software in a microprocessor, and no enable signals are generated. The microprocessor receives the first counter values and the back-up counter values of the first registers and the second registers, respectively. These counter values are processed internally by the software of the microprocessor. For each register pair that comprises an individual second register and its associated first register, a detection is performed to see whether the back-up counter value of the individual second register is greater than the updated first counter value of the associated first register. If a greater than-condition is detected, $2^n$ is added to the first counter value of the associated first register so as to generate a sum representative of a twice updated first counter value.

Furthermore, it is important to understand that implementations which do not include any second registers are possible. Instead, the first counter values can be backed-up as back-up counter values in e.g. a RAM, connected to the microprocessor in a known manner. However, the RAM solution will increase the load of the microprocessor.

The method of first subtracting $2^n$ from FCV(1), and then subtracting the result of the first subtraction from FCV(2) so as to get a correct phase difference representing value is realized in another alternative embodiment of the invention. The measurement effecting wrap is detected by comparing FCV(2) with BCV(2). FCV(2) is kept unchanged, and $2^n$ is subtracted from FCV(1) to generate a sum representative of a twice updated first counter value equal to FCV(1)-$2^n$. FCV(1) was updated within the counter sequence, prior to the wrap. FCV(1)-$2^n$ is subtracted from FCV(2) to generate the corrected phase difference representing value.

In general, if at least one first counter value is effected by a wrap such that the corresponding back-up counter value or values is/are greater than the corresponding first counter value or values, then $2^n$ is subtracted from each first counter value that is greater than its corresponding back-up counter value. By subtracting $2^n$ from each one of the back-up counter values as well, the cycle time and frequency can be correctly determined with consideration taken to measurement effecting wraps. Cycle time and frequency determination for the input signals will be described in detail in connection with FIGS. 15 to 18.

The detection of measurement effecting wraps and the subsequent subtraction are generally implemented in software in a microprocessor (not shown). The microprocessor reads the first counter values and the back-up counter values of the first registers and the second registers, respectively. These counter values are then processed internally by the software of the microprocessor.

2) Examples of a Phase Detector with Frequency Determination

In accordance with the invention, the first counter values of the first registers and the back-up counter values of the second registers are used for determining the frequency of at least one of the input signals of the phase detector.

Figure 15:
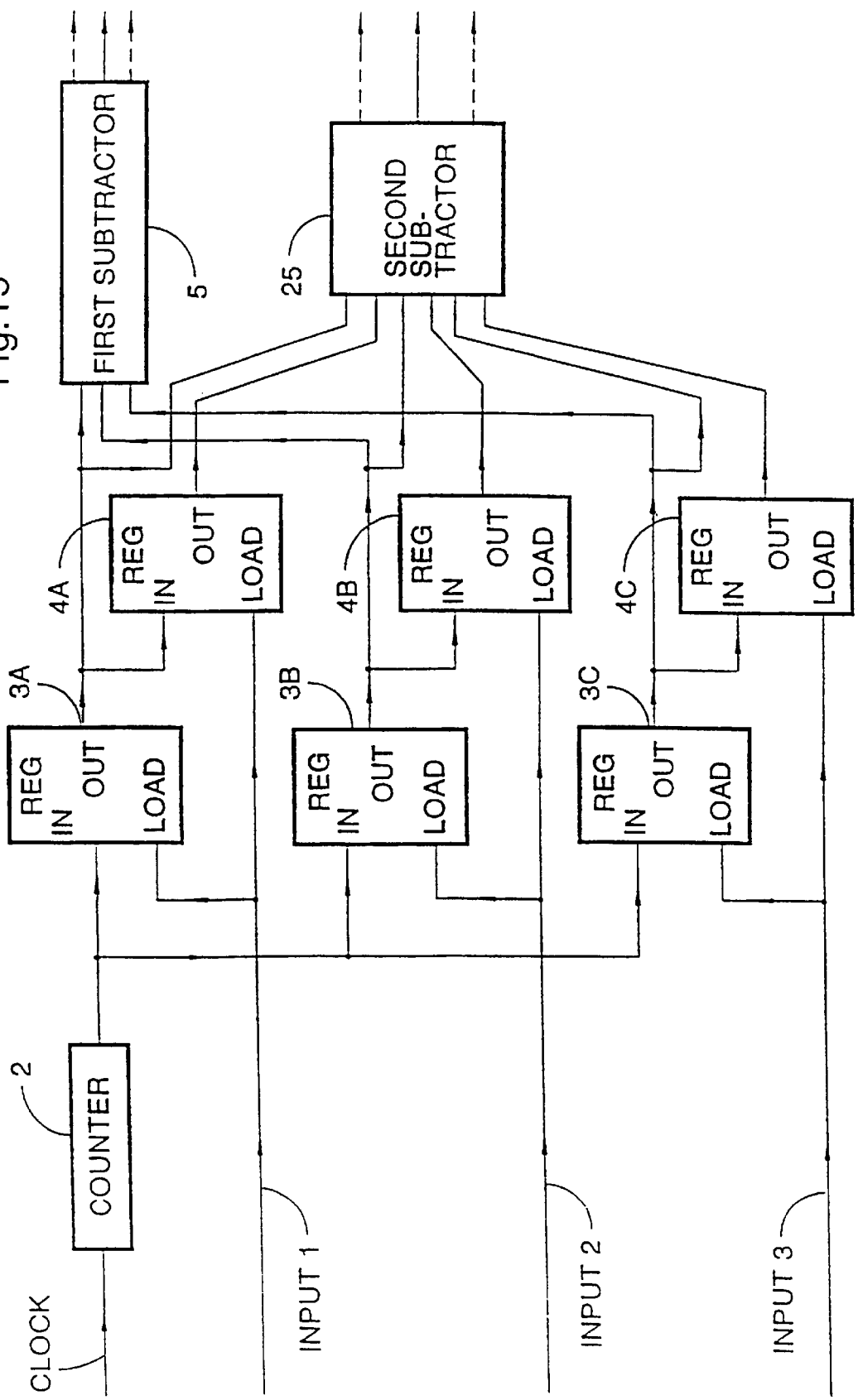
FIG. 15 is a schematic block diagram of a phase detector according to the invention.

FIG. 15 is a schematic block diagram of a phase detector according to the invention. The block diagram of FIG. 15 is similar to that of FIG. 11. However, in the block diagram of FIG. 15 there is provided a second subtractor 25 in addition to the first subtractor 5. These subtractors 5, 25 are preferably implemented in software that executes in the microprocessor 19 (shown in FIG. 11). The first counter values of the first registers 3A, 3B, 3C are read by the first subtractor 5 and used for determining at least one phase difference between at least one pair of the input signals INPUT 1, INPUT 2, INPUT 3. The phase difference measurement is performed in the same manner as described above in connection with FIGS. 1 and 2. The first counter values of the first registers 3A, 3B, 3C and the back-up counter values of the second registers 4A, 4B, 4C are read by the second subtractor 25. The second subtractor 25 subtracts the updated first counter value of the first register 3A with the back-up counter value of the second register 4A to determine a second difference value that is representative of the cycle time and frequency of the input signal INPUT 1. With reference to the example of FIG. 12, the cycle time of INPUT 1 can be determined by subtracting FCV(1) with BCV(1). FCV(1)-BCV(1)=48-25=23. Thus the cycle time of INPUT 1 is equal to 23 multiplied with the cycle time of the first clock signal, CLOCK. This corresponds to a frequency that is equal to the inverse of the cycle time of INPUT 1. Correspondingly, the subtractor 25 subtracts the updated first counter value of the first register 3B with the back-up counter value of the second register 4B to determine the cycle time and frequency of INPUT 2. The cycle time and frequency of INPUT 3 is determined by subtracting the counter values of the first and second registers 3C and 4C.

Alternatively, hardware implementations of the first subtractor 5 and the second subtractor 25 are realized by using conventional circuits.

The frequency determination is performed with consideration taken to wrap handling, if such handling is necessary. Frequency measurement effecting wraps are generally handled in the same way as described in connection with FIGS. 7 and 8 for phase difference measurements. A detector/±$2^n$-adder (not shown) is included in the phase detector. For reasons of simplicity, it is assumed that a frequency representing difference value is defined as follows: frequency representing value first counter value—corresponding back-up counter value. Hence, the detector/±$2^n$-adder will become a detector/$2^n$-adder. The detector/$2^n$-adder is provided to handle the frequency measurement effecting wraps. The output signals of the second subtractor 25 are sent to the detector/$2^n$-adder which is responsive to the frequency representing second difference values of the second subtractor 25. The detector/$2^n$-adder detects, for each second difference value, whether the absolute value of the second difference value is greater than the counter interval divided by two, i.e. $2^n/2$. When a greater than condition is detected, a value, representative of the counter interval or counter range, $2^n$, is added to the second difference value to generate a new updated second difference value. This updated second difference value is representative of a correct frequency. Conveniently, a detector/$2^n$-adder similar to that of FIG. 8 is used for handling the frequency measurement effecting wraps. Preferably, the first detector/±$2^n$-adder 7 for phase difference measurement effecting wraps and the detector/$2^n$-adder used for frequency measurement effecting wraps are integrated into a single unit (shown as the detector/±$2^n$-adder 27 in FIG. 19), which is responsive to first as well as second difference values.

Alternatively, the solution of comparing first counter values with corresponding back-up counter values, and, depending on the result of the comparison, executing an addition/subtraction operation is utilized to correct for wraps so that the cycle time and frequency can be correctly determined. In the following, three realization examples are given:

i) For each register pair that comprises an individual second register and its associated first register, a detection is performed to see whether the back-up counter value of the individual second register is greater than the updated first counter value of the associated first register. If a greater than-condition is detected, $2^n$ is added to the first counter value of the respective associated first register so as to generate a respective sum representative of a twice updated first counter value. Subsequently, at least one of the current first counter values, including twice updated first counter values if such have been generated, is subtracted with the corresponding back-up counter value to determine at least one second difference value. Each second difference value is representative of the correct cycle time of a respective input signal. Preferably, a software implementation is realized.

ii) The solution of FIG. 14 with a third detector and several adders, possibly a single adding unit, is used in yet another alternative embodiment of the invention.

iii) If at least one first counter value is effected by a wrap such that the corresponding back-up counter value is greater than the first counter value, then $2^n$ is subtracted from the corresponding back-up counter value to generate a new back-up counter value. The new back-up counter value is used for the frequency determination. Preferably, a software implementation is realized.

If the frequency of a single input signal, for instance INPUT 1, is to be supervised, then the updated first counter value of the first register 3A and the back-up counter value of the second register 4A are considered. Hence, the second subtractor 25 does not have to read the counter values of the other registers.

It should be understood by those skilled in the art that it is possible to have a phase detector which comprises more than one second subtractor, each second subtractor being used for generating at least one frequency representing signal.

In general, it is desired to determine the frequency of at least one of the input signals of the phase detector. The first and second registers of the phase detector can be viewed as a number of register pairs. Each register pair comprises an individual second register and its associated first register. The second subtractor 25 is responsive to the counter values of each register pair of a set comprising a predetermined number, R, of register pairs, for subtracting, for each register pair of the set, the counter values of the register pair to generate a respective second difference value representative of the frequency of the input signal that is associated with the register pair. In particular, for each register pair, the back-up counter value of the second register is subtracted from the updated first counter value of the associated first register. R is a positive integer that is limited by the number of register pairs in the phase detector. The set of register pairs may include all register pairs in the phase detector, but also only one register pair. There is one register pair associated with each input signal. Thus, if there are three input signals INPUT 1, INPUT 2, INPUT 3, then R can be 1, 2 or 3.

Preferably, the first subtractor 5 and the second subtractor 25 are integrated into a single subtractor unit (not shown in FIG. 15). The general requirement for this subtractor unit is that it is responsive to both first counter values and back-up counter values for generating phase difference as well as frequency representing signals. By way of example, the first subtractor 5 could be integrated into the second subtractor 25, or the other way around.

It is important to understand that the cycle time and subsequently the frequency of at least one input signal can be determined according to the invention in an implementation which does not use the second registers. Instead, the first counter values are backed-up as back-up counter values in e.g. a RAM, connected to the microprocessor 19 in a known manner. This, however, requires that the first registers are sampled every time they are updated, which in turn means that the load of the microprocessor will increase.

By using the second registers, the load of the microprocessor 19 is minimized and the speed of operation is increased in comparison with the above solution incorporating a RAM connected to the microprocessor 19.

Consequently, determination/supervision of the frequency of at least one of the input signals is integrated into the phase detector in an elegant and simple manner by utilizing the first counter values and the back-up counter values.

The frequency information is used for analyzing the status of the phase detector itself. For instance, if the range or interval, in which the frequency of a group of input signals of the phase detector should lie, and the frequency interval of the clock signal are known, then probability assessments of the status of the phase detector and/or the group of input signals can be made. Consider, by way of example, the redundant clock system of the telecommunication switch of FIG. 10. In the currently preferred clock system there are three clock signal generating units. Each unit produces a clock signal which is sent to a phase detector according to the invention. The frequency interval of each of the input signals of the phase detector is known since the tuning range of the clock signal generating units, normally voltage controlled oscillators, is given. In addition, the frequency range of the clock signal that is connected to the phase detector is also given. Now, if the frequency determining function of the inventive phase detector shows that the frequency of an input signal lies outside the frequency interval given by the tuning range of the VCO, taking the frequency variation of the clock signal into consideration, then a frequency error is detected. If all the input signals of the phase detector show frequency error, and the different input signals do not have the same source, then there must be something wrong with the phase detector itself. This last assessment is based on the fact that the probability of having three erroneous input signals is much smaller than the probability of having, for instance, a faulty clock signal or a faulty counter. In a similar way other probability assessments are made.

Examples of a Frequency Detector

The frequency supervising properties of the inventive phase detector can be utilized separately to provide a frequency detector, also referred to as a frequency measuring device. In accordance with a second aspect of the invention a frequency detector is provided.

Figure 16:
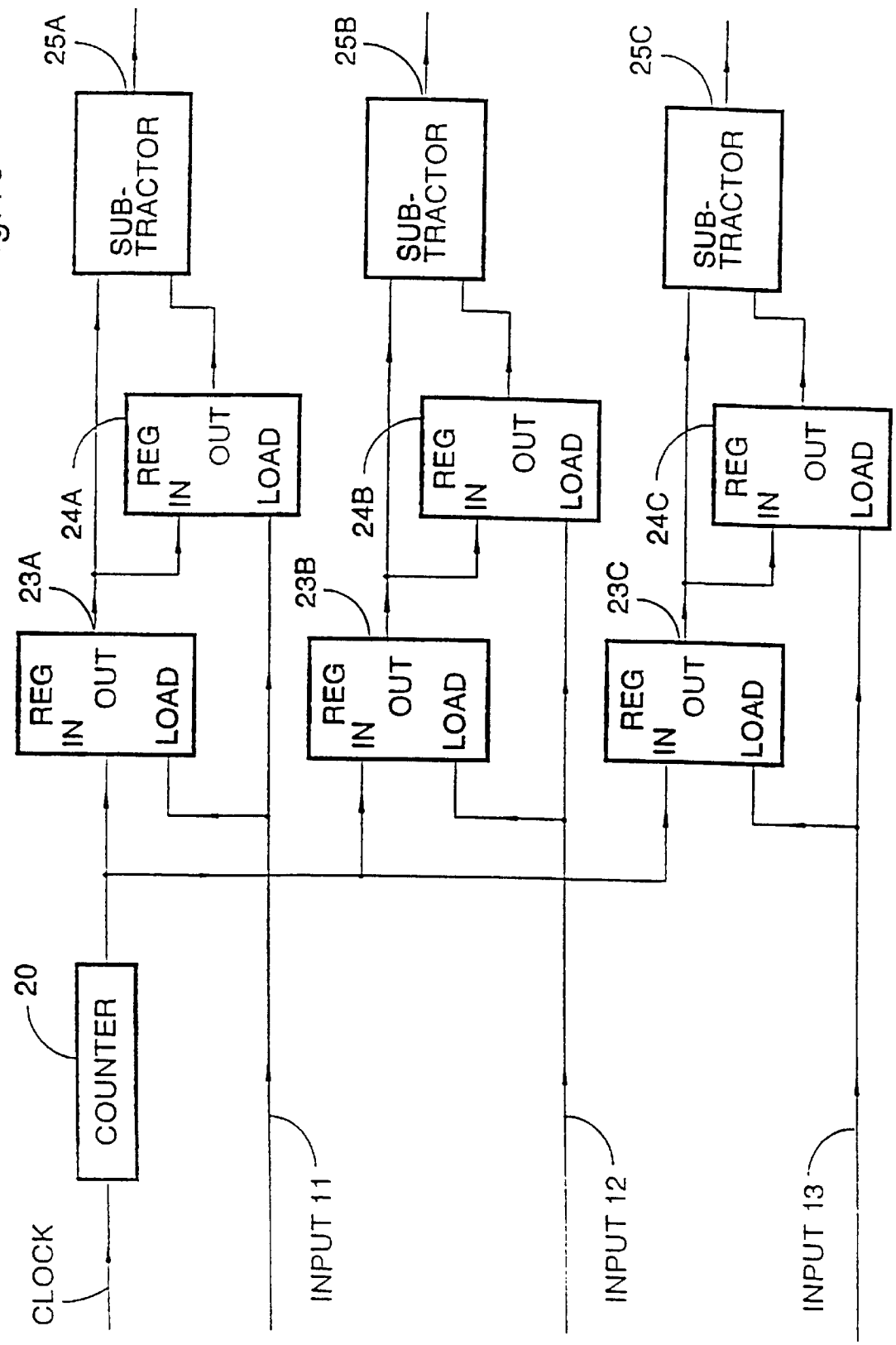
FIG. 16 is a schematic block diagram of a frequency detector according to the second aspect of the present invention.

FIG. 16 is a schematic block diagram of a frequency detector according to the second aspect of the present invention. The inventive frequency detector comprises a counter 20, the first registers 23A, 23B, 23C, the second registers 24A, 24B, 24C and the subtractors 25A, 25B, 2SC. The frequency detector receives three input signals INPUT 11, INPUT 12 and INPUT 13 and a clock signal, CLOCK2. The counter 20 is preferably a binary counter which counts the clock pulses of the CLOCK2 signal and generates a counter signal. Each one of the first registers 3A–C is responsive to the counter signal of the counter 20 and a respective one of the input signals for updating the first counter value of the first register generally in response to timing information carried by the input signal. Each one of the second registers 4A–C is responsive to the first counter value of the corresponding one of the first registers 3A–3C, and a respective one of the input signals for storing the first counter value of the first register, prior to the updating of the first counter value, as a back-up counter value in response to the timing information carried by the input signal. By way of example, the registers are conventional n-bits registers, each one equipped with a load input. The frequency detector is similar to the phase detector of FIGS. 11 and 15 in most regards, and the frequency detector basically operates in accordance with the frequency determination realized in the phase detector of FIG. 15. However, the subtractor arrangement of the frequency detector is somewhat different since the subtractors 25A, 25B, 25C generate frequency representing signals. In the frequency detector of FIG. 16, the subtractor 25A is responsive to the updated first counter value of the first register 23A and the back-up counter value of the second register 24A to generate a difference value or difference signal. This difference value is representative of the cycle time and frequency of the input signal INPUT 11. Correspondingly, the subtractors 25B and 25C make readouts of the counter values of their corresponding registers. The subtractor 25B generates a difference value representative of the frequency of INPUT 12 and the subtractor 25C generates a frequency representing signal for INPUT 13.

With reference to the example of FIG. 12, the cycle time of INPUT 1 can be determined by subtracting FCV(1) with BCV(1). FCV(1)–BCV(1)=48–25=23. Thus the cycle time of INPUT 1 is equal to 23 multiplied with the cycle time of the first clock signal, CLOCK. The frequency of INPUT 1 is equal to the inverse of the cycle time of INPUT 1. It is to be understood by those skilled in the art that the timing diagram of FIG. 12 also may illustrate an example of the signals and counter values appearing in the frequency detector of FIG. 16.

Figure 17:
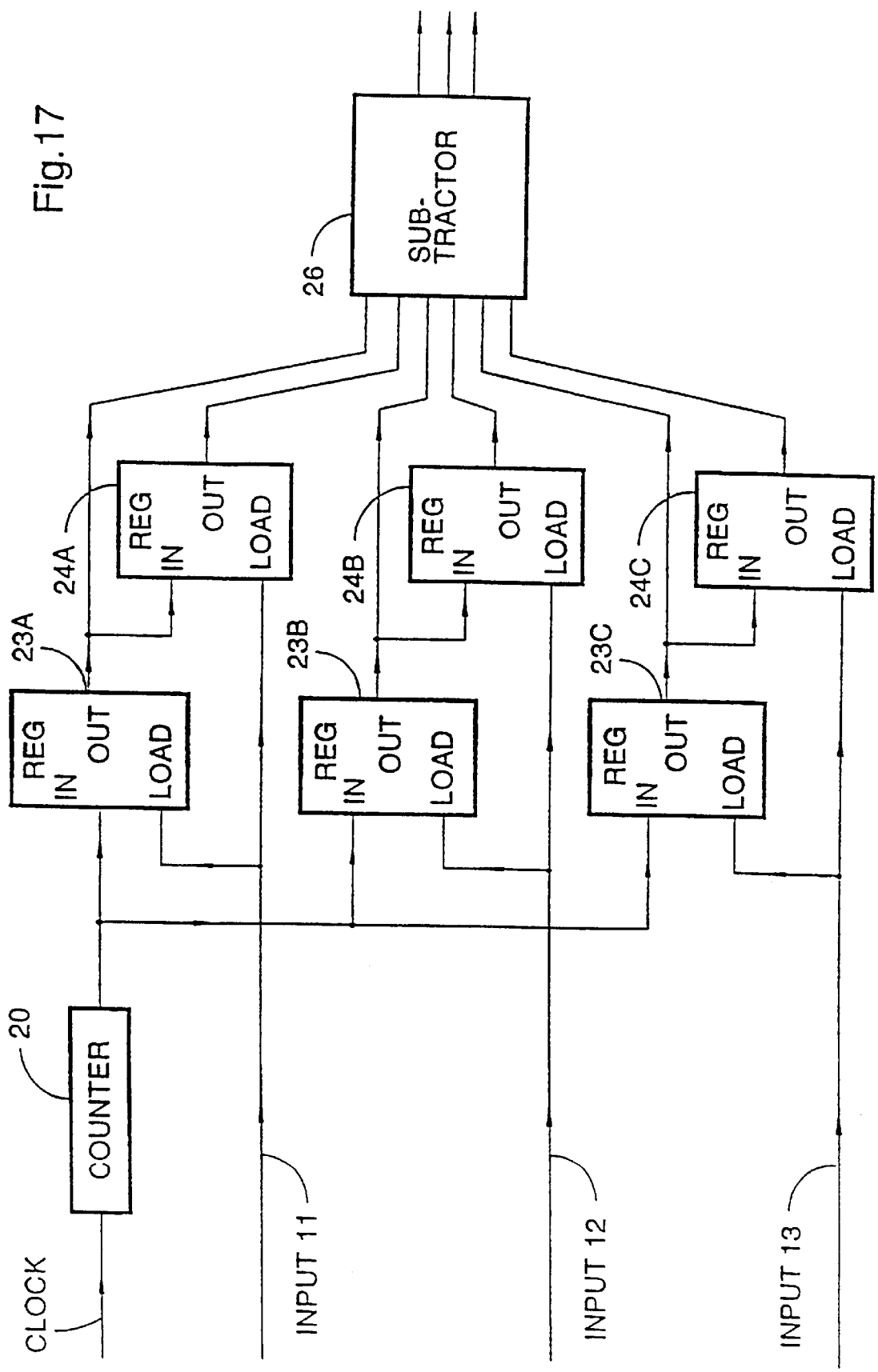
FIG. 17 is a schematic block diagram of a frequency detector according to a preferred embodiment of the second aspect of the invention.

FIG. 17 is a schematic block diagram of a frequency detector according to a preferred embodiment of the second aspect of the invention. The block diagram of FIG. 17 is similar to that of FIG. 16 except for the subtractor arrangement. A single subtractor unit 26 is used. The first and second registers of the frequency detector can be viewed as three register pairs. Each register pair comprises an individual second register and its updated associated first register. The subtractor unit 26 reads the counter values of each one of the register pairs for subtracting, for each register pair, the counter values of the register pair to generate a respective second difference value representative of the frequency of the input signal that is associated with the register pair.

In general, the frequency detector is responsive to a predetermined number, K, of input signals, where K is a positive integer. Accordingly, the frequency detector comprises K first registers, K second registers, and at least one subtracting unit.

The frequency determination according to the second aspect of the invention is performed with consideration taken to measurement effecting wraps in the same manner as described above in connection with the frequency determining properties of the phase detector according to the first aspect of the invention.

Furthermore, in another embodiment of the second aspect of the invention, the second detector means described in connection with FIG. 9 is included in the frequency detector to supervise the presence of input signals at the frequency detector inputs.

Figure 18:
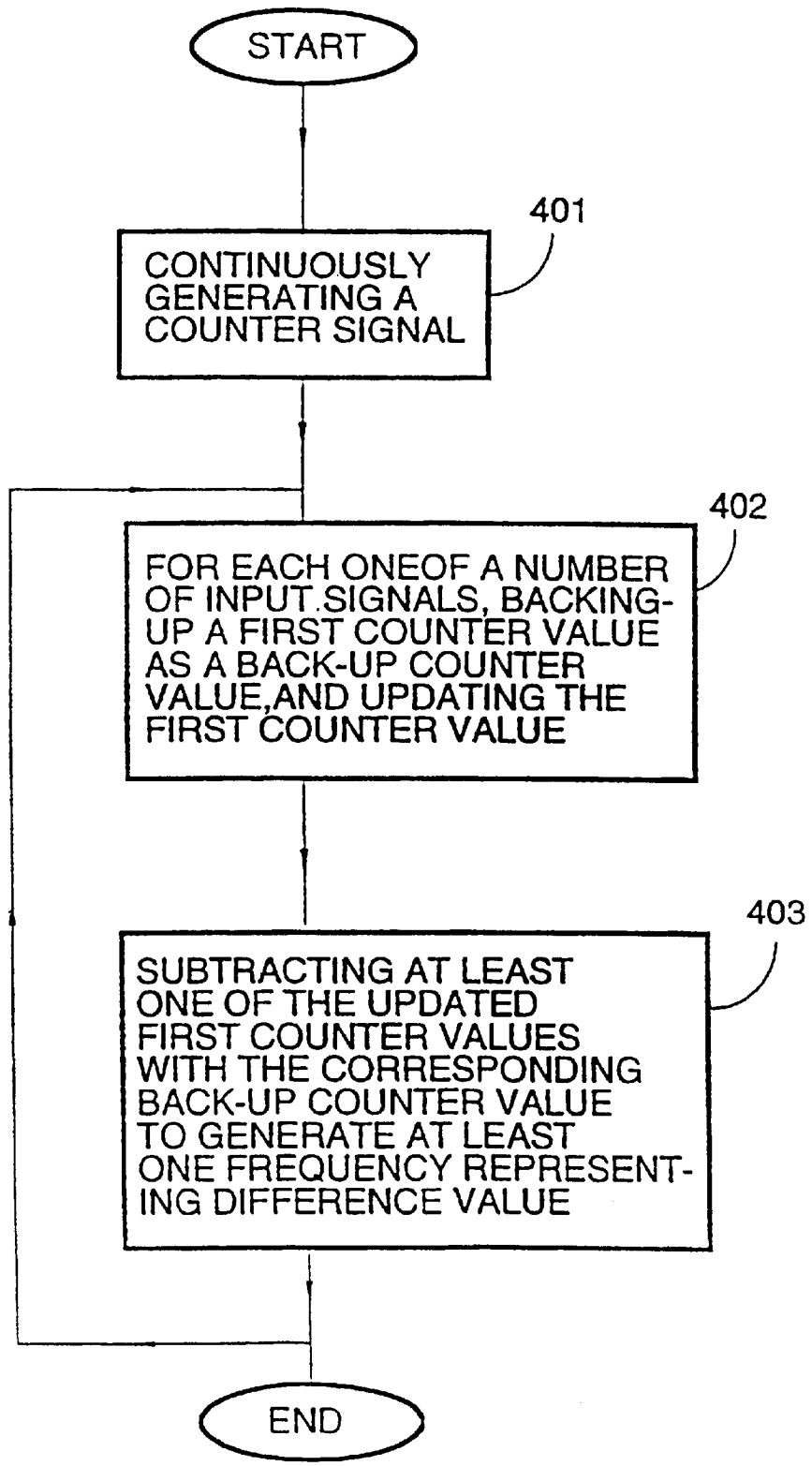
FIG. 18 is a schematic flow diagram illustrating a method for measuring a frequency of each one of a predetermined number, K, of input signals in accordance with the invention.

FIG. 18 is a schematic flow diagram illustrating a method for measuring a frequency of each one of a predetermined number, K, of input signals in accordance with the invention. K is a positive integer. In step 401 a counter signal is continuously generated in response to a second clock signal. The inventive method is described in progress. This means that first counter values and back-up counter values have already been stored. Step 402: for each one of the K input signals, a first counter value is backed-up as an updated back-up counter value, and subsequently the first counter value is updated by storing the current counter value of the counter signal as an updated first counter value. The backing-up and updating are performed in response to timing information carried by the respective input signal. Note that there is generally provided a delay between the backing-up and the updating. In step 403 at least one of the updated first counter values is subtracted with the corresponding back-up counter value so as to generate at least one difference value representative of the frequency of the input signal that is associated with the updated first counter value and its corresponding back-up counter value.

In general, each individual first counter value is continuously updated, the updating being preceded by a corresponding back-up, and the subtraction of step 403 is repeated continuously, or as determined by the phase detector operator, so that the new first and back-up counter values are considered when determining the frequency. Besides, to a certain degree, the steps 401–403 can be executed in parallel.

Example of a Preferred Embodiment of a Phase Detector

Figure 19:
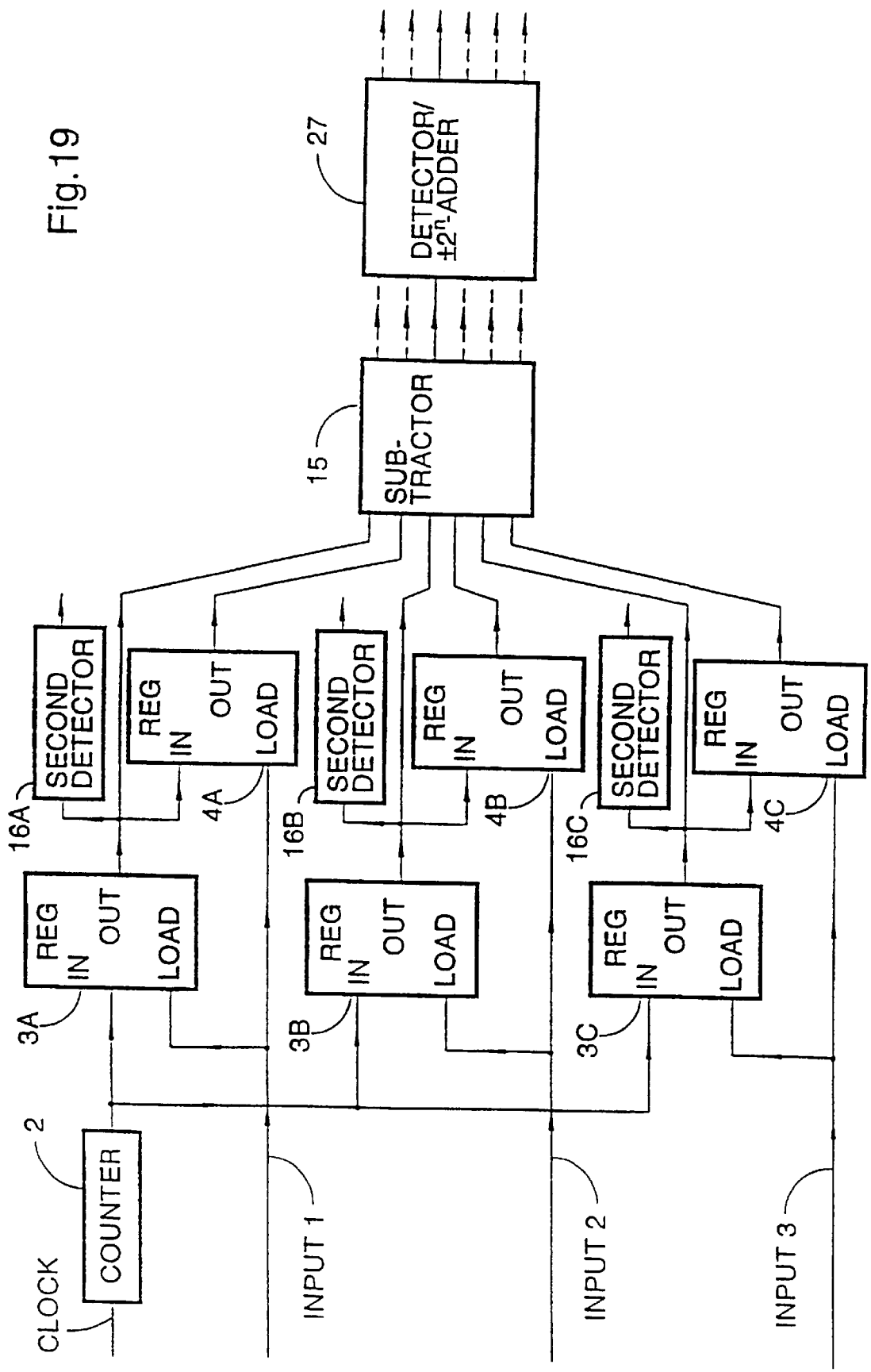
FIG. 19 is a schematic block diagram of a phase detector according to a preferred embodiment of the first aspect of the invention.

FIG. 19 is a schematic block diagram of a phase detector according to a preferred embodiment of the first aspect of the invention. The phase detector is responsive to three input signals INPUT 1, INPUT 2, INPUT 3. The phase detector comprises a counter 2, first registers 3A–C, second registers 4A–C, second detectors 16A–C, a main subtractor unit 15 and a main detector/$\pm 2^n$-adder 27. The general function of all the components of the phase detector have been described above in connection with the different embodiments of the first aspect of the invention. The counter 2 generates a counter signal in response to a first clock signal, CLOCK. The counter 2 counts the clock pulses of the first clock signal. Each one of the first registers 3A–C is responsive to the counter signal of the counter 2 and a respective one of the input signals for updating the first counter value of the first register generally in response to timing information carried by the input signal. Each one of the second registers 4A–C is responsive to the first counter value of the corresponding one of the first registers 3A–3C, and a respective one of the input signals for storing the first counter value of the first register, prior to the updating of the first counter value, as a back-up counter value in response to the timing information carried by the input signal.

The second detectors 16A–C detects, for at least one of the phase detector inputs, whether there is an input signal on the particular phase detector input. Preferably, the second detectors 16A–C are integrated into a single second detection means (not shown). For each one of a set comprising a predetermined number, S, of first registers, this detection is accomplished by checking whether the first counter value currently stored in the first register is equal to a comparison value, which is representative of the preceding first counter value of the first register and which has been previously stored in the second detection means. If an equal to condition is detected, then a no signal indication is generated. A no signal indication generally means that there is no input signal present at the phase detector input that is associated with the particular first register. The comparison value is updated, after the detection, by storing the first counter value of the first register in the second detection means in response to a recurrent load signal.

The main subtractor 15 is responsive to the first counter values and the back-up counter values to generate at least one phase difference representing first difference value and possibly at least one frequency representing second difference value. The detector/±$2^n$-adder 27 detects, for each difference value, first difference value as well as second difference value, whether the absolute value of the difference value is greater than the counter interval divided by two, i.e. $2^n/2$. Moreover, the detector/±$2^n$-adder 27 detects, for each first difference value, whether the first difference value is positive or negative. For each first difference value, when a greater than condition is detected and the first difference value is negative, a value, representative of the counter interval or counter range, $2^n$, is added to the respective first difference value to generate a new corrected first difference value. For each first difference value, when a greater than condition and a positive condition are detected, a value, representative of the counter interval or counter range, $2^n$, is subtracted from the first difference value to generate a new corrected first difference value. Hence, the updated/corrected first difference value is determined with consideration taken to measurement effecting wrap situations. For each second difference value, when a greater than condition is detected, a value, representative of the counter interval or counter range, $2^n$, is added to the respective second difference value to generate a new corrected/updated second difference value.

Conventional signal comparators can be used for realizing the detector part of the detector/±$2^n$-adder 27. The subtractor 15 as well as the ±$2^n$-adder part of the detector/±$2^n$-adder 27 are possible to implement with standard hardware components.

Preferably, however, the detector/±$2^n$-adder 27 and the subtractor 15 are implemented in software executing in a microprocessor (not shown in FIG. 19). Thus, the first counter values and the back-up counter values are read by the microprocessor and processed by the software.

The phase detector is thus capable of providing the phase detector operator or the manager of the technical system in which the phase detector is used, with information about phase differences, frequencies and the presence and/or absence of input signals.

Figure 20:
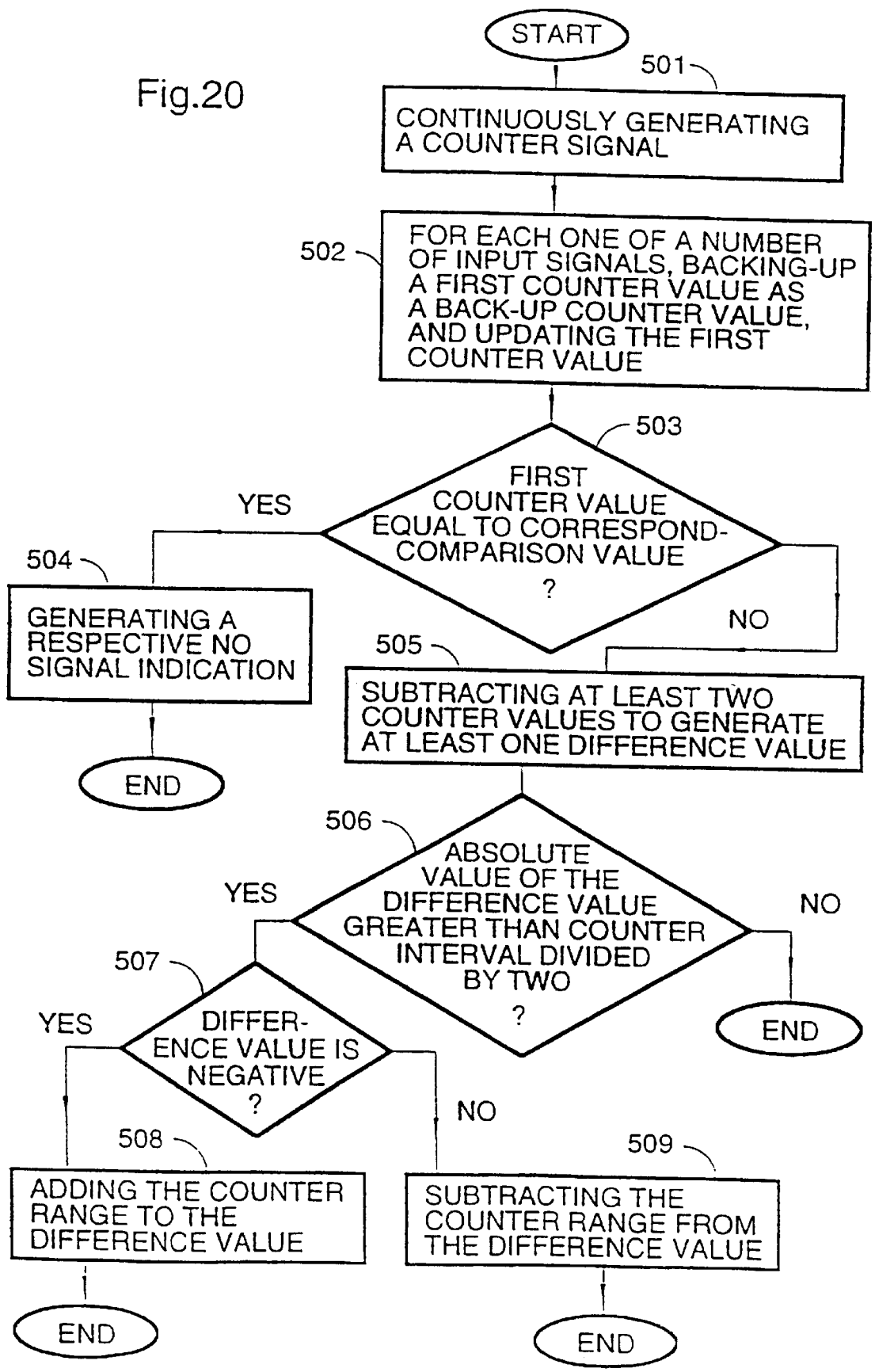
FIG. 20 is a schematic flow diagram of a method for measuring a respective phase difference between at least one pair of a predetermined number, K, of input signals in accordance with the first aspect of the invention.

For a better understanding of the first aspect of the invention, a schematic flow diagram of a method for measuring a respective phase difference between at least one pair of a predetermined number, K, of input signals is illustrated in FIG. 20. K is a positive integer. In step 501 a counter signal is continuously generated in response to a first clock signal. The inventive method is described in progress, assuming that first counter values and back-up counter values already have been stored. In step 502, a first counter value is backed-up as a back-up counter value and the first counter value is updated, for each one of the K input signals. The backing-up and updating are performed in response to timing information carried by the respective input signal. There is generally provided a delay between the backing-up and the updating. In step 503 an equality test is performed for at least one individual updated first counter value and a corresponding comparison value. The corresponding comparison value is representative of the preceding first counter value. If the updated first counter value is equal to the corresponding comparison value (YES), then a no signal indication is generated (step 504). After the equality test, the comparison value is updated in response to a recurrent load signal, by storing the current first counter value as a new updated comparison value. If the updated first counter value is not equal to the corresponding comparison value (NO), step 505 will be performed. Assume, by way of example, that there still remains a number of input signals. In step 505, at least two of the counter values that are associated with the remaining present input signals, are subtracted, in pairs, with each other so as to generate at least one difference value. The difference value is generally representative of a difference in phase between a respective pair of the K input signals. If there is generated more than one difference value, then each difference value will be representative of an individual pair of input signals. In step 506, a second test is performed for each difference value to detect when the absolute value of the difference value is greater than the counter interval divided by two, i.e. $2^n/2$. If no greater than condition is detected (NO) then the difference value determined in step 505 remains unchanged. When a greater than condition is detected (YES), a third test is performed in step 507 to detect whether the difference value is negative. When, the difference value is negative (YES), a value, representative of the counter interval or counter range, $2^n$, is added to the respective difference value to generate a new difference value (step 508). When, the difference value is not negative (NO), i.e. positive, a value, representative of the counter interval or counter range, $2^n$, is subtracted from the respective difference value to generate a new difference value (step 509). The tests of step 506 and 507 together with either one of the steps 508 and 509 assures that measurement effecting wraps are taken into account.

In general, each individual first counter value is continuously updated in response to the recurrent timing information, each updating being preceded by a corresponding back-up, so that new first and back-up counter values will be considered. The test of step 503, possibly step 504, the subtraction of step 505, the test of step 506 and 507, and possibly step 508 or 509 are also repeated continuously, or as determined by the operator of the phase detector and the software thereof in particular.

The order of the steps 501–509 can be changed. For instance, with suitable modifications step 506 and 507 can change places.

To a certain degree, the steps 501–509 can be executed in parallel.

In an alternative embodiment, step 503 is omitted.

In the method for measuring frequency described in connection with FIG. 18 above, step 503, possibly step 504, and the steps 506–509 are incorporated with suitable modifications.

It is possible to utilize a counter which counts down from a maximum count to zero, makes a wrap and starts over again counting down from the max count. By making suitable modifications (a change of sign) that lie well within the capability of those of ordinary skill in the art such a counter can be used in all the embodiments of the invention. By way of example, the phase detector of FIG. 14 is modified so that the third detection means 18 makes a less than-detection instead of a greater than-detection and generates a respective enable signal when a less than-condition is detected, and each one of the three $2^n$-adders 9A, 9B, 9C add a negative value instead of a positive value (makes a subtraction), provided the respective enable signal is received.

Examples of High Resolution Realizations Although the Circuit Design is Subjected to Frequency Limiting Requirements In general, regarding both phase difference measurements and frequency measurements, there is a need for a high resolution accuracy, preferably as high as possible.

In the phase detector and/or the frequency detector according to the invention, the resolution accuracy is generally determined by the counter 2 and the frequency of the clock signal applied thereto. A high frequency will yield high resolution.

Figure 21:
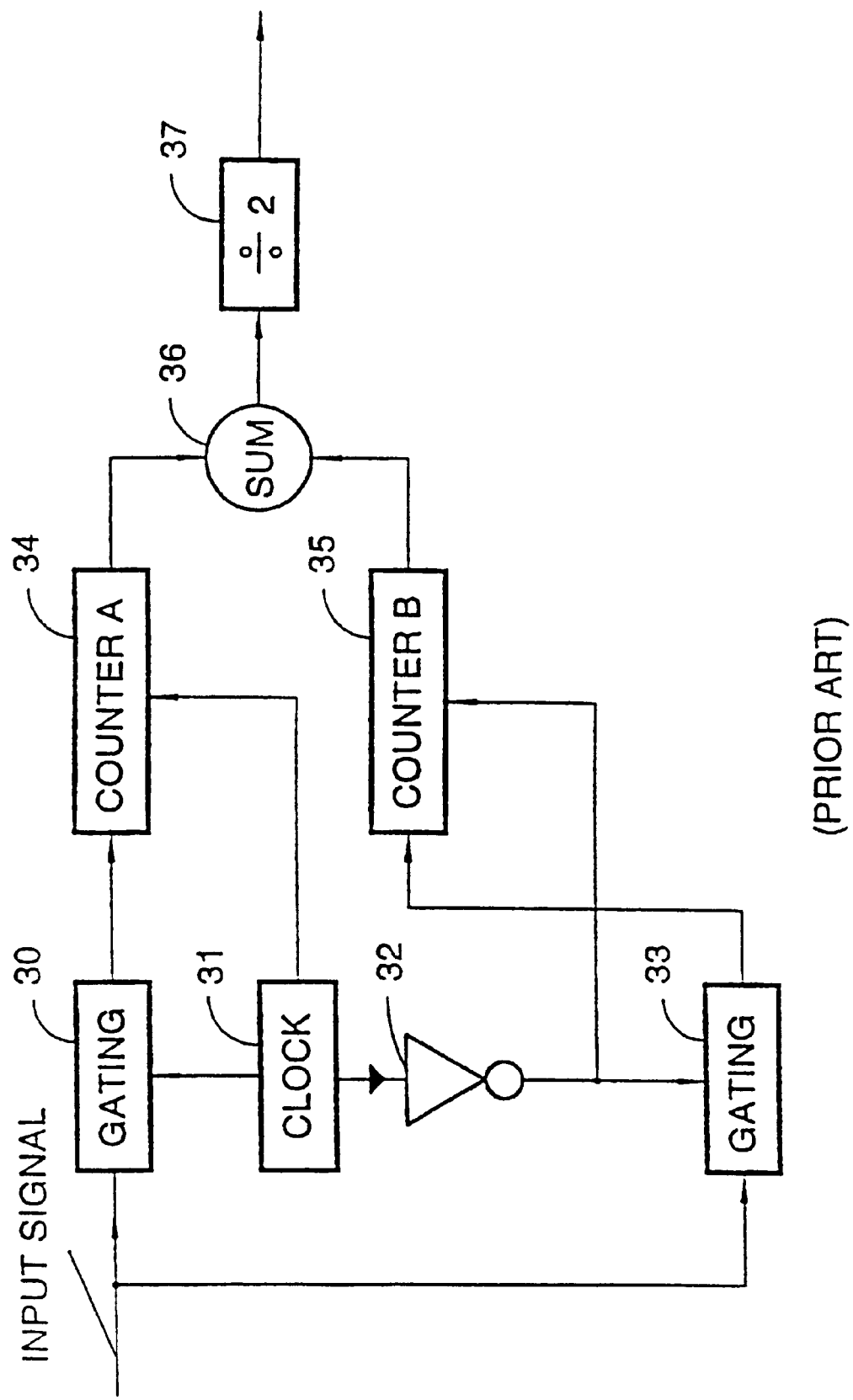
FIG. 21 is a schematic block diagram of a prior art frequency counter.

FIG. 21 is a block diagram of a frequency counter according to U.S. Pat. No. 5,097,490. The frequency of an input signal is counted in respect to the number of clock pulses that occur between either successive rising or falling edges of the input signal. A reference clock 31 supplies a gating circuit 30 and counter A, 34, with clock signals. The gating circuit 30 receives an input signal. Counter A, 34, receives, from the gating circuit 30, a signal that controls the period of time during which the counter A, 34, counts clock pulses. The clock signal from clock 31 is applied to an inverter 32, which provides an inverted clock signal. The inverted clock signal is supplied to another gating circuit 33 and to counter B, 35. The gating circuit 33 receives the same input signal as the gating circuit 30. Counter B, 35, receives a signal from the gating circuit 33 such that the gating circuit 33 controls the accumulation of inverted clock cycles by counter B, 35. The output signal of counter A, 34, is added to the output signal of counter B, 35, in a summing circuit 36. The total count is divided by two in a divide-by-two circuit 37.

U.S. Pat. No. 4,979,177 relates to a logic analyzer which has a counter that can reconstruct the higher resolution with which data was acquired using two phases of the logic analyzer system clock signal.

However, any technology available for realizing the counter core, i.e. the unit in a counter that actually registers the incoming pulses of a clock signal sets a limit to the highest frequency that can be applied or counted by counter core. Besides, additional requirements on the circuit design of the counter core within the chosen technology may lower this frequency limit. Unfortunately, very high frequency technologies generally imply high effective costs for the circuit design. Therefore it is of great interest to utilize the full frequency potential of a given technology, although there are frequency limiting design requirements on the counter core.

Assume, by way of example, that the counter core is to be implemented in a first predetermined technology, such as ASIC, and that there are quality requirements on the counter core such that the highest frequency that can be applied thereto is equal to a second frequency. The second frequency is lower than the highest frequency that can be used in the first technology without regard to quality requirements. For instance, if it is desirable to realize the counter core by scan testable flip-flops, then this requirement will set a limit to the highest clock frequency that is possible to use within the core.

Examples of a Counting Circuit to be Used in a Phase and/or Frequency Detector

Figure 22:
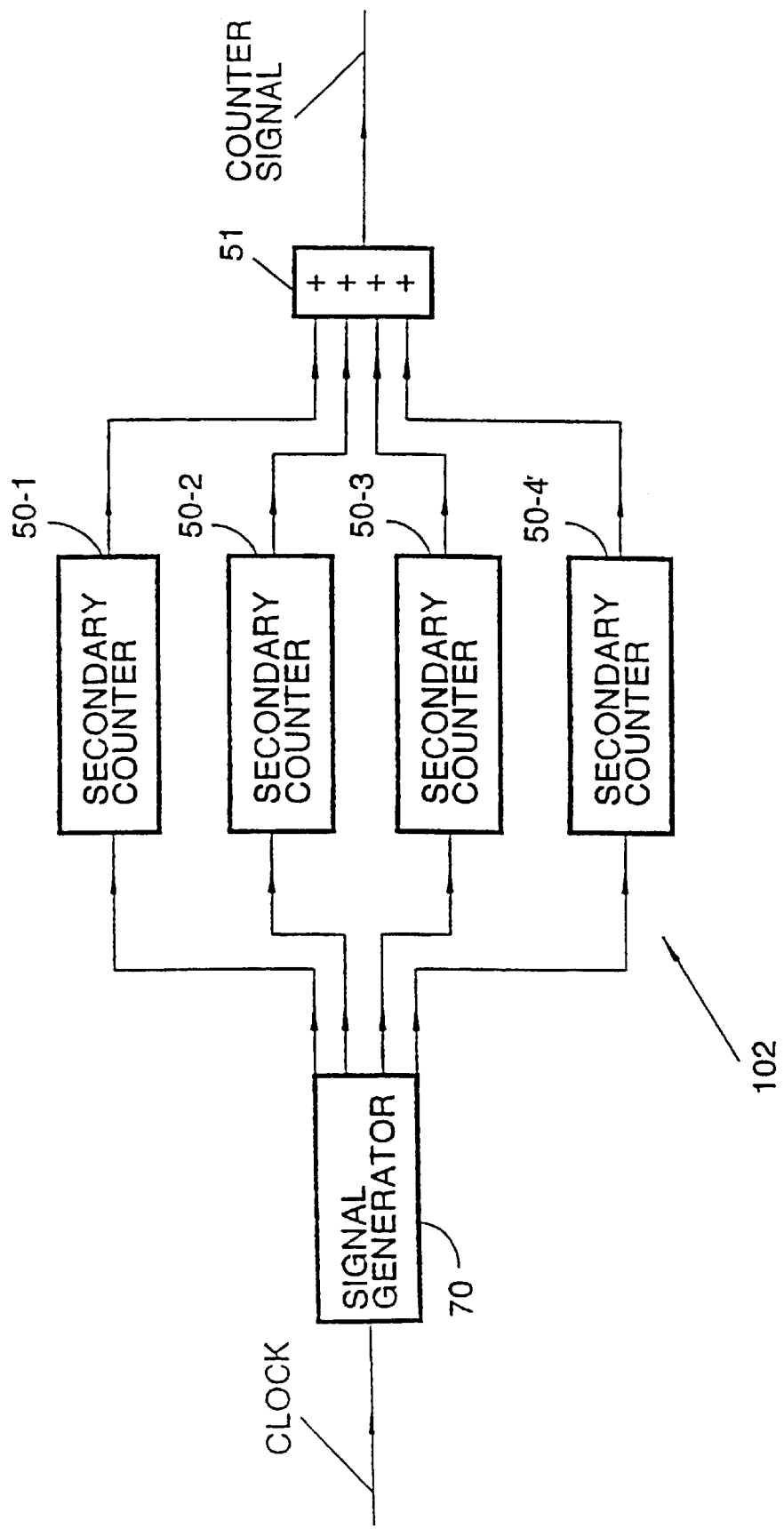
FIG. 22 is a schematic block diagram of a counter or counting circuit according to the invention.

FIG. 22 is a schematic block diagram of a counting circuit 102 according to the invention. The counting circuit 102 comprises a generator 70 for generating four second clock signals, four secondary counters 50-1, 50-2, 50-3, 50-4 and a summing circuit 51. The generator 70 generates, in response to a first clock signal having a first frequency, four second clock signals phase shifted with respect to each other and of a second frequency that is lower than the first frequency. Each one of the secondary counters 50-1, 50-2, 50-3, 50-4 is responsive to a respective one of the four second clock signals for generating an individual secondary counter signal. The counter core comprises the secondary counters. Preferably, the secondary counters are binary n-bits counters, implemented by scan testable flip-flops that are positive edge triggered. In this particular example, the use of scan testable flip-flops is an additional requirement within the chosen technology (ASIC) that sets a limit to the highest frequency that can be applied to the secondary counters. Assume that the first frequency is too high for scan testable flip-flops. The generator 70 is designed such as to generate the second clock signals with a second frequency that works well in the counter core. In this particular example, the second frequency is equal to the first frequency divided by two. The summing block or summing circuit 51 receives the secondary counter signals and generates the output counter signal of the counting circuit 102 by adding the secondary counter signals such that the counter value of the output counter signal has the same number of bits and the same significance as the counter value of the secondary counter signals.

The specific counting circuit of FIG. 22 is only given as an example. The number of second clock signals as well as the number of secondary counters may differ, as will be exemplified later.

The counting circuit 102 can be used to generate the counter signal in the different embodiments of the phase detector according to the first aspect of the invention and/or the frequency detector according to the second aspect of the invention.

Figure 23:
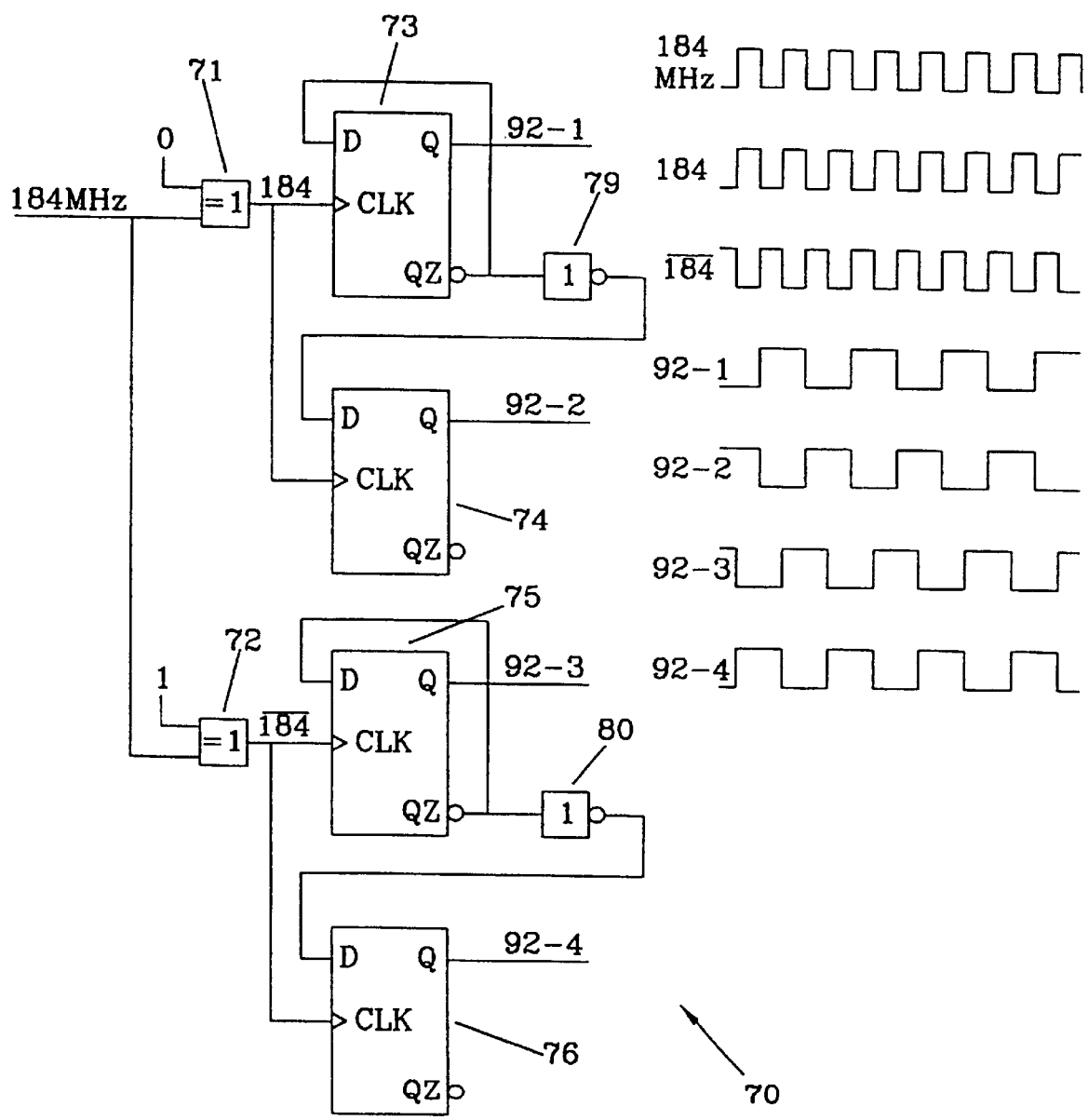
FIG. 23 is a schematic block diagram of a generator of second clock signals according to an embodiment of the invention.

FIG. 23 is a schematic block diagram of the generator 70 (shown in FIG. 22). In order to better understand the operation of the secondary counters it is advantageous to describe the operation of the generator 70. A practical implementation of the generator 70 comprises four D-flip-flops 73, 74, 75, 76, two XOR-gates 71, 72 and two inverters 79, 80 connected as shown in FIG. 23. The two XOR-gates 71 and 72 both receive the first clock signal. The first XOR-gate 71 also receives a zero, thus leaving the first clock signal unchanged. The second XOR-gate 72 receives a "1", thus inverting the first clock signal. The circuit solution with two XOR-gates 71, 72 is preferred, since the delay will be the same for both the non-inverted first clock signal, and the inverted first clock signal. The output signal from the first OR-gate 71 is sent to the clock input CLK of a first D-flip-flop 73 and to the clock input CLK of a second D-flip-flop 74. The first D-flip-flop 73 generates the second clock signal 92-1 on its Q-output. The output signal of the QZ-output of the first D-flip-flop 73 is fed back to the D-input of the first D-flip-flop 73. In addition, the QZ-output signal is inverted by the inverter 79 and sent into the D-input of the second D-flip-flop 74. The second D-flip-flop 74 generates the second clock signal 92-2 on its Q-output. Correspondingly, the output signal from the second OR-gate 72 is sent to the clock input CLK of a third D-flip-flop 75 and to the clock input CLK of a fourth D-flip-flop 76. The third D-flip-flop 75 generates the second clock signal 92-3 on its Q-output. The output signal of the QZ-output of the third D-flip-flop 75 is fed back to the D-input of the third D-flip-flop 75. In addition, the QZ-output signal is inverted by the inverter 80 and sent into the D-input of the fourth D-flip-flop 76. The fourth D-flip-flop 76 generates the second clock signal 92-4 on its Q-output.

The flip-flops of the generator 70 are not scan testable. Therefore, the first frequency can be applied to the generator 70. Hence, in this regard, a trade-off in the circuit design is made between maximum frequency and scan testability.

The generator 70 described above in connection with FIG. 23 is realized such that, the different D-flip-flops 73–76 will have the same load, assuring reliable operation of the generator 70.

An alternative and simpler solution is to use the QZ-output signal of the first D-flip-flop 73 and the QZ-output signal of the third D-flip-flop 75 to obtain the second clock signals 92-2 and 92-4, respectively. In this alternative embodiment, the second D-flip-flop 74 and the fourth D-flip-flop 76 are omitted. However, this solution requires control of the delays of the second clock signals.

It is important to understand that the circuitry of FIG. 23 only is an example of how to generate the second clock signals 92-1, 92-2, 92-3, 92-4.

FIG. 23 also shows an example of the first clock signal 184 MHz and the second clock signals 92-1, 92-2, 92-3, 92-4 appearing in the generator 70. In particular, the phases of the different second clock signals are illustrated in FIG. 23. The second clock signal 92-2 is an inverted version of 92-1, and the second clock signal 92-4 is an inverted version of 92-3. In addition, there is a phase difference of π/2 between 92-1 and 92-3, a phase difference of π/2 between 92-1 and 92-4, a phase difference of π/2 between 92-2 and 92-3, and a phase difference of π/2 between 92-2 and 92-4. In this particular example, the first clock signal has a frequency of 184 MHz and the second clock signals have a frequency equal to 92 MHz.

With reference to FIG. 22 once more, each secondary counter 50-1, 50-2, 50-3, 50-4 generates a secondary counter signal which has a running counter value that is stepped up by each cycle of the respective one of the second clock signals 92-1, 92-2, 92-3, 92-4. Each one of the secondary counters increments its counter value every time the respective second clock signal goes high. Each secondary counter signal has a secondary counter value of n bits, where n is a positive integer (1, 2, 3, . . . ).

In operation, the positive edge carried by 92-1 will step up the counter value of the secondary counter 50-1 associated with 92-1 at a first time instance. Next, at a second time instance separated 2.7 ns (the cycle time of the second clock signals divided by four) from the first time instance, the positive edge of 92-3 will step up the counter value of the secondary counter 50-3 associated with 92-3. At a third time instance, occurring 2.7 ns after the second time instance, the positive edge of 92-2 will step up the counter value of the secondary counter 50-2 associated with 92-2. 2.7 ns later, in relation to the third time instance, the positive edge of 92-4 will step up the counter value of the secondary counter 50-4 associated with 92-4. 2.7 ns after the stepping up of the secondary counter 50-4 associated with 92-4, the positive edge carried by 92-1 will once again step up the secondary counter 50-1 associated with 92-1, and so on. Each one of the secondary counters of the counting circuit 102 according to the invention, will be updated, but not at the same time, with a frequency equal to the second frequency. The second frequency is equal to 92 MHz in this particular example. Adding the four secondary counter values will result in a counter value updated with a frequency of 368 MHz (a resolution of 2.7 ns), because of the phase shift between the second clock signals. In general, the resulting counter value is updated with a frequency equal to M multiplied with the second frequency, where M is the number of second clock signals.

Figure 24:
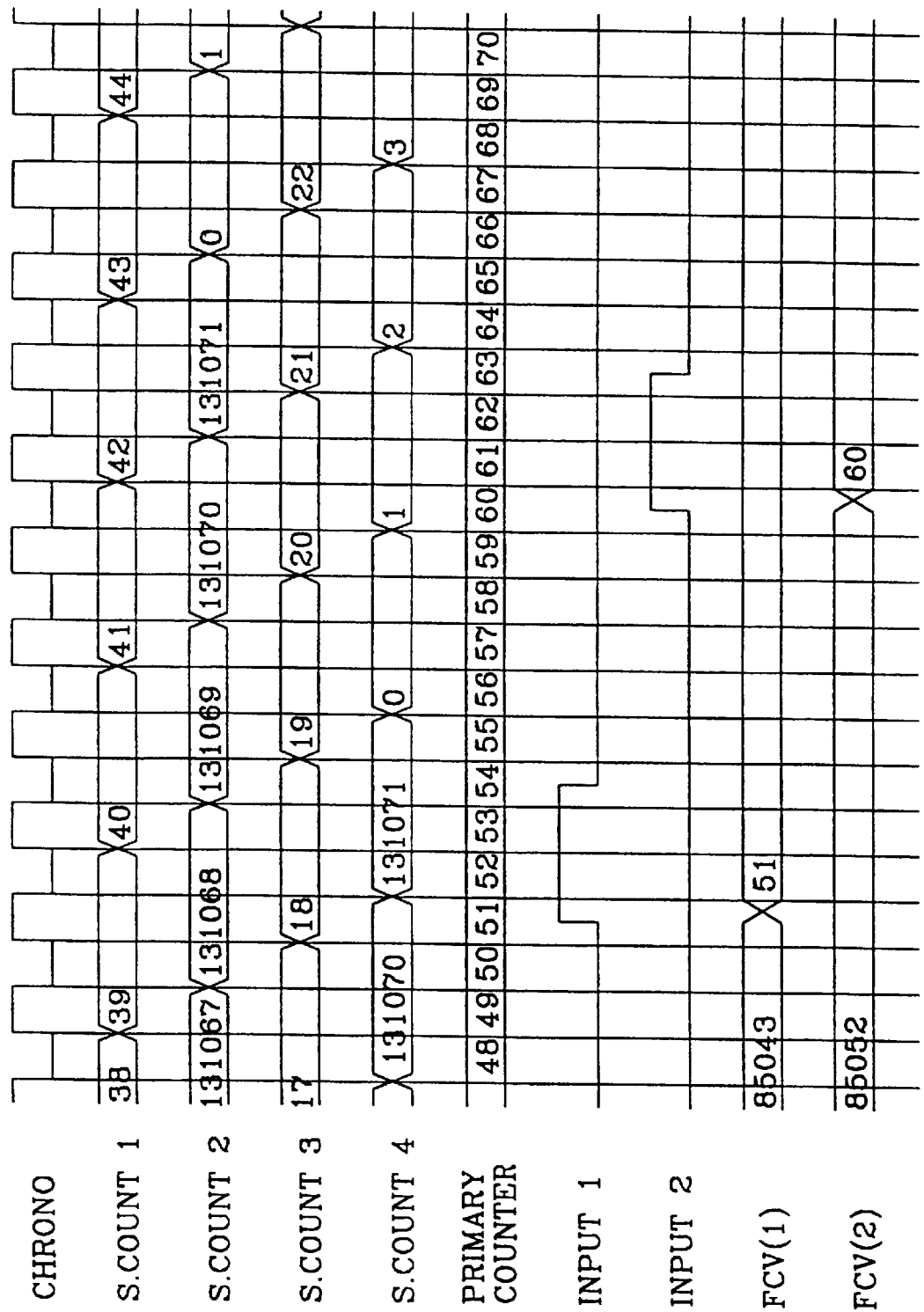
FIG. 24 is a timing diagram showing an example of some of the signals and counter values appearing in a phase detector according to the invention which includes the counting circuit of FIG. 22.

Reference is also made to FIG. 24, which is a timing diagram showing the first clock signal, the secondary counter values and the resulting counter value.

In this way a resolution equal to the cycle time of twice (2*184=368 MHz) the frequency of the first clock signal that is connected to the counter 102 is assured, even though the clock frequency itself is too high for direct use in the counter core, in particular when the secondary counters are implemented by scan testable flip-flops.

Other requirements on the circuit design of a counter may also set a limit to the frequency that is possible to use in, for instance, an ASIC.

FIG. 24 is a timing diagram showing an example of some of the signals and counter values appearing in a phase detector according to the invention which includes the inventive counting arrangement 102 described above in connection with FIG. 22. There is a periodic square wave first clock signal, CHRONO, which is sent into the counter 102. In this example, four second clock signals are generated in response to CHRONO. Each one of the second clock signals is sent to a respective secondary counter for generating a secondary counter signal or value. The four secondary counter signals S.COUNT 1, S.COUNT 2, S.COUNT 3, S.COUNT 4 are updated, at different time instances, with a frequency equal to the clock frequency divided by two. These four secondary counter signals are added to generate the primary counter signal. The counter value, PRIMARY COUNTER, of the primary counter signal is of the same number of bits and the same significance as the counter value of the secondary counter signals. Note, however, that in FIG. 24, all counter values are represented by decimal values. In operation, it is generally assumed that the generation of the primary counter signal is executed continuously over a plurality of clock cycles. Further-more, there is shown two input signals INPUT 1, INPUT 2 to the phase detector and their corresponding first counter values FCV(1) and FCV(2), respectively. The phase difference between INPUT1 and INPUT2, taking the most recently updated counter values into account, is equal to FCV(2)−FCV(1)= 60−51=9 cycles of a signal having a frequency equal to twice the frequency of the first clock signal. The resolution accuracy of the phase difference measurement is thus equal to the cycle time of a signal having a frequency twice the first clock frequency.

As noted above, the interrelationship in phase between the second clock signals is important. In the example of FIG. 23 the second clock signals are phase shifted with respect to each other. The second clock signals can be arranged in such an order that the phase difference between successive second clock signals is $\pi/2$. It is however important to understand that it does not matter which one of the second clock signals that is sent to which secondary counter. This means that the generator 70 of the second clock signals, and the D-flip-flops thereof in particular, does not have to be initialized.

Example of a First Variant of the Counting Circuit

If the second frequency, i.e. the first clock frequency divided by 2, still is too high for use in the counter core, i.e. the secondary counters, then the first clock signal can be divided into 8 clock signals (M=8) phase shifted $\pi/4$ and of a new second frequency that is equal to the first clock frequency divided by four. Since the resulting counter value is updated with a frequency equal to M multiplied with the second frequency, the number of secondary counters is also increased to 8, instead of just 4. In this way, the same high resulting resolution accuracy is maintained although the second frequency is reduced. The full frequency potential of the given technology is utilized at the same time as frequency limiting quality requirements on the counter core are fulfilled.

By way of example, a first clock signal of 184 MHz can be divided into 8 second clock signals of 46 MHz by further using the signals 92-1, 92-2, 92-3 and 92-4. The signal 92-1 is sent to a further D-flip-flop arrangement similar to that of FIG. 23 which comprises the components 73, 74, and 79, for generating two second clock signals. The signal 92-2 is sent to a further D-flip-flop arrangement similar to that of FIG. 23 which comprises the components 75, 76, and 80, for generating two second clock signals. Correspondingly, each one of the signals 92-3, 92-4 is also sent to a further stage so as to generate two second clock signals. Thus, a total of 8 second clock signals is generated. Each one of these 8 second clock signals is sent to a respective secondary counter which produces an individual secondary counter signal. All eight secondary counter signals are then sent to a summing block designed for adding eight binary values or signals.

Examples of Other Variants of the Counting Circuit

When, in some applications, it is desired to use only one edge of the first clock signal, then, by way of example, the first clock signal is divided into two second clock signals of a second frequency equal to half of the first clock frequency; such as 92-1 and 92-2. In this example, each one of the two second clock signals (M=2) is sent to a respective secondary counter which generates a secondary counter signal in response to the second clock signal. The two secondary counter signals are added in a summing circuit so as to generate the counter signal of the counting circuit.

Provided that only one edge of the first clock signal is used, it is also possible to divide the first clock signal into three second clock signals (M=3) of a second frequency that is equal to the clock frequency divided by three. The three second clock signals are phase shifted $(2\pi)/3$ with respect to each other. Each one of the second clock signals is sent to a respective secondary counter, and the output signals from the secondary counters are sent to a summing circuit for generating a counter signal, the counter value of which has the same number of bits and the same significance as the counter value of the secondary counters.

FIG. 25 is a schematic block diagram of a generator 170 of three second clock signals according to the invention. The generator 170 is responsive to a clock signal CLOCK for generating three second clock signals of a second frequency that is lower than the CLOCK frequency. In this particular example, the CLOCK signal has a frequency of 184 MHz and the second clock signals have a frequency equal to 184/3 MHz. FIG. 25 also shows an example of the signals appearing in the generator 170.

The generator 170 comprises a first AND-gate 171, a first D-flip-flop 172, a second AND-gate 173 and a second D-flip-flop 174. Each one of the D-flip-flops 172, 174 receives the CLOCK signal at its clock input CLK. The output of the first AND-gate 171 is connected to the D-input of the first D-flip-flop 172. The Q-output of the first D-flip-flop 172 is connected to the first input of the second AND-gate 173. The output of the second AND-gate is connected to the D-input of the second D-flip-flop 174. The QZ-output of the second D-flip-flop 174 is connected to both the second input of the first AND-gate 171 and the second input of the second AND-gate 173. Consider, the Q-output signal Q(FF1) of the first D-flip-flop 172, the Q-output signal Q(FF2) of the second D-flip-flop 174 and the QZ-output signal QZ(FF1) of the first D-flip-flop 172, all of which are illustrated in FIG. 25.

By sending a "1" into the first input of the first AND-gate 171, the output signals Q(FF1), Q(FF2) and QZ(FF1) will develop as is shown in FIG. 25. In this way, three second clock signals with different phases will be generated. Since only the positive edges are considered because of the positive edge triggered D-flip-flops in the secondary counters, the positive edges of the three second clock signals occur every third cycle of the CLOCK signal. This corresponds to the CLOCK frequency divided by three.

The D-flip-flops in the generator 170 are not scan testable.

In an alternative embodiment, the secondary counters are implemented by negative edge-triggered flip-flops.

By including a further stage, comprising an AND-gate and a D-flip-flop, between the first D-flip-flop 172 and the second AND-gate 173 in the circuitry of FIG. 25, four second clock signals (M=4) with different phases and of a second frequency equal to the clock frequency divided by four, will be generated. The QZ-output signal of the second D-flip-flop 174 of the final stage is distributed to the second input of the AND-gate of the further included stage. If yet a further stage, comprising an AND-gate and a D-flip-flop, is included in sequence between the first stage 171, 172 and the final stage 173, 174, five second clock signals (M=5) phase shifted with respect to each other and of a second frequency equal to the first clock frequency divided by five will be generated. By including even further stages, further second clock signals will be generated, and the second clock signals will have a frequency equal to the clock frequency divided by (J+1), where J is the number of stages.

In fact, irrespective of whether only one edge or both edges of the first clock signal is used, the general idea according to the invention is to generate M second clock signals phase shifted with respect to each other and of a second frequency that is lower than the frequency of the first clock signal. Each one of the second clock signals is sent to a respective one of M secondary counters. M is a positive integer greater than 1, (2, 3, 4, . . . ). The second frequency is equal to the frequency of the first clock signal divided by N, where N is a positive integer (1, 2, 3, . . . ), and adapted to work well in the utilized technology. Furthermore, there is a phase difference equal to $(2\pi)/M$ between at least two of the M second clock signals. In fact, when M is greater than 2 there is a phase difference equal to $(2\pi)/M$ between M pairs of the M second clock signals.

The generator of second clock signals can also be implemented in a second technology different from the first technology. By way of example, the generator of second clock signals can be realized in a second technology in which it is possible to divide a first clock signal of 368 MHz into 8 second clock signals phase shifted with respect to each other and of a second frequency equal to 92 MHz. By using 8 secondary counters and a summing circuit as described above, a resulting counter value that is updated with a frequency equal to 8*92=736 MHz is generated. The generator of second clock signals can be implemented in a second technology which is able of handling even higher first clock frequencies. Note that the complexity of the generator of second clock signals generally is smaller than that of a binary n-bits counter, in particular when n is greater than 10. The cost of realizing a generator of second clock signals in a high frequency technology is thus generally smaller than the cost of realizing a binary n-bits counter in the same high frequency technology.

The manner in which the secondary counter signals or values are added is important. At first, problems that may occur if the secondary counter signals are added in a careless manner will be described. Consider, by way of example and for reasons of simplicity, the addition of two secondary counter values, each one of 4 bits and associated with a respective second clock signal. Each one of the secondary counters counts from zero to 15. When the maximum count or counter value is reached, the next counter value will be zero and the counter sequence 0, 1, 2, . . . 15 starts over again.

a) If no initialization of each individual secondary counter is executed before activation, the following may happen:

Assume that initially the first secondary counter value is equal to 1 0 0 1 (decimal 9), and the second secondary counter value is equal to 1 1 1 1 (decimal 15). To the left, a binary representation is given, and to the right there is a decimal representation:

```
  1 1 1 1    (carry bits)
    1 0 0 1              9
    1 1 1 1             15
-----------------------------
  1 1 0 0 0             24
```

In the binary representation, the result of the addition is equal to 1 1 0 0 0 (decimal 24); a 5-bits value. Four bits can represent decimal values in the range 0 to 15, and five bits can represent decimal values in the range 0 to 31. Next, when the second secondary counter value is updated in response to its associated second clock signal, the second secondary counter value will be equal to 0 0 0 0 (decimal 0) since a wrap occurs. The first secondary counter value is still 1 0 0 1 since its second clock signal is phase shifted with respect to the second clock signal associated with the second secondary counter value. The resulting counter value, i.e. the result of the addition of 1 0 0 1 and 0 0 0 0 will be equal to 1 0 0 1 (decimal 9). Thus, in this case, the two successive resulting counter values will be 1 1 0 0 0 (decimal 24) and 1 0 0 1 (decimal 9). The resulting counter value will jump from one value to another one in an arbitrary manner. This is undesirable, since an evenly increasing number sequence, such as 0 0 0 0, 0 0 0 1, 0 0 1 0, 0 0 1 1, 0 1 0 0, . . . (in a binary representation) and 0, 1, 2, 3, 4, . . . (in a decimal representation), is required.

b) Even though each one of the two secondary counter values is initialized and set to zero before activation, problems may occur:

The resulting counter sequence will be 0, 1, 2, . . . , 29, 30, 15 in a decimal representation, and 0 0 0 0, 0 0 0 1, 0 0 1 0, . . . , 1 1 1 0 1, 1 1 1 1 0, 1 1 1 1 in a binary representation. The transition from 1 1 1 1 0 (decimal 30) to 1 1 1 1 (decimal 15) has to be solved by additional logic circuitry.

The most significant bit of the result of the addition between 1 0 0 1 and 1 1 1 1, i.e. the most significant bit of the 5-bits value 1 1 0 0 0 (decimal 24), is also the final or last carry bit of the addition. If the 4 least significant bits of the result of the addition of 1 0 0 1 and 1 1 1 1, are considered, a 4-bits value, 1 0 0 0 (8 in a decimal representation) will be obtained. Consequently, the two successive resulting counter values will be 1 0 0 0, i.e. a decimal 8, and 1 0 0 1, i.e. a decimal 9. Although this is an example of two successive resulting counter values, the principle or idea of considering the 4 least significant bits of the result of the addition is generally applicable.

The Summing and Implementations of the Slamming

According to the invention, in order to generate an evenly increasing number sequence without the need for initialization and additional logic circuitry, the secondary counter signals are preferably added such that the resulting counter value has the same number of bits and the same significance as the counter value of the secondary counter signals.

Preferably, the summing circuit 51, which adds the secondary counter signals, is implemented by using the known programming language VERILOG and the known synthesizing program SYNOPSIS. The synthesizing program SYNOPSIS transforms a program written in VERILOG language to gate network hardware, which executes the addition. Generally, the addition is executed in a parallel implementation. In a parallel implementation, the signals are added simultaneously.

If the summing circuit 51 receives M secondary counter signals of n bits each, then the gate network implementation comprises a gate network and an associated D-flip-flop for each one of the n bits. Making up a total of n gate networks and n D-flip-flops. No gate networks and associated D-flip-flops are provided for the final carry bits of the addition so that the result of the addition will have the same number of bits, i.e. n bits, and the same significance as the secondary counter signals.

In a parallel implementation, in which no gate networks and associated D-flip-flops are provided for the final carry bits of the addition, an addition of three 4-bits values will look like this:

```
  1 1 1      (carry bits)
  1 1 0 1             13
  1 0 1 1             11
  1 1 1 1             15
-----------------------------
  0 1 1 1              7
```

Alternatively, the adding is executed in sequence. Conventional circuits, such as 74-XX-83 which is a 4-bits adder, can be used. Several 4-bits units are connected to each other in a known manner so as to realize a n-bits adder. Several n-bits adders are used for realizing the summing block 51 if several secondary counter values are to be added. A first n-bits adder adds two binary values and outputs a result of n bits, but also a carry bit on its carry output. If more than two secondary counter values are to be added, then this carry bit is connected to the carry input of the next n-bits adder, otherwise the carry output is unconnected. In general, the carry output is always unconnected in the last adder stage, so that only the n-bits output signal of the last adder stage is considered. In this way, the final carry bit is discarded or forgotten.

In yet another embodiment of the invention, the summing block 51 generates the counter signal of the counter 102 by adding the secondary counter signals, taking all carry bits into account, and considering the x least significant bits of the result of the addition, where x is equal to the number of bits that the counter value of a secondary counter signal has. Consider the following example. Three 4-bits values are added in parallel with consideration taken to all carry bits:

```
  1 0 1 1 1    (carry bits)
    1 1 0 1              13
    1 0 1 1              11
    1 1 1 1              15
  ---------------------------
  1 0 0 1 1 1            39
```

In the binary representation, the result is a 6-bits value. A software realization is provided for considering the four least significant bits. Thus, the result will be 0 1 1 1; a value which has the same number of bits as the values that are added.

In another alternative embodiment, all the carry bits are taken into account in the adding, and then an AND-operation is executed between the result of the addition and a first binary value with the following properties:

a) the first binary value has the same number, z, of bits as the result of the addition;

b) each one of the x least significant bits is equal to "1", a binary one, where x is equal to the number of bits of an individual secondary counter value; and c) each one of the (z-x) most significant bits is equal to "0", a binary zero.

By way of example, assume that 3-bits secondary counter values have been added and that the result of the addition is a 4-bits value. Thus, z=4, x=3, z-x=1, and the first binary value will be 0 1 1 1.

By adding the secondary counter signals such that the counter value of the resulting counter signal will have the same number of bits and the same significance as the counter value of a secondary counter signal, the start value in the different secondary counters does not matter. There is no need to have the same start value in the secondary counters. Thus, no reset or initialization of the secondary counters is required, which is a clear advantage.

When the inventive counting circuit is included in the phase and/or frequency detector according to the present invention, events, i.e. the timing information carried by the input signals, are used for sampling the counting circuit. In other words, events are used for sampling a multiple phases arrangement.

In U.S. Pat. No. 4,979,177, the different phases are used for sampling the events.

Furthermore, the problem of having a clock frequency that is too high for available or utilized technology) taking specific quality requirements into account, is not encountered in U.S. Pat. No. 5,097,490 nor U.S. Pat. No. 4,979,177.

Figure 26:
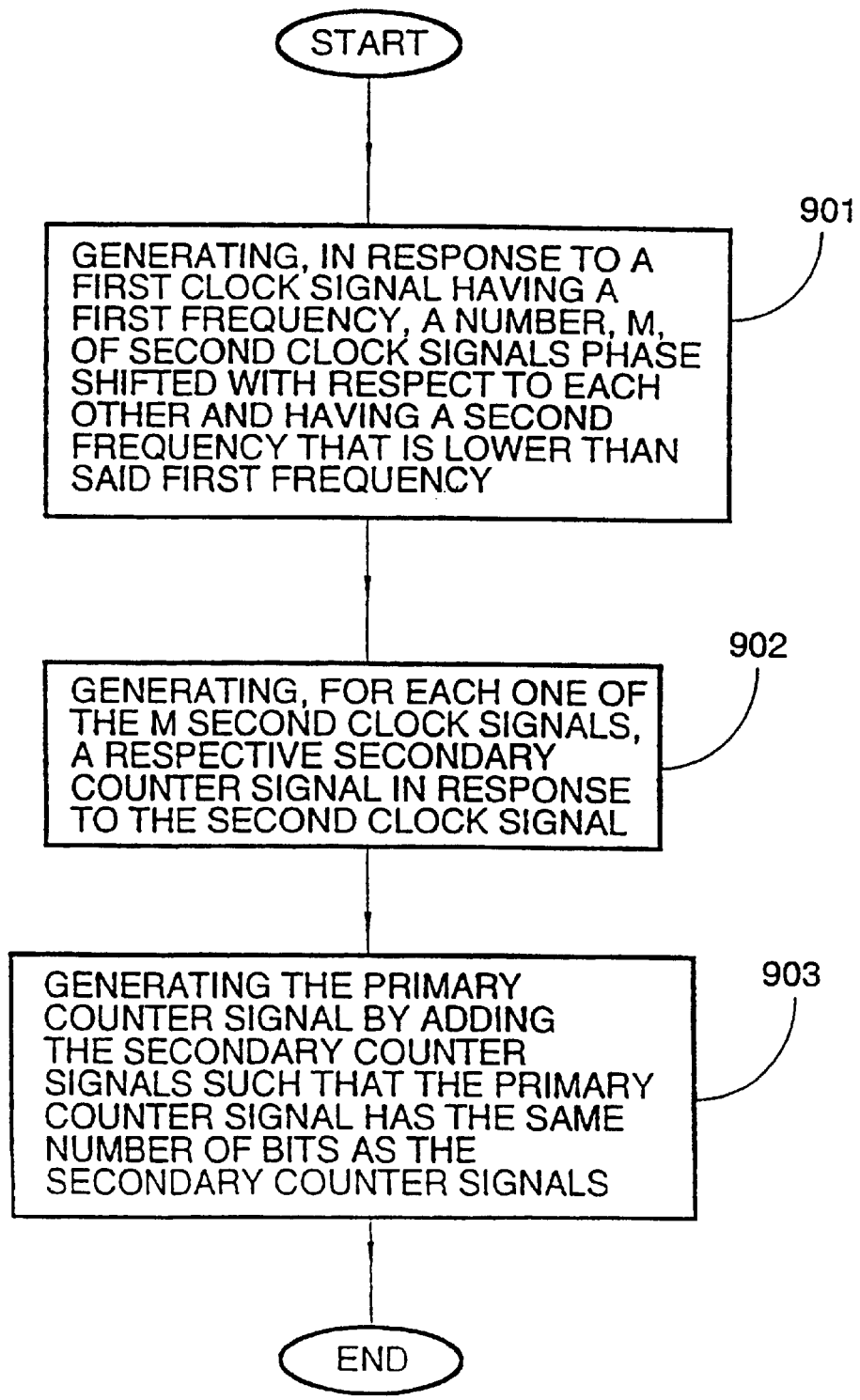
FIG. 26 is a schematic flow diagram of a method for generating a counter signal according to the invention.
Figure 27:
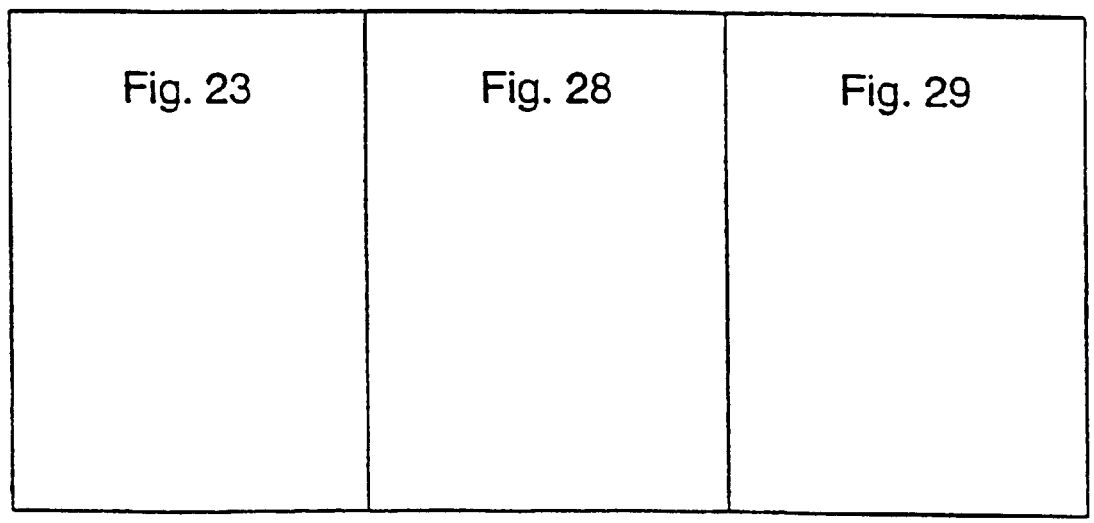
FIG. 27 is a schematic diagram illustrating how to arrange FIG. 23, FIG. 28 and FIG. 29, which all together form a schematic block diagram of a high resolution phase detector according to the invention.

FIG. 26 is a schematic flow diagram of a method for generating a counter signal according to the invention. In step 901, a predetermined number, M, of second clock signals are continuously generated in response to a first clock signal of a first frequency. The second clock signals are phase shifted with respect to each other and have a second frequency that is lower than the first frequency. In step 902, for each second clock signal, there is generated a respective secondary counter signal in response to the second clock signal. In step 903, the counter signal, the primary counter signal, is generated by adding the secondary counter signals or values such that the counter value of the primary counter signal will have the same number of bits and the same significance as the counter value of the secondary counter signals. Generally, the above steps are continuously repeated so as to continuously generate the primary counter signal. To a certain degree, the steps 901–903 are executed in parallel.

Alternative approach for providing a high resolution phase and/or frequency detector An alternative approach for providing high resolution phase difference and frequency measurements will be described below in connection with FIGS. 27 to 31.

Figure 28:
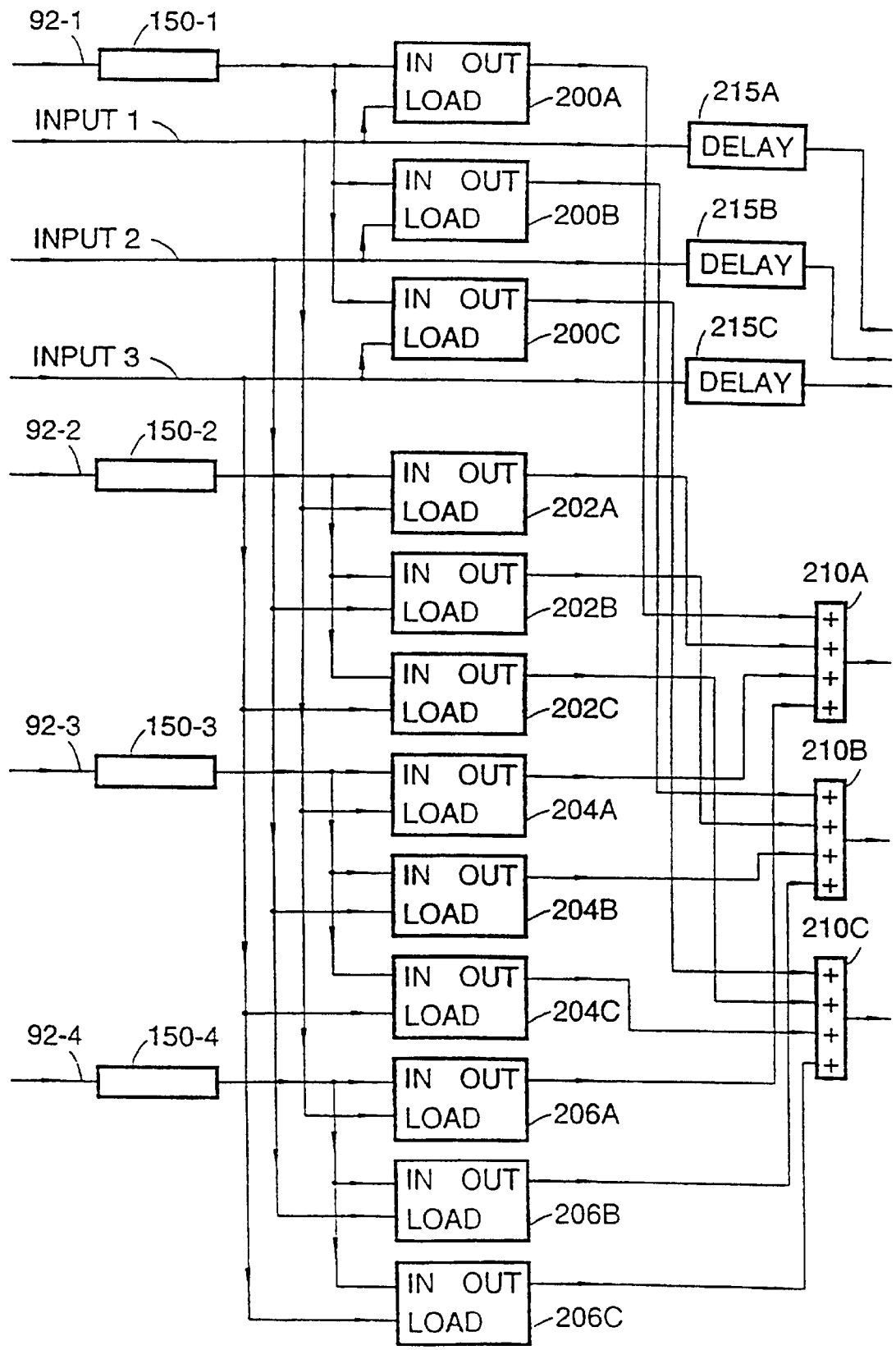
FIG. 28 is a schematic block diagram of parts of a high resolution phase and frequency detector according to the invention.
Figure 29:
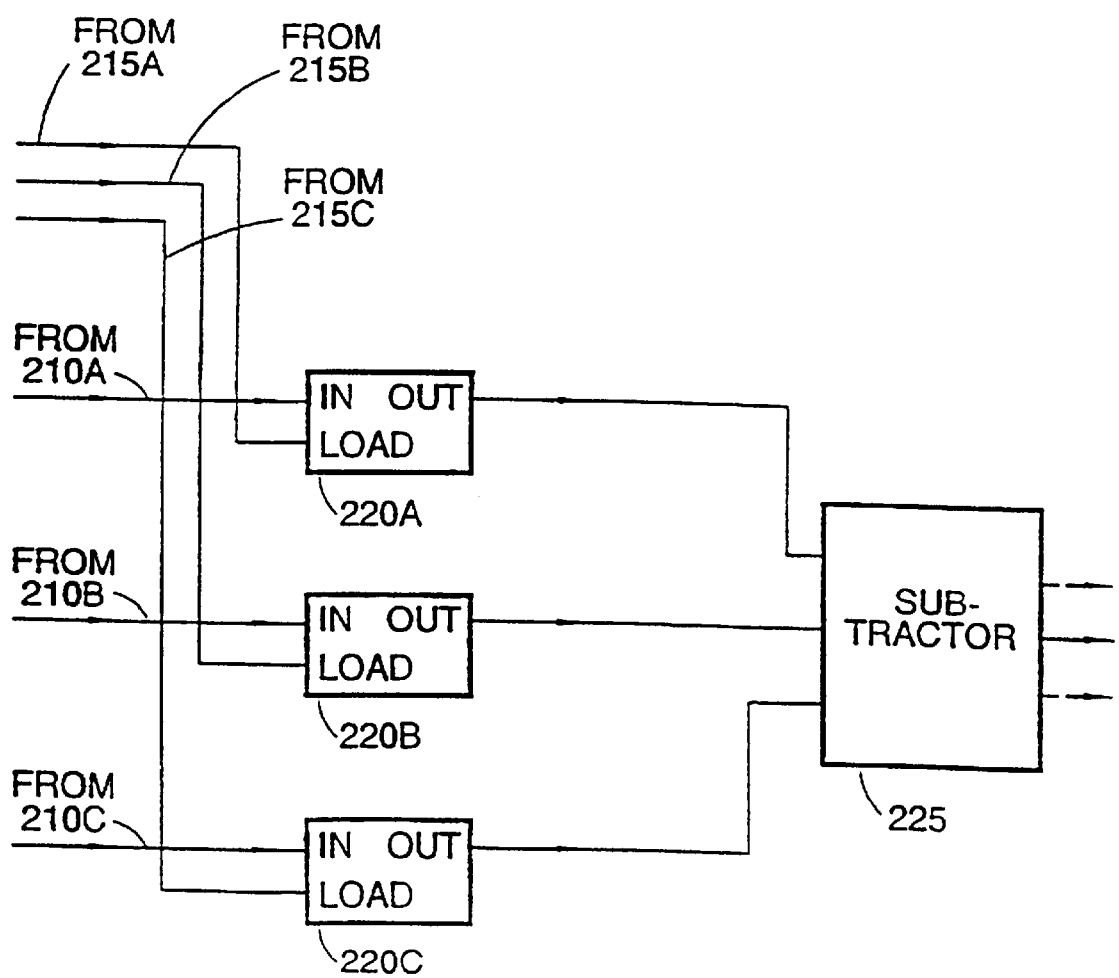
FIG. 29 is a schematic block diagram of parts of a high resolution phase detector according to the invention.

FIG. 23, FIG. 28 and FIG. 29 all together form a schematic block diagram of a high resolution phase detector according to the invention. FIG. 23, FIG. 28 and FIG. 29 should be arranged according to FIG. 27 for a proper reading of the block diagram. The high resolution phase detector receives three input signals INPUT 1, INPUT 2, INPUT 3 and a first clock signal. The phase detector comprises means 70 for generating four second clock signals, four secondary counters 150-1 to 150-4, 12 secondary registers 200A–C, 202A–C, 204A–C, 206A–C, three summing circuits 210A–C, three delay units 215A–C, three primary registers 220A–C and a subtractor unit 225. Possible practical implementations of the individual components have been described above.

The generator 70 has been described in detail above in connection with FIG. 23. In brief, the generator 70 is responsive to a first clock signal of a first frequency, 184 MHz in this particular example, for generating four second clock signals 92-1, 92-2, 92-3, 92-4 phase shifted with respect to each other, and of a second frequency, 92 MHz in this example. Note, that the second frequency is lower than the first frequency.

Each one of the four second clock signals is sent to a respective secondary counter (FIG. 28). With reference to FIG. 28, each one of the secondary counters generates a secondary counter signal. Furthermore, there are three secondary registers for each secondary counter. In particular, the secondary counter 150-1 is connected to the secondary registers 200A–C, the secondary counter 150-2 is connected to the secondary registers 202A–C, the secondary counter 150-3 is connected to the secondary registers 204A–C, and the secondary counter 150-4 is connected to the secondary registers 206A–C. Each secondary counter is connected to three secondary registers, referred to as its associated secondary registers, each of which is responsive to the secondary counter signal of the corresponding secondary counter, and a respective one of the K input signals for updating an individual secondary counter value by storing the current counter value of the secondary counter signal generally in response to timing information carried by the input signal. By way of example, the secondary register 200A receives the secondary counter signal of the secondary counter 150-1 on its in-input, and the input signal INPUT 1 on its load input. Every time the timing information carried by INPUT 1 appears at the load input of the secondary register 200A, the secondary counter value of 150-1 will be transferred into 200A.

Each summing circuit receives a respective group of secondary counter values that are associated with the same input signal, for generating a respective summed counter signal. The summing circuit 210A for instance, receives the secondary counter value from the secondary register 200A, the secondary counter value from 202A, the secondary counter value from 204A, and the secondary counter value from 206A. The secondary registers 200A, 202A, 204A and 206A are all associated with the same input signal, INPUT 1.

Each one of the delay units 215A–C receives a respective input signal for delaying that input signal. The delay of each delay unit corresponds to the time required for the summing executed by the respective one of the summing circuits.

With reference to FIG. 29, there are three first primary registers 220A–C. Each one of the first primary registers is responsive to a respective one of the summed counter signals, and a respective one of the delayed input signals for updating an individual primary counter value by storing the current counter value of the summed counter signal generally in response to timing information carried by the respective delayed input signal. By way of example, the first primary register 220A receives the summed counter signal of the summing circuit 210A on its in-input, and the delayed input signal INPUT 1 on its load input. Every time the delayed timing information carried by INPUT 1 appears at the load input of 220A, the summed counter value of 210A will be transferred to 220A.

The subtractor 225 makes read-outs of the primary counter values to generate at least one first difference value representing a phase difference between a respective pair of the input signals INPUT 1, INPUT 2 and INPUT 3. If, by way of example, it is desired to measure the phase difference between INPUT 1 and INPUT 3, then the primary counter values associated with these input signals are read by the subtractor 225 and subtracted with each other.

The phase difference determination is performed with consideration taken to measurement effecting wraps in the same manner as described above in connection with FIG. 8.

Figure 31:
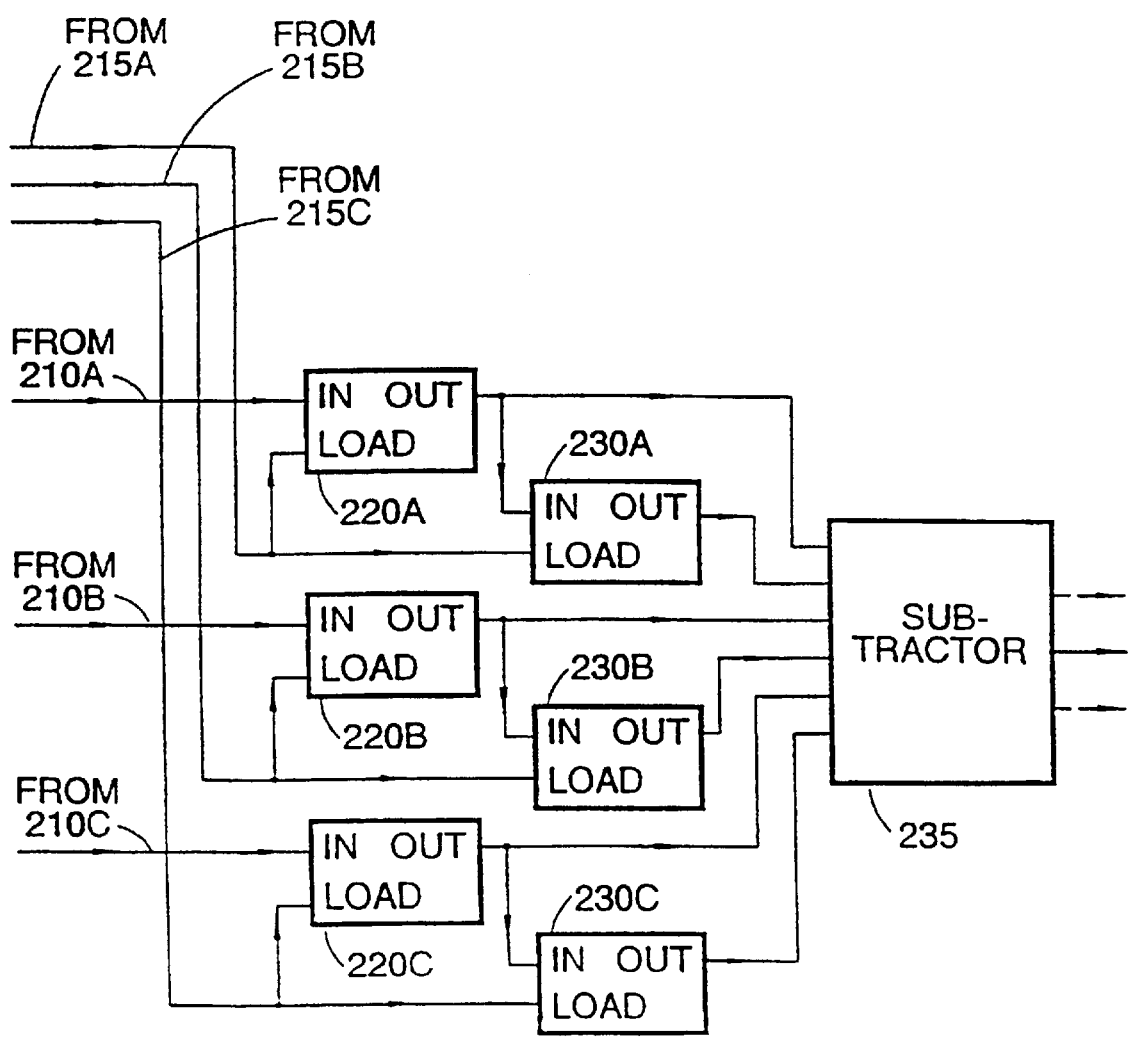
FIG. 31 is a schematic block diagram of parts of a high resolution frequency detector according to the invention.

FIG. 23, FIG. 28 and FIG. 31 all together form a schematic block diagram of a high resolution frequency detector according to the invention. FIG. 23, FIG. 28 and FIG. 31 should be arranged according to FIG. 30 for a proper reading of the block diagram. The high resolution frequency detector receives three input signals INPUT 1, INPUT 2, INPUT 3 and a first clock signal. The phase detector comprises means 70 for generating four second clock signals, four secondary counters 150-1 to 150-4, 12 secondary registers 200A–C, 202A–C, 204A–C, 206A–C, three summing circuits 210A–C, three delay units 215A–C, three first primary registers 220A–C, three second primary registers 230A–C, and a subtractor unit 235. Possible practical implementations of the components have been described above. The main difference between the phase detector of FIG. 23, FIG. 28 and FIG. 29 and the frequency detector of FIG. 23, FIG. 28 and FIG. 31 is the additional second primary registers 230A–C and the subtractor 235 illustrated in FIG. 31. The operation of the components shown in FIG. 23 and FIG. 28 have already been described above in connection with the high resolution phase detector, and will not be described again.

With reference to FIG. 31, three second primary registers are provided in the frequency detector. Each one of the second primary registers is connected to a respective one, referred to as its associated first primary register, of the first primary registers, and is responsive to the primary counter value of its associated first primary register and to the same one of the delayed input signals as that of its associated first primary register for backing-up, prior to the updating, the primary counter value as a back-up counter value, in response to the timing information carried by the delayed input signal.

The subtractor 235 makes read-outs of the primary counter values of each register pair that comprises an individual second primary register and its associated updated first primary register, for subtracting, for each register pair, the primary counter values of the register pair to generate a respective difference value representative of the frequency of the input signal that is associated with the register pair.

The frequency determination is performed with consideration taken to measurement effecting wraps in the same manner as described above in connection with the frequency determining properties of the phase detector according to the first aspect of the invention.

In this alternative approach of providing high resolution phase difference and frequency measurements the adding executed by the summing circuits 210A–C is less time critical since the adding only have to be executed in connection with the sampling of the respective summing circuit output signal.

The phase detector according to FIG. 23, FIG. 28 and FIG. 29, as well as the frequency detector according to FIG. 23, FIG. 28 and FIG. 31 have been described in the specific context of three input signals and four second clock signals. It is obvious that this number of input signals and this number of second clock signals are not intended to limit the scope of the invention.

In general, there are K input signals, and M second clock signals. M is a positive integer greater than 1. For the phase detector, K is a positive integer greater than 1. For the frequency detector, K is a positive integer greater than zero.

In the general form of the phase detector, there are M secondary counters, K secondary registers for each secondary counter, K delay units, K summing circuits, K first primary registers and a subtractor.

In the general form of the frequency detector, there are M secondary counters, K secondary registers for each secondary counter, K delay units, K summing circuits, K first primary registers, K second primary registers and a subtractor.

Regarding both the phase detector according to FIGS. 23, 28 and 29 and the frequency detector according to FIGS. 23, 28 and 31, by implementing a hold function in each primary register, the counter values of the primary registers will originate from the same time instance. Another solution is to have associated "shadow" registers with a hold function so that the counter values can be frozen until all registers of interest have been read.

Alternatively, the subtractor 225, in the form of a microprocessor, fetches all the counter values at the same time via a data bus. Thus, there is no need for the primary registers 220A–C and the delay units 215A–C. According to this alternative embodiment, the delay units 215A–C and the primary registers 220A–C are omitted, and the output signal of each one of the summing circuits 210A–C is sent directly to the subtractor 225 via the data bus.

The embodiments described above are merely given as examples, and it should be understood that the present invention is not limited thereto. It is of course possible to embody the invention in specific forms other than those described without departing from the spirit of the invention. Further modifications and improvements which retain the basic underlying principles disclosed and claimed herein are within the scope and spirit of the invention.

What is claimed is:

1. A phase detector responsive to a predetermined number, K, of input signals, where K is a positive integer greater than 1, said phase detector comprising:
   a counter responsive to a clock signal for generating a counter signal which represents a running counter value in a counter sequence, wherein said counter makes a wrap at the end of said counter sequence and starts over again from the beginning of said counter sequence;
   K first registers, each one of said K first registers being responsive to said counter signal and a respective one of said K input signals for updating an individual first counter value by storing the current counter value of said counter signal in response to timing information carried by the respective input signal, a first subtractor responsive to at least two of said first counter values for generating at least one difference value representing a phase difference between a respective pair of said K input signals; and correction means for correcting for a difference value effecting wrap, by adding a positive/negative correction value to the difference value so as to generate a corrected difference value, or by adding said correction value to a first counter value, said corrected first counter value being used in generating the difference value.

2. A phase detector according to claim 1, wherein said counter sequence has a predetermined number of counter values, said number being referred to as the counter range, and wherein said correction means includes:

first means for detecting, for each difference value, whether the absolute value of the difference value is greater than the counter range divided by two and whether the difference value is positive or negative, and for adding, when a greater than-condition and a negative-condition are detected, a value representative of the counter range to the difference value so as to generate said corrected difference value, or for subtracting, when a greater than-condition and a positive-condition are detected, a value representative of the counter range from the difference value so as to generate said corrected difference value.

3. A phase detector according to claim 1, further comprising:

second means for detecting, for each one of a set of first counter values, whether the current first counter value is equal to the preceding first counter value, and for generating a no signal-indication if an equal to-condition is detected.

4. A phase detector according to claim 1, further comprising:

second means for updating, for each first register of a set comprising a predetermined number, S, of first registers, a comparison value by storing the first counter value of the first register, for detecting, prior to said comparison value updating, whether the first counter value currently stored in the first register is equal to the comparison value previously stored, said comparison value being representative of the preceding first counter value of the first register, and for generating a no signal-indication if an equal to-condition is detected.

5. A phase detector according to claim 4, wherein S is a positive integer greater than zero.

6. A phase detector according to claim 1, wherein said counter sequence has a predetermined number of counter values, said number being referred to as the counter range, and wherein said correction means includes:

K second registers, each one of said K second registers being connected to a respective one, referred to as its associated first register, of said K first registers and being responsive to the first counter value of its associated first register and to the same input signal as its associated first register for backing-up, prior to said updating, said first counter value as a back-up counter value, in response to said timing information carried by said input signal; and third means for detecting, for each register pair comprising an individual second register and its associated first register, whether the back-up counter value of said individual second register is greater than the updated first counter value of said associated first register, and for adding, when a greater than condition is detected, a value representative of the counter range to said first counter value so as to generate a respective corrected value representative of a twice updated first counter value, said twice updated first counter value being used in generating the difference value that is associated with the input signal of said first register.

7. A phase detector according to claim 1, wherein said counter sequence has a predetermined number of counter values, said number being referred to as the counter range, and wherein said correction means includes:

K second registers, each one of said K second registers being connected to a respective one, referred to as its associated first register, of said K first registers and being responsive to the first counter value of its associated first register and to the same input signal as its associated first register for backing-up, prior to said updating, said first counter value as a back-up counter value, in response to the timing information carried by said input signal;

means for detecting, for each register pair that comprises an individual second register and its associated first register, whether the back-up counter value of said individual second register is greater than the updated first counter value of said associated first register, to generate a respective enable signal when a greater than-condition is detected; and means for adding, prior to said difference value generation and for each one of said associated first registers, a value representative of the counter range to the first counter value of said associated first register so as to generate a respective corrected value representative of a twice updated first counter value, said adding being executed provided that the corresponding enable signal is received, said twice updated first counter value being used in generating the difference value associated with the input signal of said first register.

8. A phase detector according to claim 1, wherein said counter sequence has a predetermined number of counter values, said number being referred to as the counter range, and said counter counts down so that said counter sequence goes from a maximum count to zero, and wherein said correction means includes:

K second registers, each one of said K second registers being connected to a respective one, referred to as its associated first register, of said K first registers, and being responsive to the first counter value of its associated first register and to the same input signal as its associated first register for backing-up, prior to said updating, said first counter value as a back-up counter value, in response to said timing information carried by said input signal;

means for detecting, for each register pair that comprises an individual second register and its associated first register, whether the back-up counter value of said individual second register is less than the updated first counter value of said associated first register, to generate a respective enable signal when a less than-condition is detected;

means for subtracting, prior to said difference value generation and for each one of said associated first registers, a value representative of the counter range from the first counter value of said associated first register so as to generate a respective corrected value representative of a twice updated first counter value, said subtraction being executed provided that the corresponding enable signal is received, said twice updated first counter value being used in generating the difference value associated with the input signal of said first register.

9. A phase detector according to claim 1, further comprising:

K second registers, each one of said K second registers being connected to a respective one, referred to as its associated first register, of said K first registers and being responsive to the first counter value of its associated first register and to the same input signal as its associated first register for backing-up, prior to said updating, said first counter value as a back-up counter value, in response to said timing information carried by said input signal;

a second subtractor responsive to the counter values of each register pair of a set comprising a predetermined number, R, of register pairs, wherein each register pair comprises an individual second register and its associated updated first register, for subtracting, for each register pair of said set, the counter values of said register pair to generate a respective second difference value representative of the frequency of the input signal associated with said register pair.

10. A phase detector according to claim 9, wherein R is a positive integer greater than zero.

11. A phase detector according to claim 9, wherein said first subtractor and said second subtractor are integrated into a main subtractor unit.

12. A phase detector according to claim 1, wherein said counter includes:

means for generating, in response to said clock signal, having a first frequency, a predetermined number, M, of second clock signals phase shifted with respect to each other and having a second frequency that is lower than said first frequency, where M is a positive integer greater than 1;

M secondary counters, each one responsive to a respective one of said M second clock signals for generating an individual secondary counter signal;

a summing block responsive to said secondary counter signals for generating said counter signal by adding said secondary counter signals such that the counter value of said counter signal has the same number of bits and the same significance as the counter value of said secondary counter signals.

13. A phase detector according to claim 12, wherein said means for generating said M second clock signals includes frequency dividing means for generating said second frequency such that it is equal to said first frequency divided by N, where N is a positive integer greater than 1.

14. A method for measuring a respective phase difference between at least one pair of input signals of a predetermined number, K, of input signals, where K is a positive integer greater than 1, said method comprising the steps of:

generating a counter signal which represents a running counter value in a counter sequence, wherein a wrap occurs at the end of said counter sequence such that said counter sequence starts over again from the beginning;

updating, for each one of said K input signals, an individual first counter value by storing the current counter value of said counter signal generally in response to timing information carried by the input signal;

pairwise subtracting at least two of said first counter values to generate at least one difference value representing a phase difference between a respective pair of said K input signals, and correcting for a difference value effecting wrap, by adding a positive/negative correction value to the difference value so as to generate a corrected difference value or by adding said correction value to a first counter value, said corrected first counter value being used in generating said difference value.

15. A method for measuring a respective phase difference according to claim 14, wherein said counter signal is continuously generated, said step of updating is repeated for each timing information, and said step of pairwise subtracting is repeated at predetermined time intervals.

16. A method for measuring a respective phase difference according to claim 14, wherein said counter sequence has a predetermined number of counter values, said number being referred to as the counter range, and wherein said step of correcting includes the steps of:

detecting, for each difference value, whether the absolute value of the difference value is greater than the counter range divided by two and whether the difference value is positive or negative, and adding, when a greater than-condition and a negative condition are detected, a value representative of the counter range to the difference value to generate said corrected difference value, or subtracting, when a greater than-condition and a positive-condition are detected, a value representative of the counter range from the difference value to generate said corrected difference value.

17. A method for measuring a respective phase difference according to claim 14, further comprising the steps of:

detecting, for each one of a predetermined set of first counter values, whether the current first counter value is equal to the preceding first counter value, and generating a no signal-indication if an equal to-condition is detected.

18. A method for measuring a respective phase difference according to claim 17, wherein said counter signal is continuously generated, said step of updating is repeated for each timing information, and said steps of pairwise subtracting, detecting equality and possibly generating a no signal-indication are repeated at predetermined time intervals.

19. A method for measuring a respective phase difference according to claim 14, wherein said step of generating a counter signal includes the steps of:

generating, in response to a first clock signal, having a first frequency, a predetermined number, M, of second clock signals phase shifted with respect to each other and having a second frequency that is lower than said first frequency, where M is a positive integer greater than 1;

generating, for each one of said M second clock signals, a respective secondary counter signal in response to the respective one of said M second clock signals; and generating said counter signal by adding said secondary counter signals such that the counter value of said counter signal has the same number of bits and the same significance as the counter value of said secondary counter signals.

20. A method for measuring a respective phase difference according to claim 19, wherein said step of generating M second clock signals includes the step of dividing said first frequency by N, where N is a positive integer greater than 1, so as to obtain said second frequency.

21. A phase detector responsive to a predetermined number, K, of input signals, where K is a positive integer greater than 1, said phase detector comprising:

means for generating, in response to a first clock signal of a first frequency, a predetermined number, M, of second clock signals phase shifted with respect to each other and of a second frequency that is lower than said first frequency, where M is a positive integer greater than 1;

M secondary counters, each one responsive to a respective one of said M second clock signals for generating an individual secondary counter signal;

K secondary registers for each one of said M secondary counters, each one of said K secondary registers being responsive to the individual secondary counter signal of the corresponding secondary counter, and a respective one of said K input signals for updating an individual secondary counter value by storing the current counter value of said individual secondary counter signal generally in response to timing information carried by the respective input signal;

K summing circuits, each summing circuit being responsive to a respective group of updated secondary counter values that are associated with the same input signal, for generating a respective summed counter signal which represents a counter value in a counter sequence, wherein a wrap occurs at the end of said counter sequence so that said counter sequence starts over again from the beginning;

K delay units, each delay unit being responsive to a respective one of said K input signals for delaying the input signal;

K primary registers, each one of said K primary registers being responsive to a respective one of said summed counter signals, and a respective one of said K delayed input signals for updating an individual primary counter value by storing the current counter value of said summed counter signal generally in response to timing information carried by the respective delayed input signal;

subtractor means responsive to said updated primary counter values for generating at least one difference value representing a phase difference between a respective pair of said K input signals, and correction means for correcting for a difference value effecting wrap, by adding a positive/negative correction value to the difference value so as to generate a corrected difference value.

22. A phase detector according to claim 21, wherein an individual primary counter value represents one of a predetermined number of different states, said number being referred to as a first range, and wherein said correction means includes:

first means for detecting, for each difference value, whether the absolute value of the difference value is greater than the first range divided by two and whether the difference value is positive or negative, and for adding, when a greater than-condition and a negative-condition are detected, a value representative of the first range to the difference value to generate said corrected difference value, or for subtracting, when a greater than-condition and a positive-condition are detected, a value representative of the first range from the difference value to generate said corrected difference value.

23. A phase detector responsive to a predetermined number, K, of input signals, where K is a positive integer greater than 1, said phase detector comprising:

means for generating, in response to a first clock signal of a first frequency, a predetermined number, M, of second clock signals phase shifted with respect to each other and of a second frequency that is lower than said first frequency, where M is a positive integer greater than 1;

M secondary counters, each one responsive to a respective one of said M second clock signals for generating an individual secondary counter signal;

K secondary registers for each one of said M secondary counters, each one of said K secondary registers being responsive to the individual secondary counter signal of the corresponding secondary counter, and a respective one of said K input Signals for updating an individual secondary counter value by storing the current counter value of said individual secondary counter signal generally in response to timing information carried by the respective input signal;

K summing circuits, each summing circuit being responsive to a respective group of updated secondary counter values that are associated with the same input signal, for generating a respective summed counter signal which represents a counter value in a counter sequence, wherein a wrap occurs at the end of said counter sequence so that it starts over again from the beginning;

subtractor means responsive to said summed counter signals for generating at least one difference value representing a phase difference between a respective pair of said K input signals; and correction means for correcting for a difference value effecting wrap, by adding a positive/negative correction value to the difference value so as to generate a corrected difference value.

* * * * *